US009214350B2

(12) United States Patent
Ishii et al.

(10) Patent No.: US 9,214,350 B2
(45) Date of Patent: Dec. 15, 2015

(54) SEMICONDUCTOR DEVICE HAVING A CAPACITIVE ELEMENT

(71) Applicant: Renesas Electronics Corporation, Kawasaki-shi, Kanagawa (JP)

(72) Inventors: Yasushi Ishii, Kanagawa (JP); Hiraku Chakihara, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/283,243

(22) Filed: May 21, 2014

(65) Prior Publication Data

US 2014/0346581 A1    Nov. 27, 2014

(30) Foreign Application Priority Data

May 27, 2013    (JP) .................................. 2013-110476

(51) Int. Cl.
| H01L 21/336 | (2006.01) |
| H01L 21/28 | (2006.01) |
| H01L 29/788 | (2006.01) |
| H01L 27/115 | (2006.01) |
| H01L 29/423 | (2006.01) |
| H01L 29/66 | (2006.01) |
| H01L 29/792 | (2006.01) |

(52) U.S. Cl.
CPC .... *H01L 21/28273* (2013.01); *H01L 27/11521* (2013.01); *H01L 29/42344* (2013.01); *H01L 29/66833* (2013.01); *H01L 29/7885* (2013.01); *H01L 29/792* (2013.01)

(58) Field of Classification Search
CPC .................. H01L 21/28273; H01L 27/11521; H01L 29/7885
See application file for complete search history.

(56) References Cited

U.S. PATENT DOCUMENTS

| 7,768,044 B2 * | 8/2010 | He et al. ........................ 257/288 |
| 8,084,800 B2 | 12/2011 | Kawashima et al. |
| 8,105,944 B2 | 1/2012 | Arikawa |
| 8,384,144 B2 * | 2/2013 | Anthony ....................... 257/307 |
| 2005/0145987 A1 * | 7/2005 | Okuda et al. .................. 257/532 |
| 2011/0095348 A1 * | 4/2011 | Chakihara et al. ............ 257/298 |

FOREIGN PATENT DOCUMENTS

| JP | 2009-099640 A | 5/2009 |
| JP | 2011-040621 A | 2/2011 |

* cited by examiner

*Primary Examiner* — John C Ingham
(74) *Attorney, Agent, or Firm* — Miles & Stockbridge P.C.

(57) ABSTRACT

The performances of a semiconductor device are improved. A semiconductor device has a first electrode and a dummy electrode formed apart from each other over a semiconductor substrate, a second electrode formed between the first electrode and the dummy electrode, at the circumferential side surface of the first electrode, and at the circumferential side surface of the dummy electrode, and a capacitive insulation film formed between the first electrode and the second electrode. The first electrode, the second electrode, and the capacitive insulation film form a capacitive element. Further, the semiconductor device has a first plug penetrating through the interlayer insulation film, and electrically coupled with the first electrode, and a second plug penetrating through the interlayer insulation film, and electrically coupled with the portion of the second electrode formed at the side surface of the dummy electrode opposite to the first electrode side.

16 Claims, 47 Drawing Sheets

SEMICONDUCTOR DEVICE HAVING A CAPACITIVE ELEMENT

CROSS-REFERENCE TO RELATED APPLICATIONS

The disclosure of Japanese Patent Application No. 2013-110476 filed on May 27, 2013 including the specification, drawings and abstract is incorporated herein by reference in its entirety.

BACKGROUND

The present invention relates to a semiconductor device, and is preferably applicable to, for example, a semiconductor device having a capacitive element.

In some semiconductor devices, a microcomputer is formed in one semiconductor chip. In the semiconductor chip including a microcomputer formed therein, there are formed a Central Processing Unit: CPU including logic circuits such as a CMISFET (Complementary Metal Insulator Semiconductor Field Effect Transistor), memories, analog circuits, or the like.

As the memory used in the semiconductor chip, for example, an electrically rewritable nonvolatile memory is used. As the electrically erasable/writable nonvolatile memory (nonvolatile semiconductor storage device), an EEPROM (Electrically Erasable and Programmable Read Only Memory) or a flash memory has been widely used.

In order to operate the nonvolatile memory as described above, a driving circuit such as a booster circuit is formed in a semiconductor chip. The driving circuit requires a high-precision capacitive element. Further, in the semiconductor chip including a microcomputer formed therein, an analog circuit is also formed. The analog circuit also requires a high-precision capacitive element. Therefore, in the semiconductor chip, capacitive elements are also formed other than the nonvolatile memory and the MISFET.

Some such capacitive elements are formed simultaneously with the nonvolatile memory cell using a step of manufacturing the nonvolatile memory cell. Specifically, in the step of forming the control gate electrode of a nonvolatile memory cell, the lower electrode of the capacitive element is formed. In the step of forming a lamination film including a charge accumulation film of the nonvolatile memory, the capacitive insulation film of the capacitive element is formed. Then, in the step of forming the memory gate electrode of the nonvolatile memory cell, the upper electrode of the capacitive element is formed. The capacitive element is called a PIP (Polysilicon Insulator Polysilicon) capacitive element because a polysilicon film is used for the upper electrode and the lower electrode.

In Japanese. Unexamined Patent Publication No. 2009-99640 (Patent Document 1) and Japanese Unexamined Patent Publication No. 2011-40621 (Patent Document 2), there is disclosed a PIP capacitive element having a lower electrode and an upper electrode each formed of a polysilicon film formed over a semiconductor substrate, and a capacitive insulation film formed of, for example, a silicon oxide film, formed between the lower electrode and the upper electrode.

The Patent Document 1 discloses the following: in the upper electrode, there are an overlapping region whose underlying layer includes the lower electrode present therein, and a non-overlapping region whose underlying layer includes no lower electrode present therein; and the plug to be coupled with the upper electrode is formed in the non-overlapping region of the upper electrode. Whereas, the Patent Document 2 discloses the following: the lower electrode, the capacitive film and the upper electrode are stacked in this order; and a via is coupled with the upper electrode over the lower electrode.

PATENT DOCUMENT

[Patent Document 1]
Japanese Unexamined Patent Publication No. 2009-99640
[Patent Document 2]
Japanese Unexamined Patent Publication No. 2011-40621

SUMMARY

For example, in the PIP capacitive element described in the Patent Document 1, the upper electrode has a step region between the overlapping region and the non-overlapping region; and the plug to be coupled with the upper electrode is coupled with the upper electrode in the non-overlapping region. Whereas, over the surface of the upper electrode, a metal silicide film is formed. In the step region, a sidewall formed of an insulation film is formed at the sidewall of the upper electrode. Over the surface of the upper electrode in the step region, no metal silicide film is formed. Accordingly, the upper electrode in the step region has a high resistance. The plug to be coupled with the upper electrode in the non-overlapping region cannot be electrically coupled with the portion of the upper electrode present in the overlapping region at a low resistance. For this reason, the plug and the upper electrode cannot be electrically coupled at a low resistance.

On the other hand, for example, in the PIP capacitive element described in the Patent Document 2, the plug to be coupled with the upper electrode is coupled with the upper electrode in the overlapping region. Whereas, entirely over the surface of the upper electrode, a metal silicide film is formed. Accordingly, the plug and the upper electrode can be electrically coupled at a low resistance.

However, in such a PIP capacitive element, the thickness of the capacitive element is the sum of the thickness of the upper electrode, the thickness of the capacitive insulation film, and the thickness of the lower electrode. For this reason, the height position of the top surface of the capacitive element is higher than, for example, the height position of the top surface of the source region or the drain region in a nonvolatile memory cell. Namely, the distance in the thickness direction from the bottom surface of the wire over the capacitive element to the top surface of the upper electrode of the capacitive element is shorter than the distance in the thickness direction from the bottom surface of the wire over the nonvolatile memory cell to the top surface of the source region or the drain region.

Accordingly, when the contact hole penetrating through the interlayer insulation film, and reaching the source electrode or the drain electrode, and the contact hole penetrating through the interlayer insulation film, and reaching the top surface of the upper electrode of the capacitive element are formed in the same step, the contact hole may penetrate through the interlayer insulation film, the upper electrode, and the capacitive insulation film, to reach the lower electrode. In such a case, the plug formed of a conductive film embedded in the contact hole may cause a short circuit between the upper electrode and the lower electrode, resulting in the degradation of the performances of the semiconductor device.

Other objects and novel features will be apparent from the description of this specification and the accompanying drawings.

In accordance with one embodiment, a semiconductor device has a first electrode and a dummy electrode formed apart from each other over a semiconductor substrate, a second electrode formed between the first electrode and the dummy electrode, at the circumferential side surface of the first electrode, and at the circumferential side surface of the dummy electrode, and a capacitive insulation film formed between the first electrode and the second electrode. The first electrode, the second electrode, and the capacitive insulation film form a capacitive element. Further, the semiconductor device has a first plug penetrating through the interlayer insulation film, and electrically coupled with the first electrode, and a second plug penetrating through the interlayer insulation film, and electrically coupled with a portion of the second electrode formed at a side surface of the dummy electrode opposite to the first electrode side.

Further, in accordance with another embodiment, a semiconductor device has a first electrode formed over a semiconductor substrate, an opening penetrating through the first electrode, a second electrode formed in the inside of the opening, and at the circumferential side surface of the first electrode, and a capacitive insulation film formed between the first electrode and the second electrode. The first electrode, the second electrode, and the capacitive insulation film form a capacitive element. Still further, the semiconductor device has a first plug penetrating through the interlayer insulation film, and electrically coupled with the first electrode, and a second plug penetrating though the interlayer insulation film, and electrically coupled with the second electrode.

In accordance with a still other embodiment, a semiconductor device has a first electrode formed over a semiconductor substrate, a second electrode formed at the circumferential side surface of the first electrode, and a capacitive insulation film formed between the first electrode and the second electrode. The first electrode includes a plurality of first line parts respectively extending in a first direction, and arrayed in a second direction crossing with the first direction in plan view. The first electrode, the second electrode, and the capacitive insulation film form a capacitive element. Further, the semiconductor device has a first plug penetrating through the interlayer insulation film, and electrically coupled with the first electrode, and a second plug penetrating through the interlayer insulation film, and electrically coupled with the second electrode.

In accordance with one embodiment, it is possible to improve the performances of the semiconductor device.

DETAILED DESCRIPTION

In the following embodiment, the embodiment may be described in a plurality of divided sections or embodiments for convenience, if required. However, unless otherwise specified, these are not independent of each other, but are in a relation such that one is a modified example, details, complementary explanation, or the like of a part or the whole of the other.

Further, in the following embodiments, when a reference is made to the number of elements, and the like (including number, numerical value, quantity, range, or the like), the number of elements is not limited to a specific number, but may be greater than or less than the specific number, unless otherwise specified, and except the case where the number is apparently limited to the specific number in principle, and other cases.

Further, in the following embodiments, it is needless to say that the constitutional elements (including element steps, or the like) are not always essential, unless otherwise specified, except the case where they are apparently considered essential in principle, and other cases. Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, and except for other cases. This also applies to the foregoing numerical values and ranges.

Below, representative embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar parts will not be repeated in principle, unless particularly required.

Further, in drawings to be used in embodiments, hatching may be omitted for ease of understanding of the drawings even in a cross-sectional view. Whereas, for ease of understanding of the drawings, hatching may be provided even in a plan view Further, in a cross sectional view and a plan view, the size of each part does not correspond to that of an actual device. For ease of understanding of the drawings, a specific part may be shown on a relatively enlarged scale. Whereas, even when a plan view and a cross sectional view correspond to each other, respective parts may be shown on different scales.

First Embodiment
<Configuration of Semiconductor Device>

Figure 1:
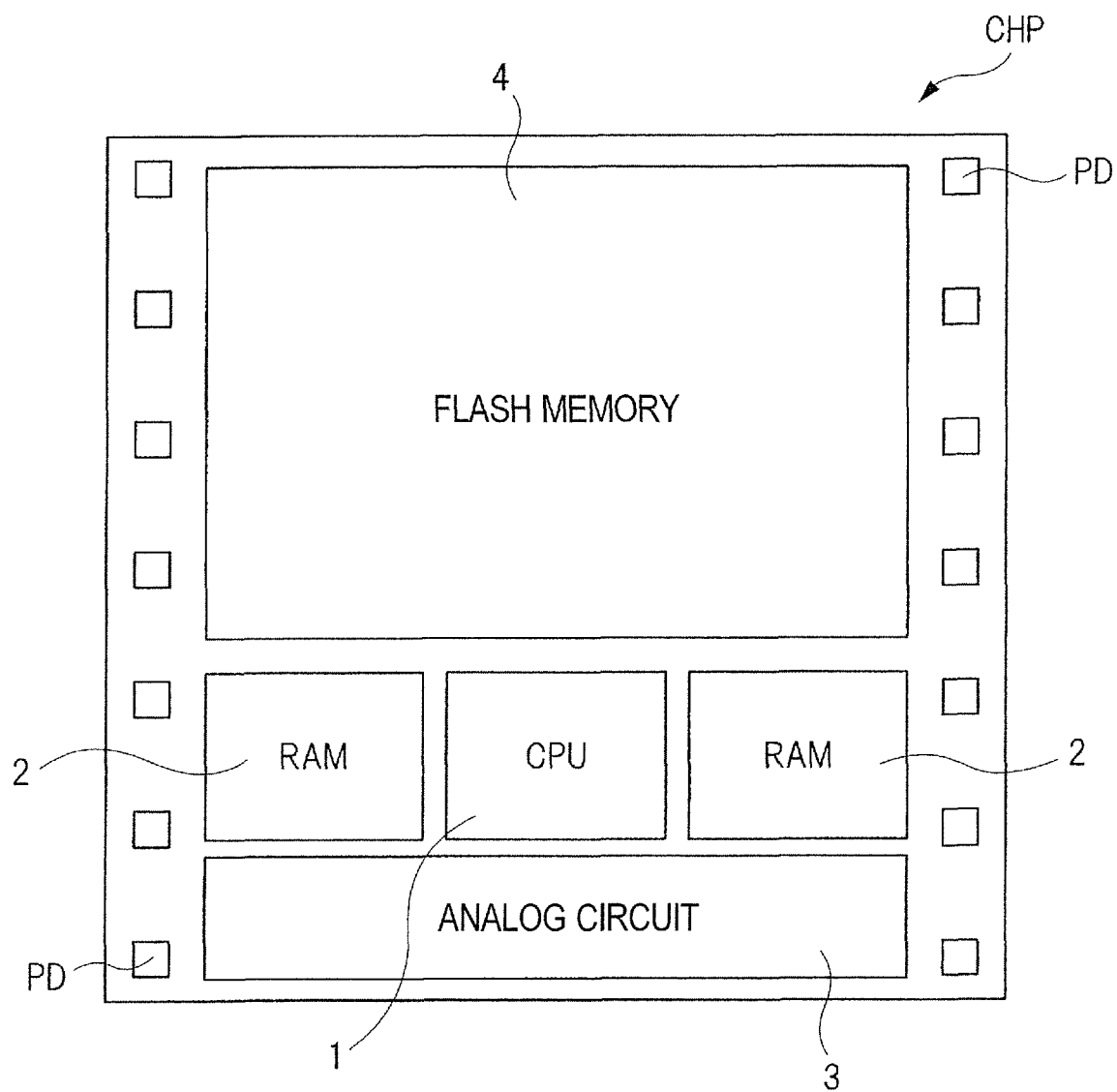
FIG. 1 is a plan view showing a semiconductor chip as a semiconductor device of First Embodiment.

FIG. 1 is a plan view showing a semiconductor chip as a semiconductor device of First Embodiment. FIG. 1 shows the layout configuration of respective elements formed at a semiconductor chip CHP as, for example, a semiconductor device having a microcomputer formed therein.

In FIG. 1, the semiconductor chip CHP as a semiconductor device has a CPU1, a RAM (Random Access Memory) 2, an analog circuit 3, and a flash memory 4. Then, in the peripheral part of the semiconductor chip, there are formed pads PD which are input/output external terminals for coupling the circuits and external circuits.

The CPU1 is also called a central processing unit, and corresponds to the heart of a computer or the like. The CPU1 reads and decodes an instruction from a storage device, and performs diverse operations and controls based on that, and hence is required to have a high processing speed performance. Therefore, the MISFET (Metal Insulator Semiconductor Field Effect Transistor) forming the CPU1 requires a relatively larger current driving force among the elements formed in the semiconductor chip CHP. Namely, the MISFET forming the CPU1 is formed of a low breakdown voltage MISFET.

The RAM2 is a memory capable of reading memory information at random, namely, stored memory information randomly, and newly writing memory information, and is also called a random access memory. The RAMs as IC (Integrated Circuit) memories include two kinds of a DRAM (Dynamic RAM) using a dynamic circuit, and a SRAM (Static RAM) using a static circuit. The DRAM is a random write/read memory requiring a storage retaining operation; and the SRAM is a random write/read memory not requiring a storage retaining operation. The RAM2 is required to have a high speed performance of operation. For this reason, the MISFET forming the RAM2 requires a relatively larger current driving force among the elements formed in the semiconductor chip CHP. Namely, as the MISFET forming the RAM2, there is used a low breakdown voltage MISFET.

The analog circuit 3 is a circuit handling temporally continuously changing voltage or current signals, namely, analog signals, and is formed of, for example, an amplification circuit, a conversion circuit, a modification circuit, an oscillation circuit, or a power supply circuit. As the MISFET forming the analog circuit 3, there is used a relatively higher breakdown voltage MISFET among elements formed at the semiconductor chip CHP.

The flash memory 4 is one kind of nonvolatile memories capable of electric rewriting for both a write operation and an erase operation, and is also called an electrically erasable programmable read-only memory. The memory cells of the flash memory 4 include a memory cell selecting MISFET, and, for example, a MONOS (Metal Oxide Nitride Oxide Semiconductor) type FET (Field Effect Transistor) for storage. For the write operation of the flash memory, there is used hot electron injection or Fowler-Nordheim Tunneling phenomenon; and for the erase operation, there is used Fowler-Nordheim Tunneling phenomenon or hot hole injection.

In order to operate the flash memory 4 as described above, a driving circuit such as a booster circuit is formed in the semiconductor chip CHP. The driving circuit requires a high-precision capacitive element. Further, the analog circuit 3 also requires a high-precision capacitive element. Therefore, in the semiconductor chip CHP, capacitive elements are also formed other than the nonvolatile memory 4 and MISFETs. The present First Embodiment has one feature in the structure of the capacitive element as the PIP capacitive element formed in the semiconductor chip CHP. Below, a description will be given to the configuration of the capacitive element as the PIP capacitive element formed in the semiconductor chip CHP. Incidentally, below, the PIP capacitive element will be simply referred to as a capacitive element.

<Configuration of Capacitive Element>

Figure 2:
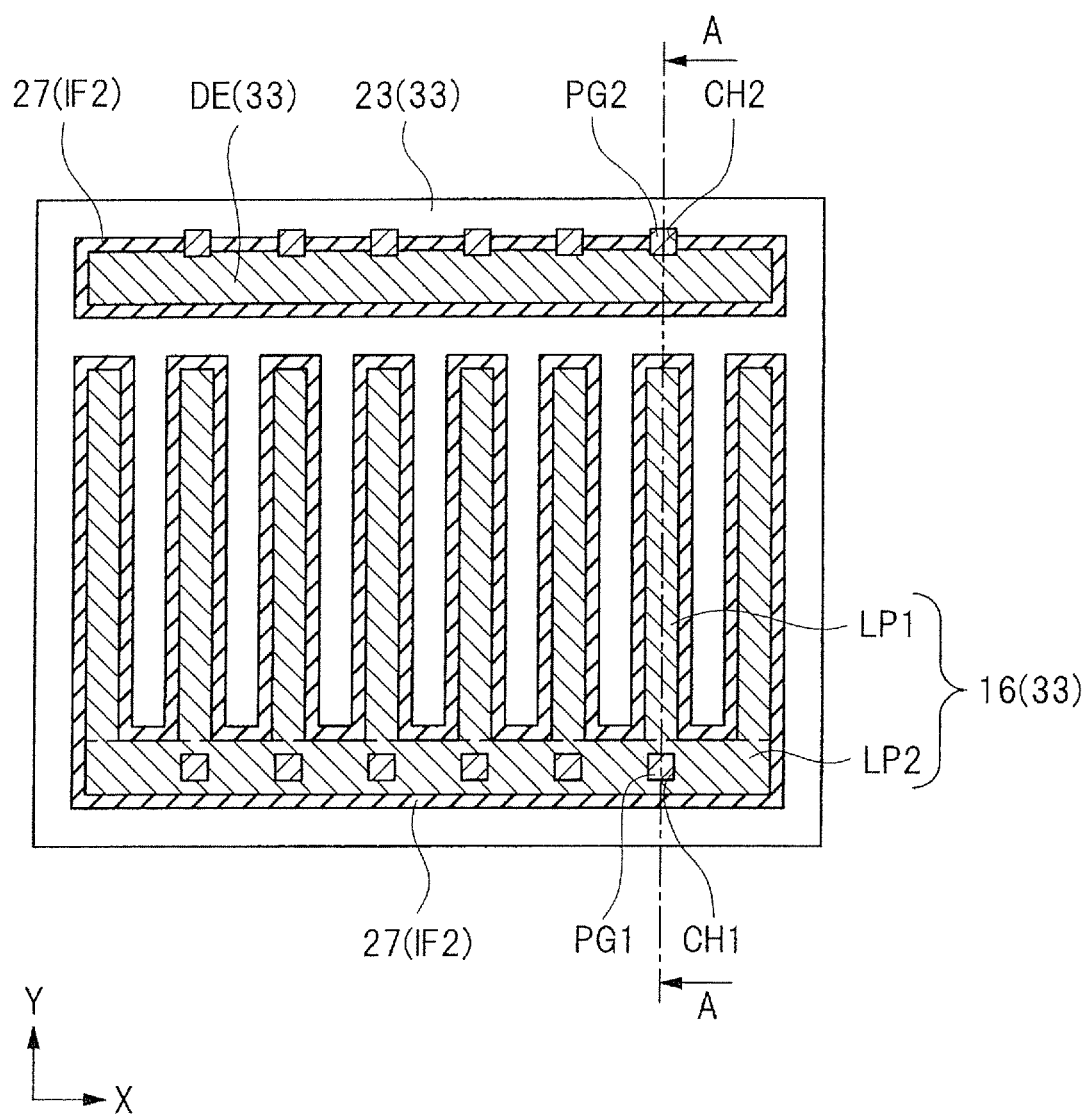
FIG. 2 is a plan view showing a capacitive element in First Embodiment.
Figure 3:
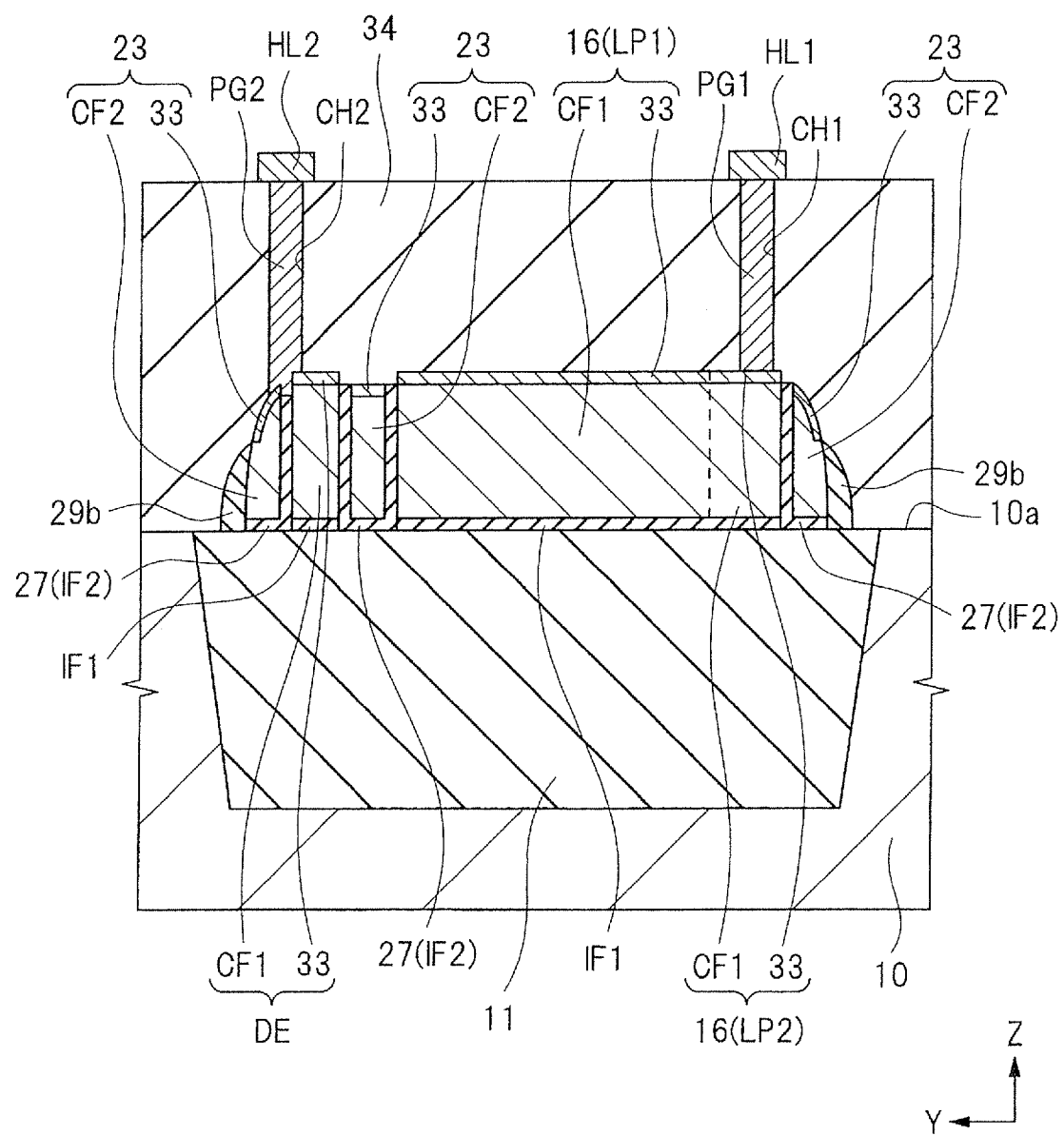
FIG. 3 is a cross sectional view showing the capacitive element in First Embodiment.

FIG. 2 is a plan view showing a capacitive element in First Embodiment. FIG. 3 is a cross sectional view showing the capacitive element in First Embodiment. FIG. 3 is a cross sectional view along line A-A of FIG. 2.

Incidentally, the plan view of FIG. 2 is a plan perspective view of the capacitive element as seen through wires HL1 and HL2, an interlayer insulation film 34, and a sidewall 29b (see FIG. 3), and also does not show the semiconductor substrate 10 and the element isolation region 11 (the same also applies to the following plan views). Whereas, in the plan view of FIG. 2, for ease of understanding, other portions than an electrode 23 are hatched, but the electrode 23 is not hatched (the same also applies to the following plan views).

As shown in FIGS. 2 and 3, the semiconductor device has semiconductor substrate 10 and the element isolation region 11. The element isolation region 11 is formed in the front surface (first main surface) 10a of the semiconductor substrate 10. The semiconductor substrate 10 is formed of, for example, silicon (Si) single crystal. The element isolation region 11 is formed of, for example, a silicon oxide film.

The semiconductor device has an electrode 16 formed of a conductive film CF1 formed over the element isolation region 11. Preferably, the electrode 16 is formed of the conductive film CF1 formed over the element isolation region 11, and a metal silicide film 33 formed at the surface of the conductive film CF1. The conductive film CF1 is formed of, for example, a polysilicon film. The metal silicide film 33 is formed of, for example, a cobalt silicide film. Further, as shown in FIG. 3, the electrode 16 may be formed over the element isolation region 11 via an insulation film IF1.

As shown in FIG. 2, the electrode 16 includes a plurality of line parts LP1 and a line part LP2. The plurality of line parts LP1 respectively extend in the Y axis direction, and are arrayed in the X axis direction, where the X axis direction and the Y axis direction are two directions mutually crossing in plan view. The line part LP2 extends in the X axis direction, and is coupled with the ends on one side of the plurality of line parts LP1 in the Y axis direction in plan view. With such a configuration, the plurality of line parts LP1 are electrically coupled to one another via the line part LP2. The electrode 16 including the plurality of line parts LP1 and the line part LP2 has a comb-like shape in plan view.

Incidentally, in the present specification, the wording "in plan view" means the view seen from the direction perpendicular to the front surface 10a of the semiconductor substrate 10.

Further, the semiconductor device has a dummy electrode DE formed of a conductive film CF1 formed apart from the electrode 16 over the element isolation region 11. Preferably, the dummy electrode DE is formed of the conductive film CF1 at the same layer as the conductive film CF1 forming the electrode 16, and the metal silicide film 33 formed at the surface of the conductive film CF1. As described previously, the conductive film CF1 is formed of, for example, a polysilicon film. The metal silicide film 33 is formed of, for example, a cobalt silicide film. Further, as shown in FIG. 3, the dummy electrode DE may be formed over the element isolation region 11 via the insulation film IF1.

As shown in FIG. 2, in plan view, the dummy electrode DE extends in the X axis direction, and is arranged opposite to the line part LP2 across the plurality of line parts LP1, namely, on the side of the plurality of line parts LP1 opposite to the line part LP2 side. In other words, the dummy electrode DE is arranged on each one side of the plurality of line parts LP1 in the X axis direction, and the line part LP2 is coupled to each end on the other side of the plurality of line parts LP1 in the X axis direction.

Further, the semiconductor device has an electrode 23 formed of a conductive film CF2 integrally formed between the electrode 16 and the dummy electrode DE, at the circumferential side surface of the electrode 16, and the circumferential side surface of the dummy electrode DE. Preferably, the electrode 23 is formed of the conductive film CF2 integrally formed between the electrode 16 and the dummy electrode DE, at the circumferential side surface of the electrode 16, and the circumferential side surface of the dummy electrode DE, and a metal silicide film 33 formed over the surface of the conductive film CF2. The conductive film CF2 is formed of, for example, a polysilicon film. The metal silicide film 33 is formed of, for example, a cobalt silicide film.

Further, the semiconductor device has a capacitive insulation film 27 formed of an insulation film IF2 formed between the electrode 16 and the electrode 23, and between the electrode 23 and the semiconductor substrate 10. Therefore, the electrode 23 is formed at the circumferential side surface of the electrode 16, and the circumferential side surface of the dummy electrode DE via the capacitive insulation film 27. Then, the electrode 16, the electrode 23, and the capacitive insulation film 27 form the capacitive element. Incidentally, in the outer circumferential part of the capacitive element, a sidewall 29b formed of an insulation film is formed at the circumferential side surface of the electrode 23. The metal silicide film 33 is formed entirely over the surface of the electrode 23 except for the region including the sidewall 29b formed therein.

As shown in FIG. 3, over the element isolation region 11, an interlayer insulation film 34 is formed in such a manner as to cover the capacitive element formed of the electrode 16, the electrode 23, and the capacitive insulation film 27. In the interlayer insulation film 34, there are formed a contact hole CH1 and a contact hole CH2 as coupling holes. The contact hole CH1 penetrates through the interlayer insulation film 34, and reaches the electrode 16. The contact hole CH2 penetrates through the interlayer insulation film 34, and reaches the electrode 23.

In the contact hole CH1, there is formed a plug PG1 as a coupling electrode formed of a conductive film embedded in the contact hole CH1, and electrically coupled with the electrode 16. Whereas, in the contact hole CH2, there is formed a plug PG2 as a coupling electrode formed of a conductive film embedded in the contact hole CH2, and electrically coupled with the electrode 23. Over the plug PG1, there is formed a wire HL1 electrically coupled with the plug PG1. Over the plug PG2, there is formed a wire HL2 electrically coupled with the plug PG2. Over the surface of the electrode 16, there is formed the metal silicide film 33. Accordingly, the plug PG1 is in contact with the metal silicide film 33 exposed at the bottom of the contact hole CH1, and is electrically coupled with the electrode 16. Whereas, over the surface of the electrode 23, the metal silicide film 33 is formed. Accordingly, the plug PG2 is in contact with the metal silicide film 33 exposed at the bottom of the contact hole CH2, and is electrically coupled with the electrode 23.

The contact hole CH1 penetrates through the interlayer insulation film 34, and reaches the line part LP2 of the electrode 16. The plug PG1 is formed of a conductive film embedded in the contact hole CH1, and is electrically directly coupled with the line part LP2 of the electrode 16.

The contact hole CH2 penetrates through the interlayer insulation film 34, and reaches the portion of the electrode 23 formed at the side surface of the dummy electrode DE opposite to the electrode 16 side. With such a configuration, the plug PG2 can be electrically coupled with any portion of the electrode 23 via the metal silicide film 33 having a relatively smaller electric resistance formed over the surface of the electrode 23. Further, entirely over the surface of the electrode 23, there is formed the metal silicide film 33. Accordingly, the plug PG2 can be electrically coupled with any portion of the electrode 23 at a low resistance.

Whereas, the electrode 16 and the electrode 23 are formed in different regions in plan view. In other words, there is no overlapping region where the electrode 16 and the electrode 23 overlap each other in plan view. Such a configuration eliminates the possibility that the contact hole CH2 penetrates through the electrode 23 and reaches the electrode 16. This can prevent an electric short circuit between the electrode 16 and the electrode 23 via the plug PG2.

Further, the electrode 16 has the plurality of line parts LP1. This results in an increase in area of the side surface of the electrode 23 opposite to the side surface of the electrode 16. For this reason, it is possible to increase the capacity of the capacitive element with ease.

On the other hand, as shown in FIG. 3, the dummy electrode DE is in a state electrically insulated from the electrode 16. For this reason, the contact hole CH2 may reach the dummy electrode DE. Namely, the contact hole CH2 may have a portion overlapping the dummy electrode DE in plan view. As a result, even when the film thickness of the conductive film CF2 forming the electrode 23 is small, and the width of the electrode 23 formed at the side surface of the electrode 16 is small, the contact hole CH2 may be shifted to the dummy electrode DE side. For this reason, the contact hole CH2 can be aligned with ease.

<First Modified Example of Capacitive Element>

Figure 4:
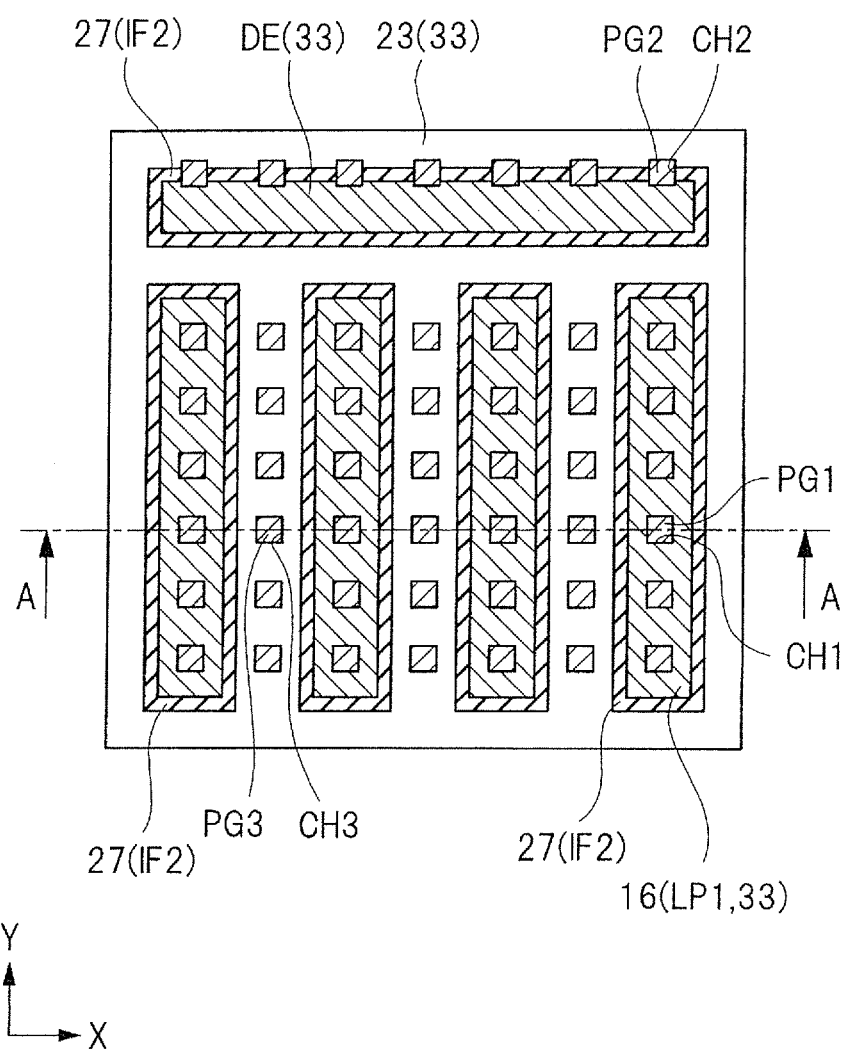
FIG. 4 is a plan view showing a capacitive element in a first modified example of First Embodiment.
Figure 5:
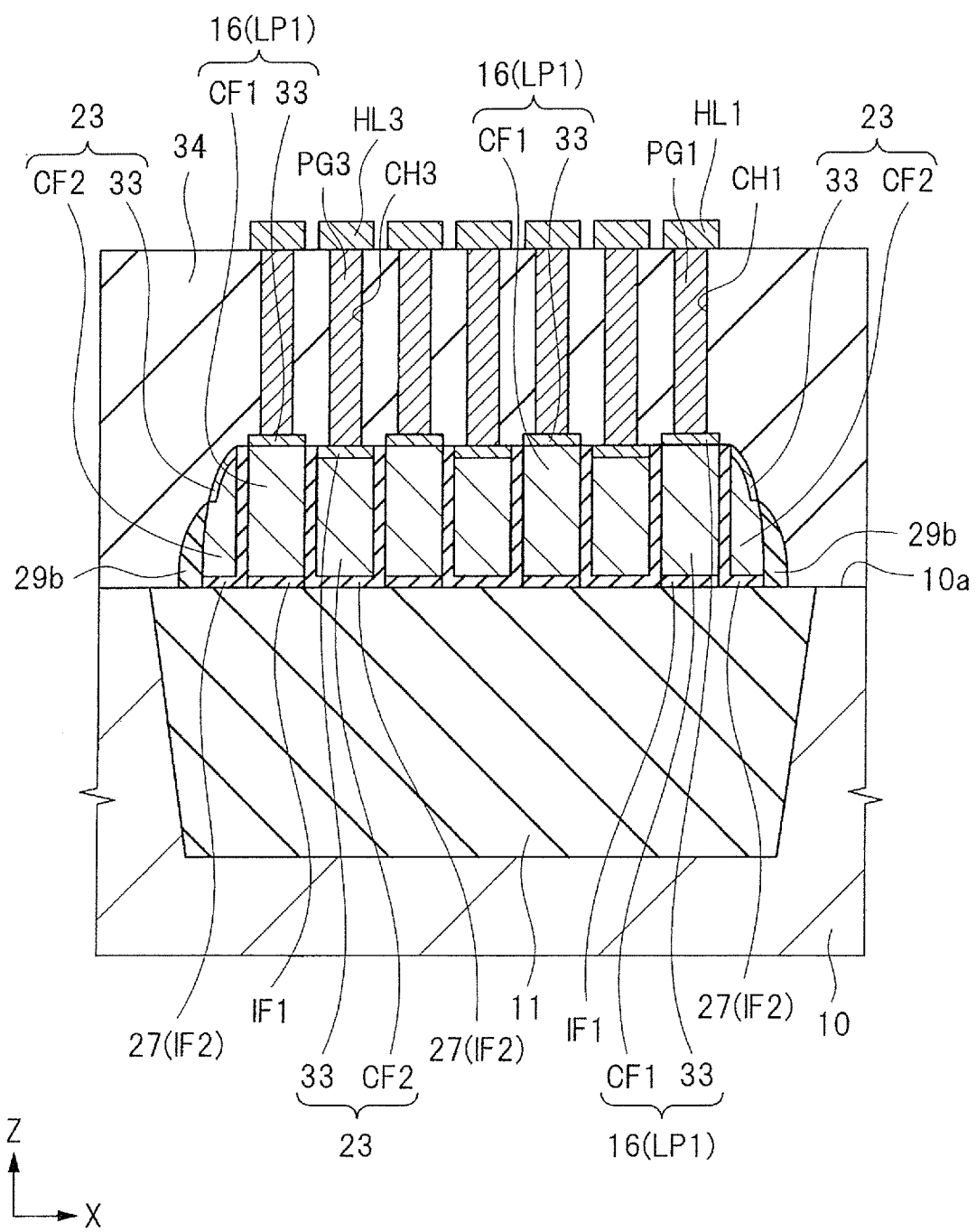
FIG. 5 is a cross sectional view showing the capacitive element in the first modified example of First Embodiment.

FIG. 4 is a plan view showing a capacitive element in a first modified example of First Embodiment; and FIG. 5 is a cross sectional view showing the capacitive element in the first modified example of First Embodiment. FIG. 5 is a cross sectional view along line A-A of FIG. 4.

The capacitive element in the present first modified example is different from the capacitive element in First Embodiment described by reference to FIGS. 2 and 3 in that the line part LP2 (see FIG. 2) is not disposed, and in that a plurality of plugs PG1 are electrically directly coupled with a plurality of line parts LP1, respectively, and further, in that, in addition to the plugs PG2, a plurality of plugs PG3 are electrically directly coupled with the electrode 23. The capacitive element in the present first modified example is the same as the capacitive element in First Embodiment in other respects.

As shown in FIG. 4, the electrode 16 includes a plurality of line parts LP1, but does not include a line part LP2. Further, as with First Embodiment, the plurality of line parts LP1 respectively extend in the Y axis direction, and are arrayed in the X axis direction in plan view. Accordingly, the plurality of line parts LP1 are formed apart from one another.

The contact hole CH1 penetrates through the interlayer insulation film 34, and reaches the line part LP1 of the electrode 16. The plug PG1 is formed of a conductive film embedded in the contact hole CH1, and is electrically directly coupled with the line part LP1 of the electrode 16.

In the interlayer insulation film 34, contact holes CH3 as openings are formed in addition to the contact holes CH1 and CH2. The contact holes CH3 penetrate through the interlayer insulation film 34, and reach the portion of the electrode 23 arranged between the adjacent line parts LP1. In the contact hole CH3, there is formed a plug PG3 as a coupling electrode formed of a conductive film embedded in the contact hole CH3, and electrically coupled with the portion of the electrode 23 arranged between the adjacent line parts LP1. Over the plug PG3, there is formed a wire HL3 electrically coupled with the plug PG3.

Also in the present first modified example, as with First Embodiment, the plug PG2 can be electrically coupled with any portion of the electrode 23 at a low resistance. Accordingly, the electrode 16 and the electrode 23 can be prevented from being electrically short-circuited with each other. Thus, the capacity of the capacitive element can be increased with ease, and the contact hole CH2 can be aligned with ease.

On the other hand, in the present first modified example, as compared with First Embodiment, although the width of the line part LP1 in the X axis direction is larger, the plug PG1 can be electrically directly coupled with the line part LP1. For this reason, the plug PG1 can be electrically coupled with the electrode 16 at a still lower resistance.

Figure 6:
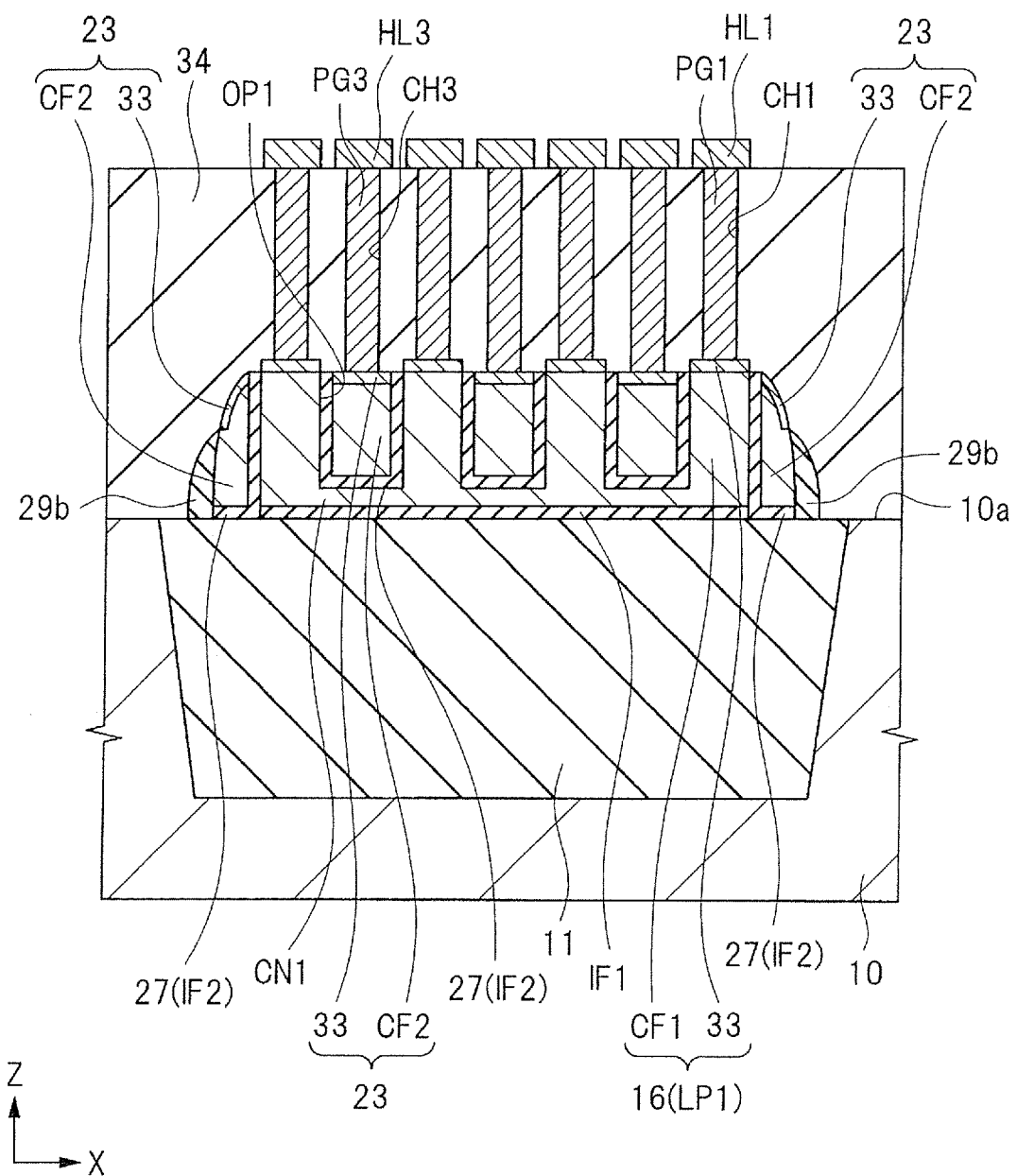
FIG. 6 is a cross sectional view showing a capacitive element in a still other example.

Incidentally, FIG. 6 shows a capacitive element of a still other example in a cross sectional view. As shown in FIG. 6, when the conductive film CF1 is patterned, thereby to form the line parts LP1, the opening OP1 formed between the adjacent line parts LP1 is prevented from penetrating through the conductive film CF1. This allows the bottoms of the plurality of line parts LP1 to be combined with one another via the conductive film CF1. Namely, the electrode 16 includes coupling parts CN1 coupling the bottoms of the adjacent line parts LP1.

In the example shown in FIG. 6, when the height position of the top surface of the electrode 23 is set equal to that in the example shown in FIG. 5, the height position of the bottom surface of the electrode 23 becomes higher, resulting in a reduction of the thickness of the electrode 23. For this reason, the capacity of the capacitive element decreases. However, the line parts LP1 are coupled with one another at their respective bottoms. For this reason, the electric resistance of the electrode 16 can be reduced. However, it is preferable that the electrode 16 and the dummy electrode DE are in a state electrically insulated from each other. For this reason, the bottoms of the adjacent line parts LP1 may be combined with one another. However, it is preferable that the bottom of the electrode 16 and the bottom of the dummy electrode DE are prevented from being combined with each other.

Incidentally, thus, when the conductive film CF1 is patterned, the opening OP1 is prevented from penetrating through the conductive film CF1. This is also applicable to respective embodiments including the First Embodiment, and respective modified examples of the embodiments other than the first modified example of First Embodiment.

<Second Modified Example of Capacitive Element>

Figure 7:
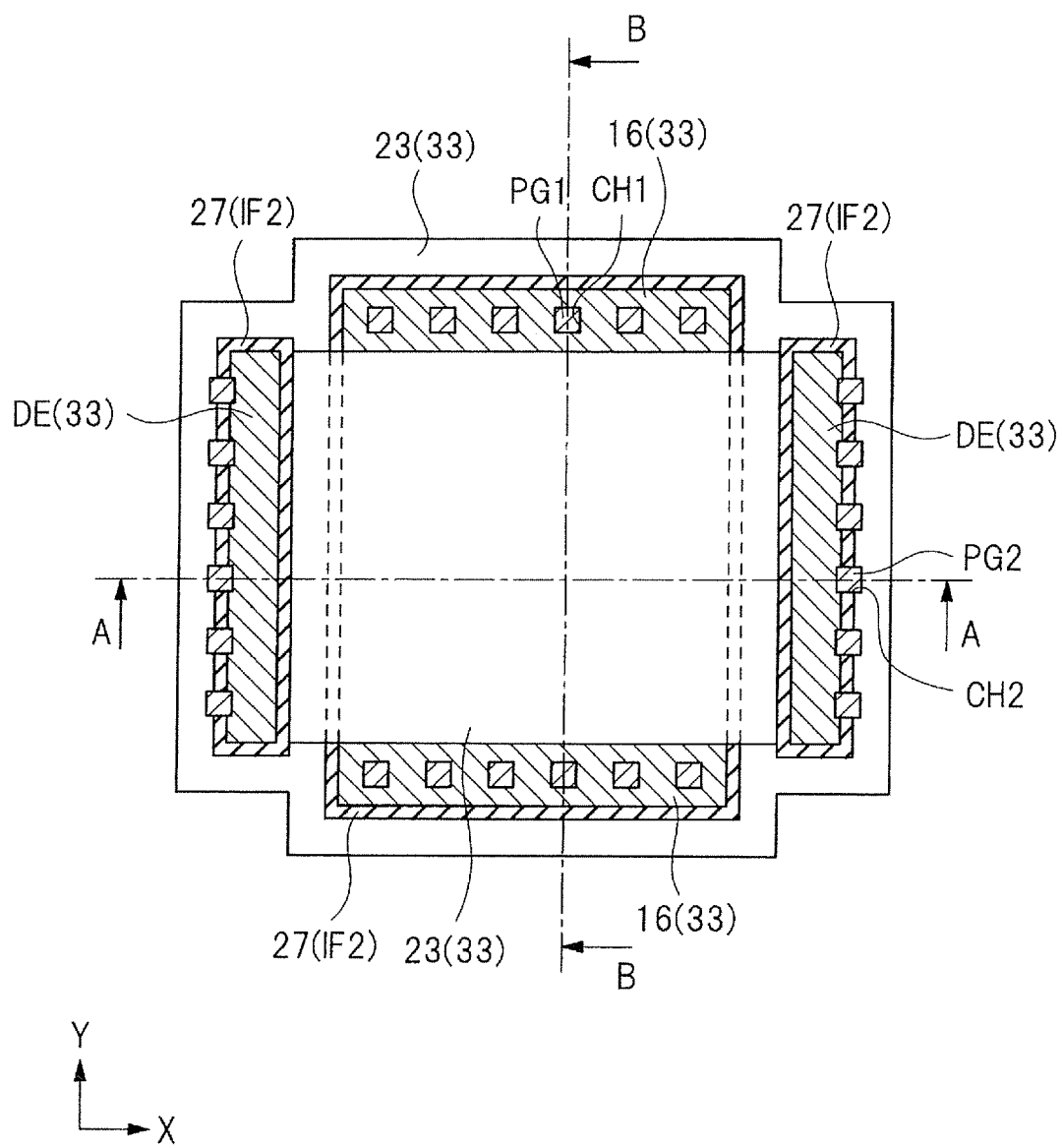
FIG. 7 is a plan view showing a capacitive element in a second modified example of First Embodiment.
Figure 8:
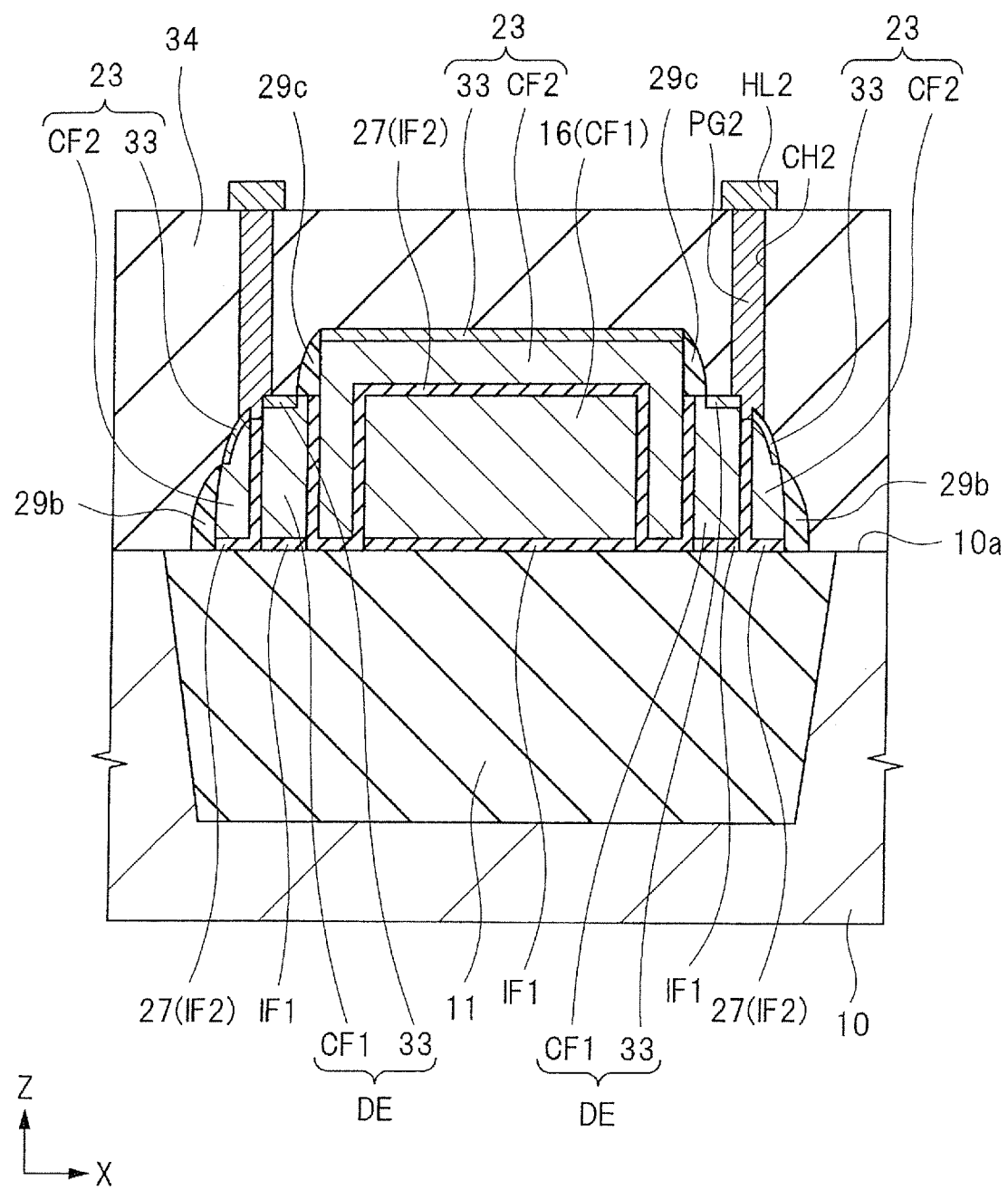
FIG. 8 is a cross sectional view showing the capacitive element in the second modified example of First Embodiment.
Figure 9:
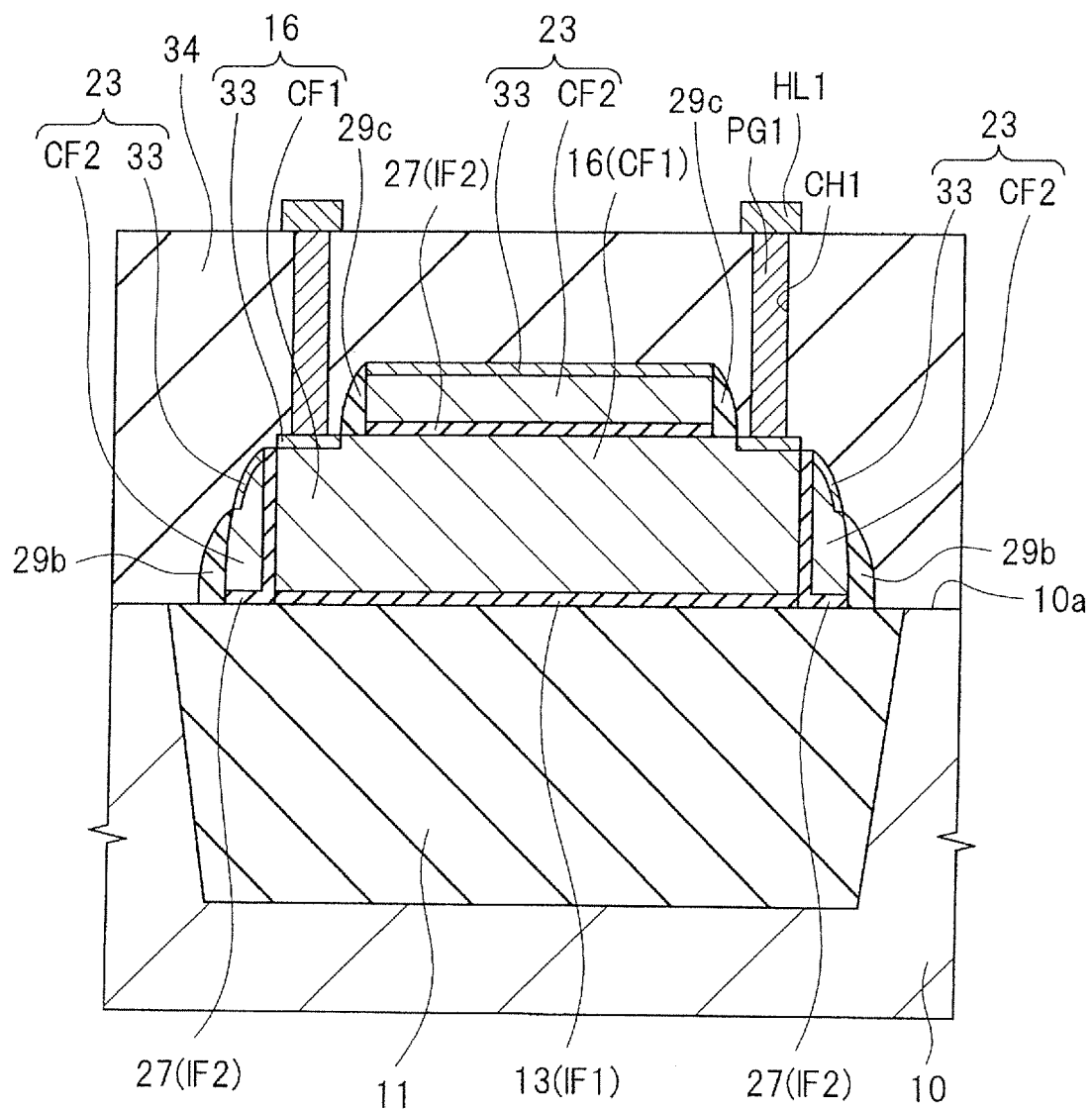
FIG. 9 is a cross sectional view showing the capacitive element in the second modified example of First Embodiment.

FIG. 7 is a plan view showing a capacitive element in a second modified example of First Embodiment. FIGS. 8 and 9 are each a cross sectional view showing the capacitive element in the second modified example of First Embodiment. FIG. 8 is a cross sectional view along line A-A of FIG. 7. FIG. 9 is a cross sectional view along line B-B of FIG. 7.

The capacitive element of the present second modified example is different from the capacitive element of First Embodiment described by reference to FIGS. 2 and 3 in that the electrode 23 is formed not only between the electrode 16 and the dummy electrode DE, at the circumferential side surface of the electrode 16, and the circumferential side surface of the dummy electrode DE, but also in a partial region of the top surface of the electrode 16. The capacitive element of the present second modified example is the same as the capacitive element of First Embodiment in other respects.

As shown in FIG. 7, the electrode 16 does not include a line part, and, in plan view, has a rectangular shape, and is integrally formed. Incidentally, in the present second modified example, the dummy electrode DE extends in the Y axis direction, and is formed apart from the electrode 16 in the X axis direction.

The electrode 23 is also formed in a partial region of the top surface of the electrode 16 in addition to between the electrode 16 and the dummy electrode DE, at the circumferential side surface of the electrode 16, and the circumferential side surface of the dummy electrode DE. Whereas, the electrode 23 may be integrally formed. Further, at the side surface of the portion of the electrode 23 formed over the top surface of the electrode 16, there is formed a sidewall 29c formed of a insulation film. Incidentally, FIG. 7 shows the state as seen through the sidewall 29c.

The metal silicide film 33 is formed in a region of the top surface of the electrode 16 in which neither of the electrode 23 and the sidewall 29c is formed therein. Further, the contact hole CH1 penetrates through the interlayer insulation film 34, and reaches the region of the top surface of the electrode 16 in which neither of the electrode 23 and sidewall 29c is formed. The plug PG1 is formed of a conductive film embedded in the contact hole CH1, and is electrically directly coupled with the electrode 16. The contact hole CH2 and the plug PG2 are the same as those in First Embodiment.

Also in the present second modified example, as with First Embodiment, the plug PG2 can be electrically coupled with any portion of the electrode 23 at a low resistance. Accordingly, the electrode 16 and the electrode 23 can be prevented from being electrically short-circuited. Thus, the contact hole CH2 can be aligned with ease.

On the other hand, in the present second modified example, as compared with First Embodiment, the area of the side surface of the electrode 23 opposite to the side surface of the electrode 16 may be reduced. However, the top surface of the electrode 16 and the bottom surface of the electrode 23 are opposite to each other. For this reason, the capacity of the capacitive element can be increased with ease.

<Third Modified Example of Capacitive Element>

Figure 10:
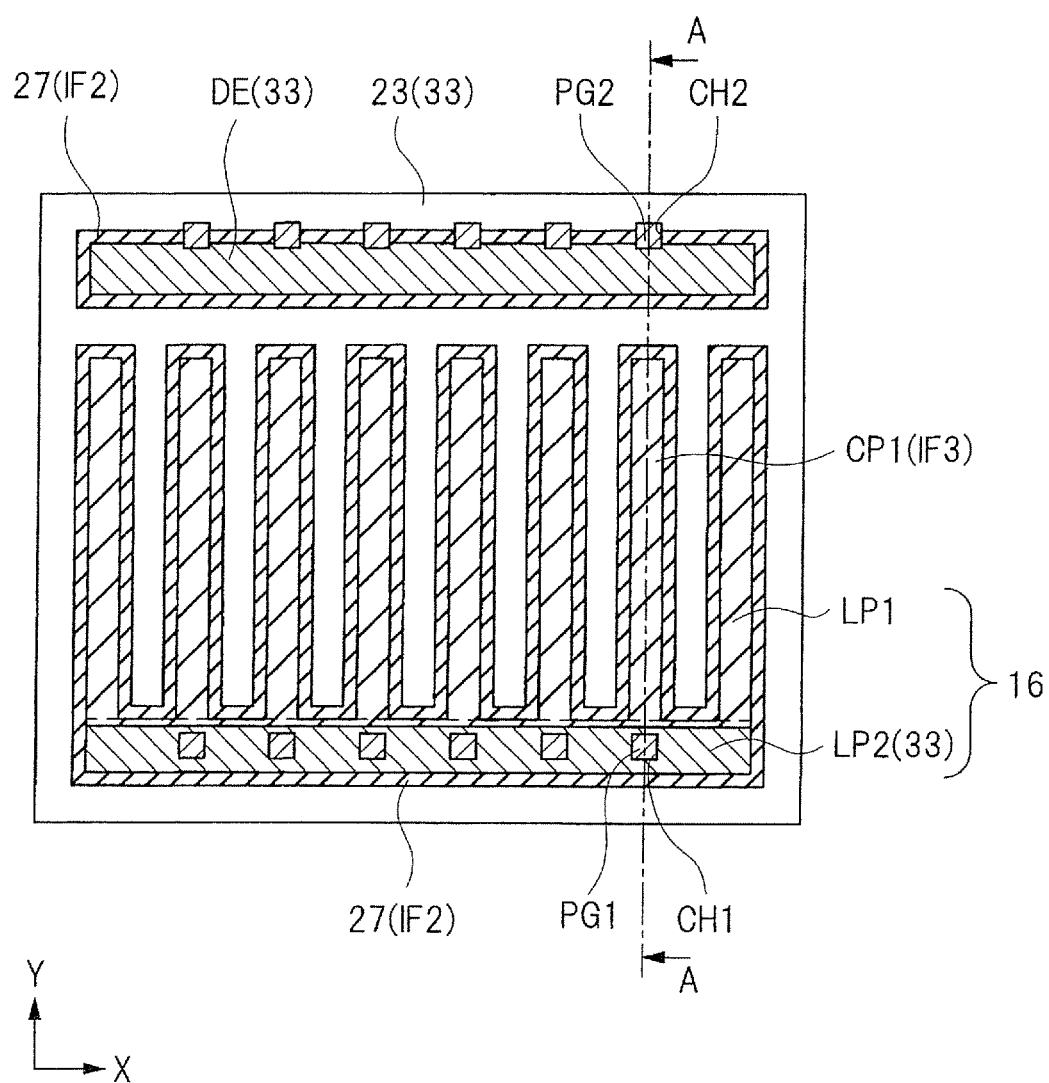
FIG. 10 is a plan view showing a capacitive element in a third modified example of First Embodiment.
Figure 11:
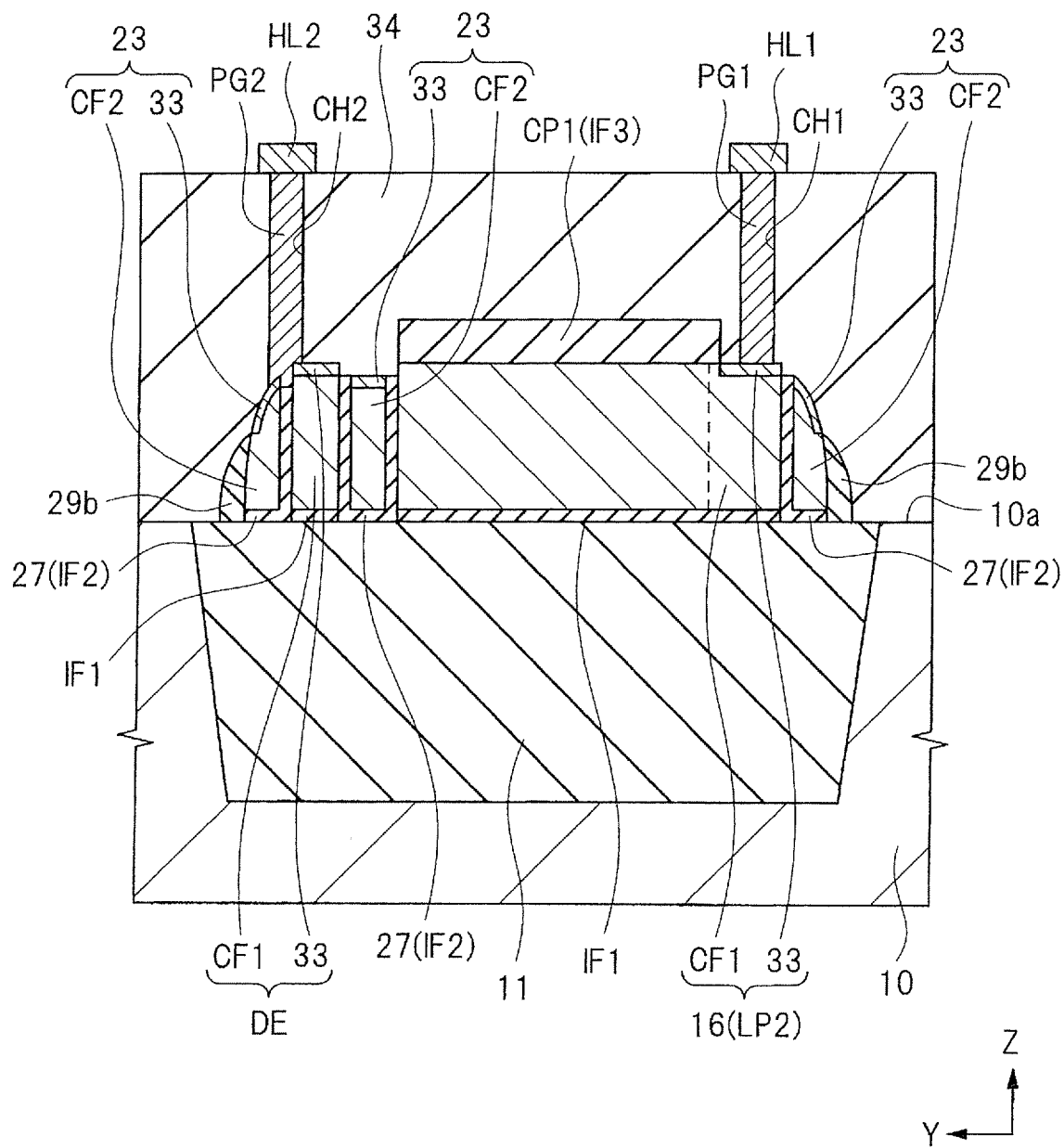
FIG. 11 is a cross sectional view showing the capacitive element in the third modified example of First Embodiment.

FIG. 10 is a plan view showing a capacitive element in a third modified example of First Embodiment. FIG. 11 is a cross sectional view showing the capacitive element in the third modified example of First Embodiment. FIG. 11 is a cross sectional view along line A-A of FIG. 10.

The capacitive element of the present third modified example is different from the semiconductor device of First Embodiment described by reference to FIGS. 2 and 3 in that a cap insulation film CP1 is formed in a partial region of the top surface of the electrode 16. The capacitive element of the present third modified example is the same as the capacitive element of First Embodiment in other respects.

As shown in FIGS. 10 and 11, over the line parts LP1, and over a part of the line part LP2, namely, over a part of the electrode 16, the cap insulation films CP1 is formed in at least a region in contact with the electrode 23 via the capacitive insulation film 27 in plan view. The cap insulation film CP1 is formed of an insulation film IF3 such as a silicon nitride film.

Incidentally, in a region of the top surface of each line part LP1 in which the cap insulation film CP1 is formed, the metal silicide film 33 is not formed. On the other hand, at the region of the top surface of the line part LP2 in the vicinity of each plug PG1, and at the top surface of the dummy electrode DE, the metal silicide films 33 are formed, but the cap insulation film CP1 is not formed.

Also in the present third modified example, as with First Embodiment, each plug PG2 can be electrically coupled with any portion of the electrode 23 at a low resistance. This can prevent an electric short circuit between the electrode 16 and the electrode 23 through the plug PG2. Thus, the capacity of the capacitive element can be increased with ease, and the contact hole CH2 can be aligned with ease.

On the other hand, in the present third modified example, the region of the electrode 16 in contact with the electrode 23 via the capacitive insulation film 27 in plan view is covered with the cap insulation film CP1. Therefore, in the present third modified example, as compared with First Embodiment, it is possible to prevent the adjacent electrode 16 and electrode 23 from being electrically short-circuited with more reliability.

<Configuration of Memory Cell>

Then, a description will be given to the memory cell of the flash memory 4 (see FIG. 1) formed in the semiconductor chip CHP (see FIG. 1), the capacitive element for use in the analog circuit (see FIG. 1) or the driving circuit of the flash memory 4 by reference to the accompanying drawings.

Figure 12:
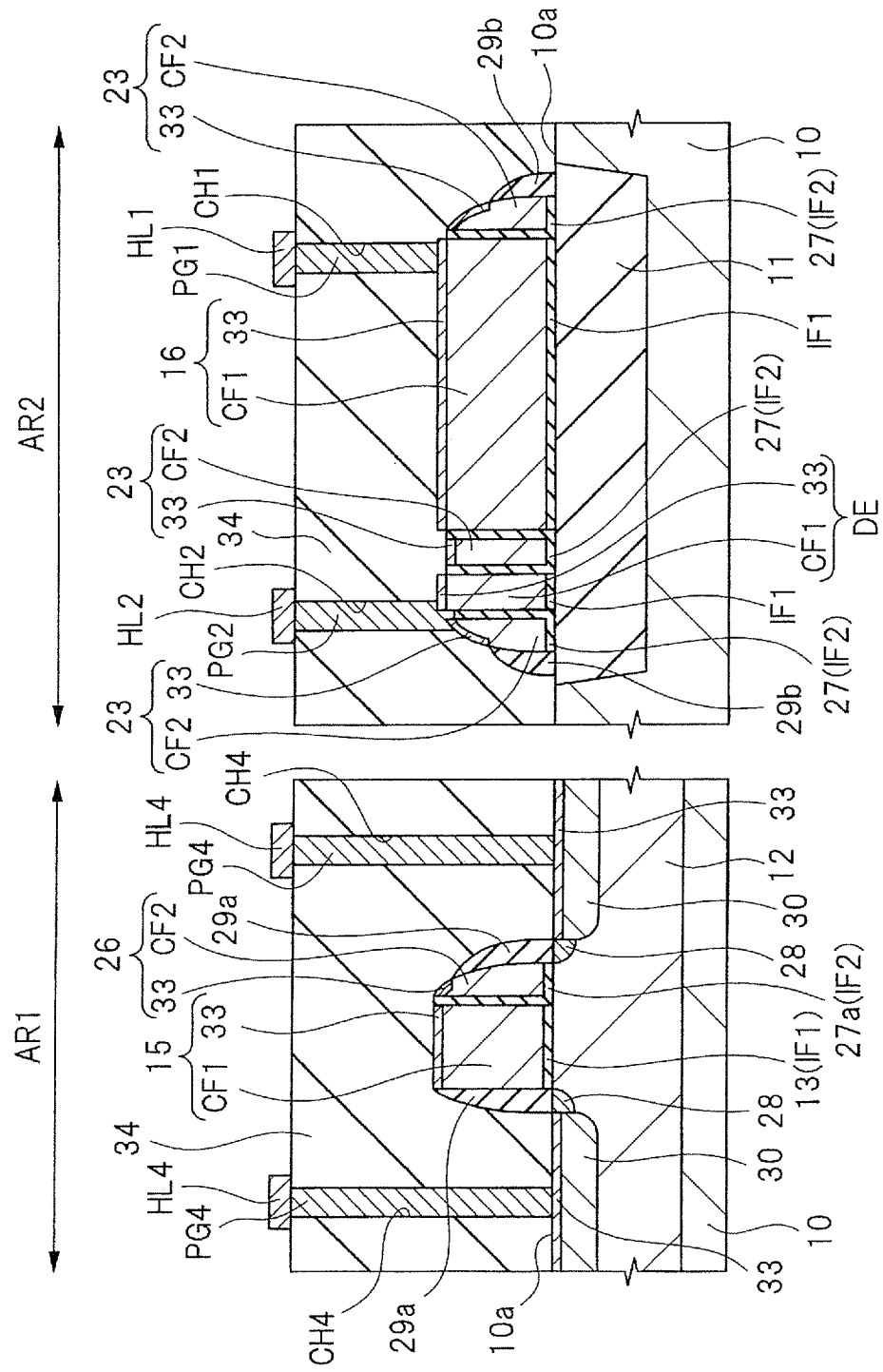
FIG. 12 is a cross sectional view showing the semiconductor device of First Embodiment.
Figure 13:
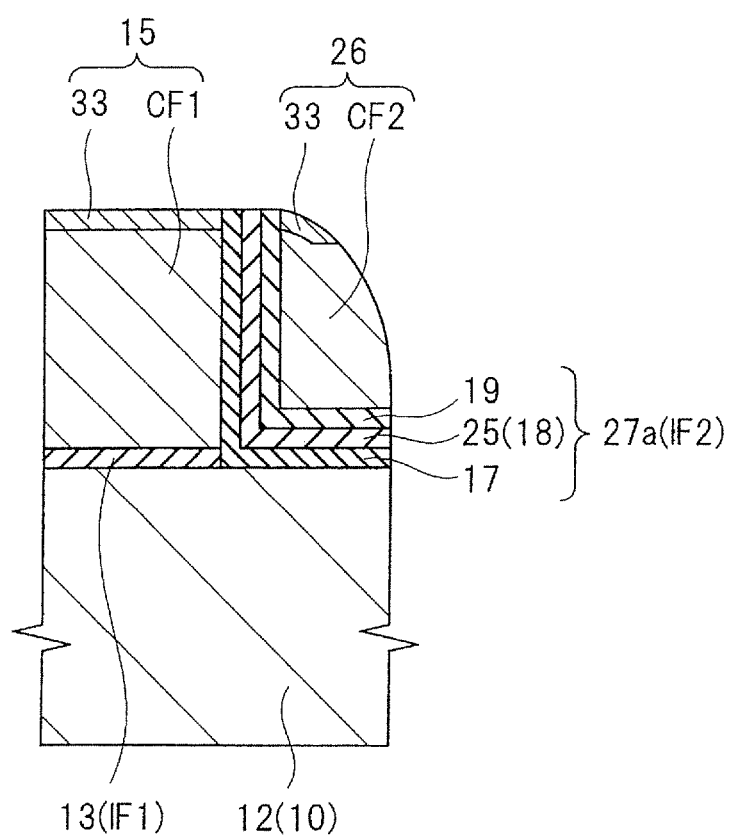
FIG. 13 is a cross sectional view showing the semiconductor device of First Embodiment.

FIGS. 12 and 13 are each a cross sectional view showing the semiconductor device of First Embodiment. FIG. 12 is a cross sectional view showing the structure of the memory cell of the flash memory, and the structure of the capacitive element formed in an analog circuit or the like. FIG. 13 is a cross sectional view showing the periphery of an insulation film 27a of the memory cell.

As shown in FIG. 12, the memory cell is formed in a memory cell formation region AR1 of the semiconductor chip, and the capacitive element is formed in a capacitive element formation region AR2 of the semiconductor chip. Namely, the semiconductor device has the memory cell formed in the memory cell formation region AR1, and the capacitive element formed in the capacitive element formation region AR2.

First, a description will be given to the structure of the memory cell of the flash memory. The semiconductor device has a p type well 12, a gate insulation film 13, a control gate electrode 15, a memory gate electrode 26, an insulation film 27a as a gate insulation film, and low density impurity diffusion regions 28 and high density impurity diffusion regions 30 as a source region and a drain region. The gate insulation film 13, the control gate electrode 15, the insulation film 27a, and the memory gate electrode 26 form the memory cell.

As shown in FIG. 12, in the memory cell formation region AR1, a p type well 12 is formed in the semiconductor substrate 10. Over the p type well 12, there is formed the memory cell. The memory cell is formed of a selection part for selecting a memory cell, and a storage part for storing information.

First, a description will be given to the configuration of the selection part for selecting a memory cell. The memory cell has a gate insulation film 13 formed over a semiconductor substrate 10, namely, a p type well 12. Over the gate insulation film 13, there is formed the control gate electrode 15. The gate insulation film 13 is formed of an insulation film IF1 at the same layer as the insulation film IF1 between electrode 16 and the semiconductor substrate 10, such as a silicon oxide film. The control gate electrode 15 is formed of a conductive film CF1 such as a polysilicon film, and a metal silicide film 33 such as a cobalt silicide film formed at the surface of the conductive film CF1. Namely, the control gate electrode 15 is formed of a conductive film CF1 at the same layer as the conductive film CF1 forming the electrode 16. The metal silicide film 33 is formed for reducing the resistance of the control gate electrode 15. The control gate electrode 15 has a function of selecting a memory cell. In other words, a specific memory cell is selected by the control gate electrode 15.

Thus, a write operation, an erase operation, or a read operation is executed on the selected memory cell.

Then, a description will be given to the configuration of the memory cell. At one side surface of the control gate electrode 15, there is formed a memory gate electrode 26 via the insulation film 27a. The memory gate electrode 26 is formed in a sidewall shape formed at one side surface of the control gate electrode 15, and is formed of a conductive film CF2 such as a polysilicon film, and a metal silicide film 33 such as a cobalt silicide film formed at the surface of the conductive film CF2. Namely, the memory gate electrode 26 is formed of the conductive film CF2 at the same layer as the conductive film CF2 forming the electrode 23. The metal silicide film 33 is formed for reducing the resistance of the memory gate electrode 26.

Between the control gate electrode 15 and the memory gate electrode 26, and between the memory gate electrode 26 and the semiconductor substrate 10, there is formed an insulation film 27a as the gate insulation film. The insulation film 27a is formed of the insulation film IF2 at the same layer as the insulation film IF2 forming the capacitive insulation film 27. As shown in FIG. 13, the insulation film IF2 forming the insulation film 27a is formed of a silicon oxide film 17 formed over the semiconductor substrate 10, a charge accumulation film 25 (silicon nitride film 18) formed over the silicon oxide film 17, and a silicon oxide film 19 formed over the charge accumulation film 25. The silicon oxide film 17 functions as a gate insulation film formed between the memory gate electrode 26 and the semiconductor substrate 10. The gate insulation film formed of the silicon oxide film 17 also has a function as a tunnel insulation film. For example, the storage part of the memory cell injects electrons into the charge accumulation film 25, or injects holes into the charge accumulation film 25 from the semiconductor substrate 10 via the silicon oxide film 17, and thereby performs storage or erase of information. Accordingly, the silicon oxide film 17 functions as a tunnel insulation film.

Then, the charge accumulation film 25 formed over the silicon oxide film 17 has a function of accumulating electric charges. Specifically, in the present First Embodiment, the charge accumulation film 25 is formed of the silicon nitride film 18. The storage part of the memory cell in the present First Embodiment controls the current flowing in the semiconductor substrate 10, namely, in the p type well 12 under the memory gate electrode 26 by the presence or absence of electric charges accumulated in the charge accumulation film 25, and thereby stores information. In other words, information is stored by utilizing the following: the threshold voltage of the current flowing in the semiconductor substrate 10 under the memory gate electrode 26 changes by the presence or absence of electric charges accumulated in the charge accumulation film 25.

In the present First Embodiment, an insulation film having a trap level is used as the charge accumulation film 25. As one example of the insulation film having a trap level, mention may be made of the silicon nitride film 18. However, not limited to the silicon nitride film, there may be used, for example, an aluminum oxide film (alumina). When the insulation film having a trap level is used as the charge accumulation film 25, electric charges are trapped at the trap level formed in the insulation film. By thus trapping electric charges at the trap level, electric charges are accumulated in the insulation film.

At one sidewall, namely, one side surface of both sidewalls of the control gate electrode 15, there is formed the memory gate electrode 26. Whereas, at the other sidewall, namely, the other side surface thereof, there is formed a sidewall 29a formed of a silicon oxide film. Similarly, at one sidewall, namely, one side surface of both sidewalls of the memory gate electrode 26, there is formed the control gate electrode 15. Whereas, at the other sidewall, namely, the other side surface thereof, there is formed a sidewall 29a formed of a silicon oxide film.

In the semiconductor substrate 10 immediately under the sidewall 29a, there are formed a pair of shallow low density impurity diffusion regions 28 which are n type semiconductor regions. In outer regions in contact with the pair of shallow low density impurity diffusion regions 28, there are formed a pair of deep high density impurity diffusion regions 30, respectively. The deep high density impurity diffusion regions 30 are also n type semiconductor regions. At the surface of each high density impurity diffusion region 30, there is formed the metal silicide film 33 formed of, for example, a cobalt silicide film. The pair of low density impurity diffusion regions 28 and the pair of high density impurity diffusion regions 30 form the source region or the drain region of the memory cell. The source region and the drain region are formed of the low density impurity diffusion region 28 and the high density impurity diffusion region 30. As a result, the source region and the drain region can be formed in a LDD (Lightly Doped Drain) structure.

Incidentally, for the source region and the drain region, one is formed in alignment with the control gate electrode 15, and the other is formed in alignment with the memory gate electrode 26.

Herein, the transistor formed of the gate insulation film 13, the control gate electrode 15, and the source region and the drain region is assumed to be referred to as a selection transistor. On the other hand, the transistor formed of the insulation film 27a, the memory gate electrode 26, and the source region and the drain region is assumed to be referred to as a memory transistor. As a result, it can be said that the selection part of the memory cell is formed of a selection transistor, and that the storage part of the memory cell is formed of a memory transistor. The memory cell is formed in this manner.

Then, a description will be given to the wiring structure to be coupled with the memory cell. Over the memory cell, an interlayer insulation film 34 formed of a silicon oxide film is formed in such a manner as to cover the memory cell. In the interlayer insulation film 34, there is formed each contact hole CH4 penetrating through the interlayer insulation film 34, and reaching the metal silicide film 33 formed at the surface of the high density impurity diffusion region 30 forming the source region or the drain region. In the inside of the contact hole CH4, there is embedded a conductive film. As the conductive film, first, there is formed a titanium/titanium nitride film which is a barrier conductive film. Then, a tungsten film is formed in such a manner as to fill the contact hole CH4. Thus, the titanium/titanium nitride film and a tungsten film are embedded in the contact hole CH4. This results in the formation of a plug PG4 formed of a conductive film embedded in the contact hole CH4, and electrically coupled with the source region or the drain region. Then, over the interlayer insulation film 34, there is formed a wire HL4. The wire HL4 and the plug PG4 are electrically coupled with each other. The wire HL4 is formed of a lamination film of, for example, a titanium/titanium nitride film, an aluminum film, and a titanium/titanium nitride film.

Incidentally, the plugs PG1, PG2, and PG3 are also formed in the same manner as with the plug PG4. The wires HL1, HL2, and HL3 are also formed in the same manner as with the wire HL4.

The memory cell in the present First Embodiment is configured as described above. Below, a description will be given to the operation of the memory cell. Herein, the voltage to be applied to the control gate electrode 15 is referred to as Vcg, and the voltage to be applied to the memory gate electrode 26 is referred to as Vmg. Further, the respective voltages to be applied to the source region and the drain region are referred to as Vs and Vd, respectively. The voltage to be applied to the semiconductor substrate 10, namely, the p type well 12 is referred to as Vb. The injection of electrons into the silicon nitride film 18 which is the charge accumulation film 25 is defined as "write". The injection of holes into the silicon nitride film 18 is defined as "erase".

First, the write operation will be described. The write operation is performed by hot electron write referred to as so-called source side injection method. As the write voltage, for example, the voltage Vs to be applied to the source region is set at 6 V; the voltage Vmg to be applied to the memory gate electrode 26 is set at 12 V; and the voltage Vcg to be applied to the control gate electrode 15 is set at 1.5V. Then, the voltage Vd to be applied to the drain region is controlled so that the channel current for write becomes a given set value. The voltage Vd at this step is determined by the set value of the channel current and the threshold voltage of the selection transistor having the control gate electrode 15, and becomes, for example, about 1 V. The voltage Vb to be applied to the p type well 12, namely, the semiconductor substrate 10 is 0 V.

A description will be given to the movement of electric charges when such a voltage is applied to perform the write operation. As described above, a potential difference is caused between the voltage Vs to be applied to the source region and the voltage Vd to be, applied to the drain region. As a result, electrons flow in the channel region formed between the source region and the drain region. The electrons flowing in the channel region are accelerated in the channel region under the vicinity of the border between the control gate electrode 15 and the memory gate electrode 26, and become hot electrons. Then, under the electric field by the positive voltage (Vmg=12V) applied to the memory gate electrode 26, hot electrons are injected into the charge accumulation film 25, namely, the silicon nitride film 18 under the memory gate electrode 26. The injected hot electrons are trapped at the trap level in the silicon nitride film 18. As a result, electrons are accumulated in the silicon nitride film 18, resulting in an increase in threshold voltage of the memory transistor. The write operation is performed in this manner.

Subsequently, the erase operation will be described. The erase operation is performed by, for example, BTBT (Band to Band Tunneling) erase using an inter-band tunneling phenomenon. With BTBT erase, for example, the voltage Vmg to be applied to the memory gate electrode 26 is set at −6 V; the voltage Vs to be applied to the source region is set at 6 V; and the voltage Vcg to be applied to the control gate electrode 15 is set at 0 V; and the drain region is applied with 0 V. As a result, the holes generated by the inter-band tunneling phenomenon at the surface region end by the voltage caused across the source region and the memory gate electrode are accelerated by the high voltage applied to the source region, and become hot holes. Then, some of the hot holes are attracted to the negative voltage applied to the memory gate electrode 26, and are injected into the silicon nitride film 18. The injected hot holes are trapped at the trap level in the silicon nitride film 18, resulting in the reduction of the threshold voltage of the memory transistor. The erase operation is performed in this manner.

Then, the read operation will be described. Read is performed in the following manner: the voltage Vd to be applied to the drain region is set at Vdd (1.5 V), the voltage Vs to be applied to the source region is set at 0 V, the voltage Vcg to be applied to the control gate electrode 15 is set at Vdd (1.5 V), and the voltage Vmg to be applied to the memory gate electrode 26 is set at Vdd (1.5 V); thus, a current is passed in the opposite direction to that for write. The following is also acceptable: the voltage Vd to be applied to the drain region and the voltage Vs to be applied to the source region are interchanged, and are set at 0 V and 1.5 V, respectively; thus, read is performed with the current in the same direction as that for write. At this step, when the memory cell in the write state, and the threshold voltage is high, a current does not flow through the memory cell. On the other hand, when the memory cell is in the erase state, and the threshold voltage is low, a current flows through the memory cell.

<Method for Manufacturing a Semiconductor Device>

Then, a description will be given to a method for manufacturing a semiconductor device of the present First Embodiment.

FIGS. 14 to 31 are each a cross sectional view of the semiconductor device during a manufacturing step in First Embodiment. FIGS. 14 to 31 each show the same cross section as the cross section shown in FIG. 12.

Figure 14:
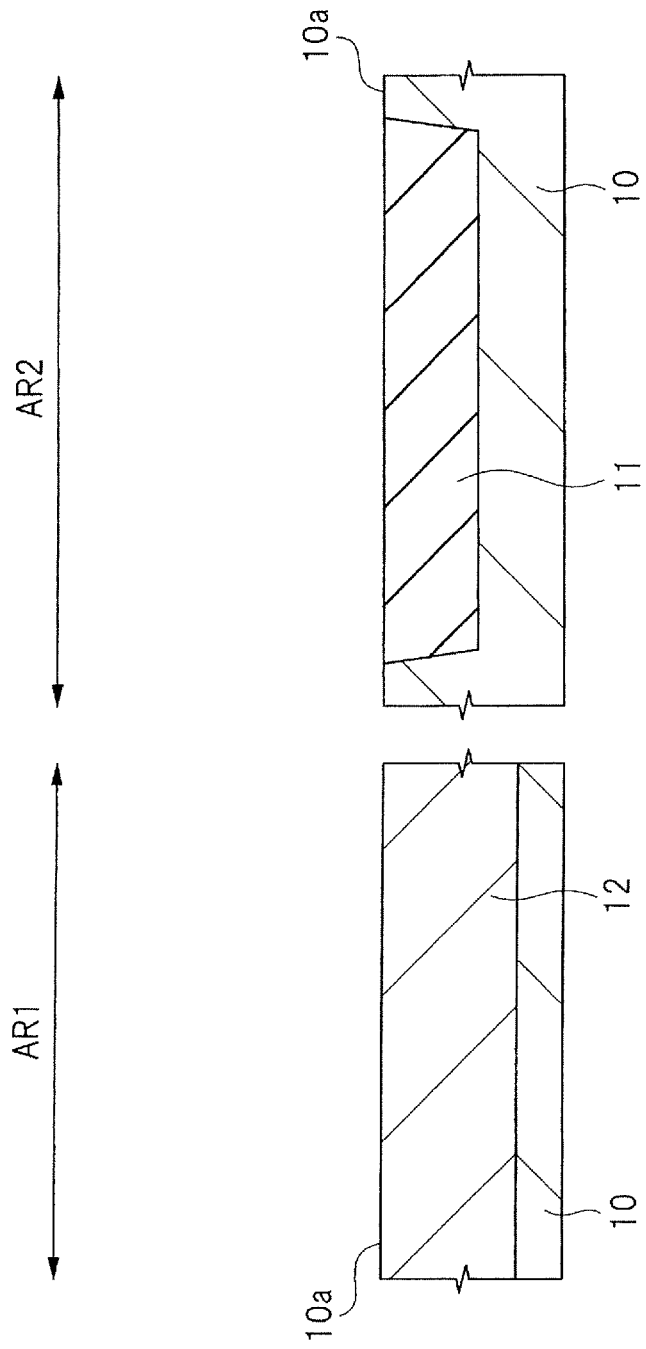
FIG. 14 is a cross sectional view of the semiconductor device during a manufacturing step in First Embodiment.

First, as shown in FIG. 14, there is provided a semiconductor substrate 10 formed of a silicon single crystal doped with p type impurities such as boron (B). Then, in the semiconductor substrate 10, there is formed an element isolation region 11 for isolating, for example, a low breakdown voltage MISFET formation region and a high breakdown voltage MISFET formation region from each other. The element isolation region 11 is provided in order to prevent elements from interfering with one another. The element isolation region 11 can be formed using, for example, a LOCOS (Local Oxidation of Silicon) method or a STI (Shallow Trench Isolation) method.

For example, with the STI method, the element isolation region 11 is formed in the following manner. Namely, in the semiconductor substrate 10, an element isolation trench is formed using a photolithography technology and an etching technology. Then, a silicon oxide film is formed over the semiconductor substrate 10 in such a manner as to fill the element isolation trench. Then, by a Chemical Mechanical Polishing: CMP) method, unnecessary portions of the silicon oxide film formed over the semiconductor substrate 10 are removed. As a result, there can be formed the element isolation region 11 in which the silicon oxide film is embedded only in the element isolation trench. Incidentally, FIG. 14 shows the region of the memory cell formation region AR1 on the front surface 10a side of the semiconductor substrate 10 in which the element isolation region 11 is not formed, and the region of the capacitive element formation region AR2 on the front surface 10a side of the semiconductor substrate 10 in which the element isolation region 11 is formed.

Then, the semiconductor substrate 10 is doped with impurities to form a p type well 12. The p type well 12 is formed by doping p type impurities such as boron into the semiconductor substrate 10 with the ion implantation method. Then, in the memory cell formation region AR1, a semiconductor region (not shown) for forming the channel of the selection transistor is formed in the surface region of the p type well 12. The semiconductor region for channel formation is formed for adjusting the threshold voltage forming the channel.

Figure 15:
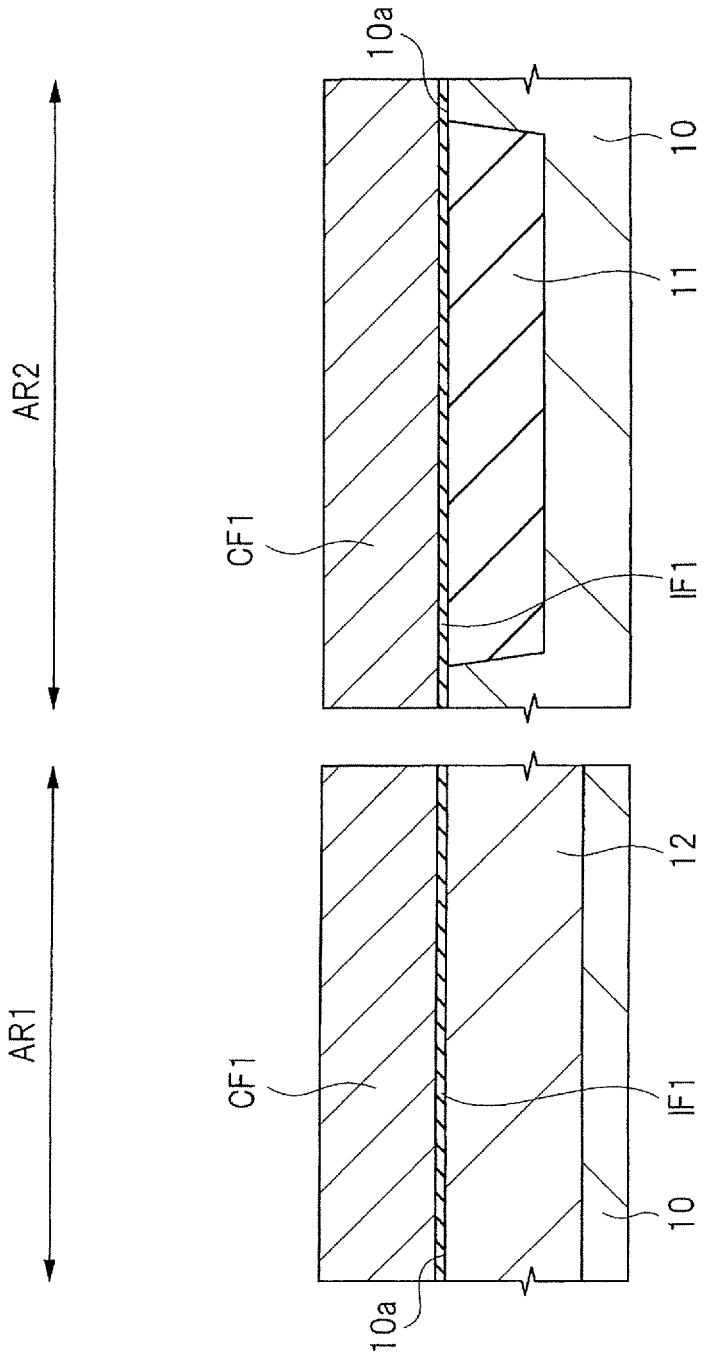
FIG. 15 is a cross sectional view of the semiconductor device during a manufacturing step in First Embodiment.

Then, as shown in FIG. 15, in the memory cell formation region AR1 and the capacitive element formation region AR2, an insulation film IF1 is formed over the semiconductor substrate 10. The insulation film IF1 is formed of, for example, a silicon oxide film, and can be formed using, for example, a thermal oxidation method. However, the insulation film IF1 is not limited to a silicon oxide film, and may be variously changed. For example, the insulation film IF1 may be a silicon oxynitride film (SiON). Namely, nitrogen may be segregated at the interface between the insulation film IF1 and the semiconductor substrate 10. The silicon oxynitride film is higher than the silicon oxide film in terms of the effects of suppressing the generation of the interface state in the film, and reducing electron trap. Therefore, the hot carrier resistance of the insulation film IF1 can be improved, and the insulation resistance can be improved. Further, the Silicon oxynitride film is less susceptible to diffusion of impurities therein as compared with the silicon oxide film. For this reason, by using a silicon oxynitride film for the gate insulation film 13, it is possible to suppress variations in threshold voltage caused by diffusion of impurities in the control gate electrode 15 toward the semiconductor substrate 10 side. For the formation of a silicon oxynitride film, for example, the semiconductor substrate 10 may be desirably heat-treated in an atmosphere containing nitrogen such as NO, $NO_2$, or $NH_3$. Alternatively, the same effects can also be obtained in the following manner: an insulation film IF1 formed of a silicon oxide film is formed over the surface of the semiconductor substrate 10; then, the semiconductor substrate 10 is heat-treated in an atmosphere containing nitrogen; accordingly, nitrogen is segregated at the interface between the insulation film IF1 and the semiconductor substrate 10.

Alternatively, the insulation film IF1 may be formed of, for example, a high dielectric constant film having a higher dielectric constant than that of a silicon nitride film. As a result, even with the same capacity, the physical film thickness can be increased. For this reason, the leakage current can be reduced.

For example, as a high dielectric constant film, there is used a hafnium oxide ($HfO_2$) film which is one of hafnium oxides. However, in place of the hafnium oxide film, there can also be used other hafnium type insulation films such as a hafnium aluminate (HfAlO) film, a hafnium oxynitride (HfON) film, a hafnium silicate (HfSiO) film, and a hafnium silicon oxynitride (HfSiON) film. Further, there can also be used hafnium type insulation films obtained by doping the hafnium type insulation films with oxides such as tantalum oxide, niobium oxide, titanium oxide, zirconium oxide, lanthanum oxide, and yttrium oxide. The hafnium type insulation films are, as with a hafnium oxide film, higher in dielectric constant than a silicon oxide film and a silicon oxynitride film, and hence can provide the same effects as those when a hafnium oxide film is used.

Then, in the memory cell formation region AR1 and the capacitive element formation region AR2, a conductive film CF1 formed of a polysilicon film is formed over the insulation film IF1. The conductive film CF1 formed of a polysilicon film can be formed using, for example, a CVD (Chemical Vapor Deposition) method. Then, using a photolithography technology and an ion implantation method, n type impurities such as phosphorus or arsenic are doped into the conductive film CF1 formed of a polysilicon film.

Figure 16:
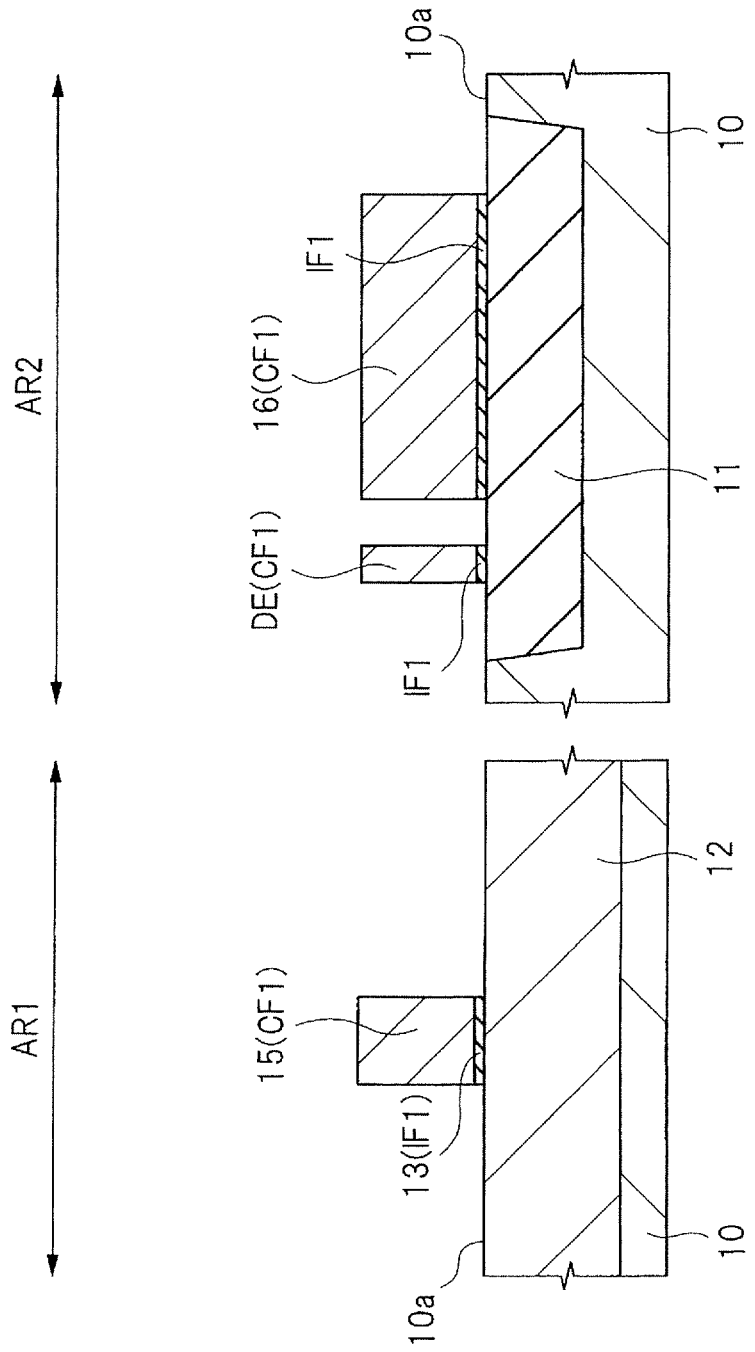
FIG. 16 is a cross sectional view of the semiconductor device during a manufacturing step in First Embodiment.

Then, as shown in FIG. 16, in the memory cell formation region AR1 and the capacitive element formation region AR2, the conductive film CF1 and the insulation film IF1 are processed, namely, patterned by etching using a patterned resist film as a mask. Then, in the memory cell formation region AR1, there are formed a control gate electrode 15 formed of the conductive film CF1, and a gate insulation film 13 formed of the insulation film IF1 between the control gate electrode 15 and the semiconductor substrate 10. Whereas, in the capacitive element formation region AR2, there are formed an electrode 16 formed of the conductive film CF1, and a dummy electrode DE formed of the conductive film CF1. The control gate electrode 15 is the gate electrode of the selection transistor of the memory cell. Thus, the electrode 16 and the dummy electrode DE of the capacitive element are formed in the step of forming the control gate electrode 15 of the memory cell.

Herein, in the control gate electrode 15, n type impurities are doped into the conductive film CF1 formed of a polysilicon film. For this reason, the work function value of the control gate electrode 15 can be set at a value in the vicinity of the conduction band of silicon (4.15 eV). For this reason, it is possible to reduce the threshold voltage of the selection transistor which is an n channel type MISFET.

Herein, when a semiconductor device of a third modified example of First Embodiment is manufactured, the following steps described by reference to FIGS. 17 to 19 can be performed as a modified example in place of the step described by reference FIG. 16.

Figure 17:
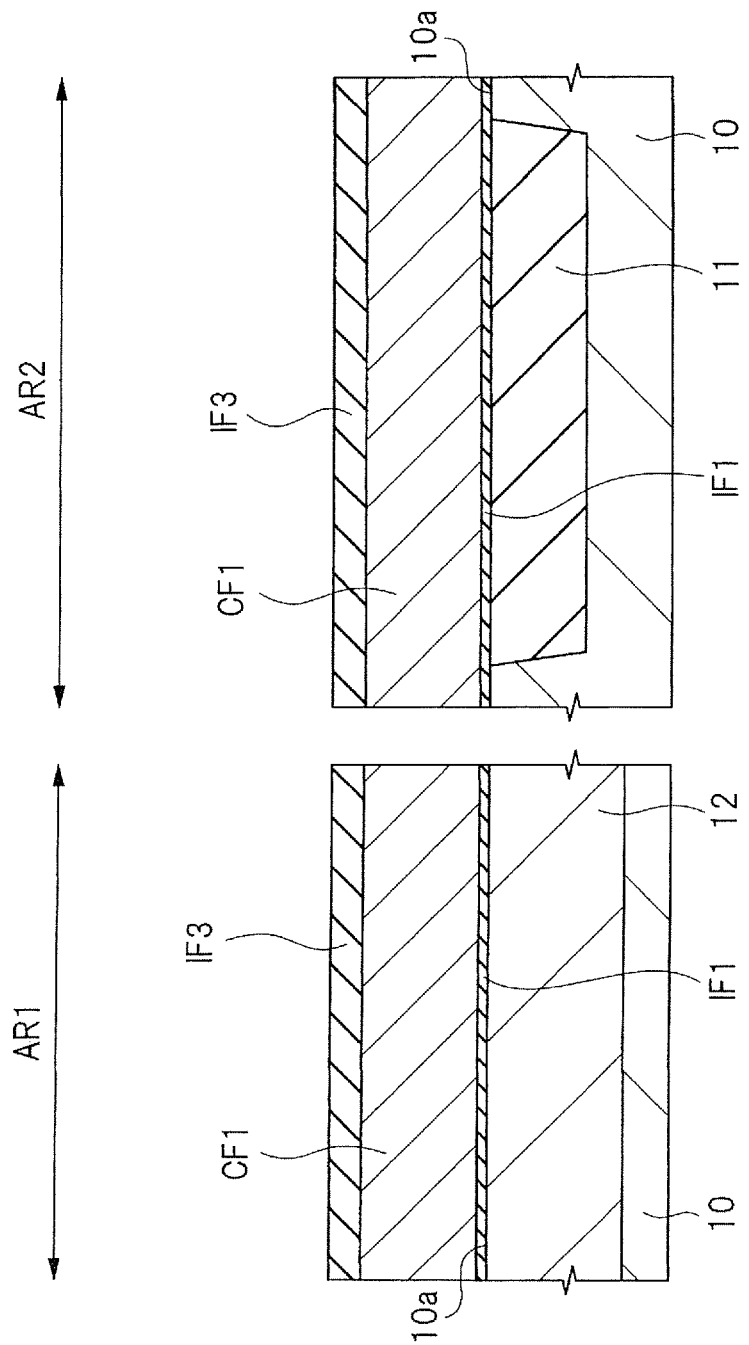
FIG. 17 is a cross sectional view of the semiconductor device during a manufacturing step in First Embodiment.

First, after the step described by reference to FIG. 15, as shown in FIG. 17, an insulation film IF3 is formed over the conductive film CF1 formed of a polysilicon film. The insulation film IF3 formed of a silicon nitride film can be formed using, for example, a CVD method. Incidentally, for the materials for the insulation film IF3, insulation films formed of other materials functioning as a cap insulation film, a hard mask film, or a spacer film can be used in place of the silicon nitride film.

Figure 18:
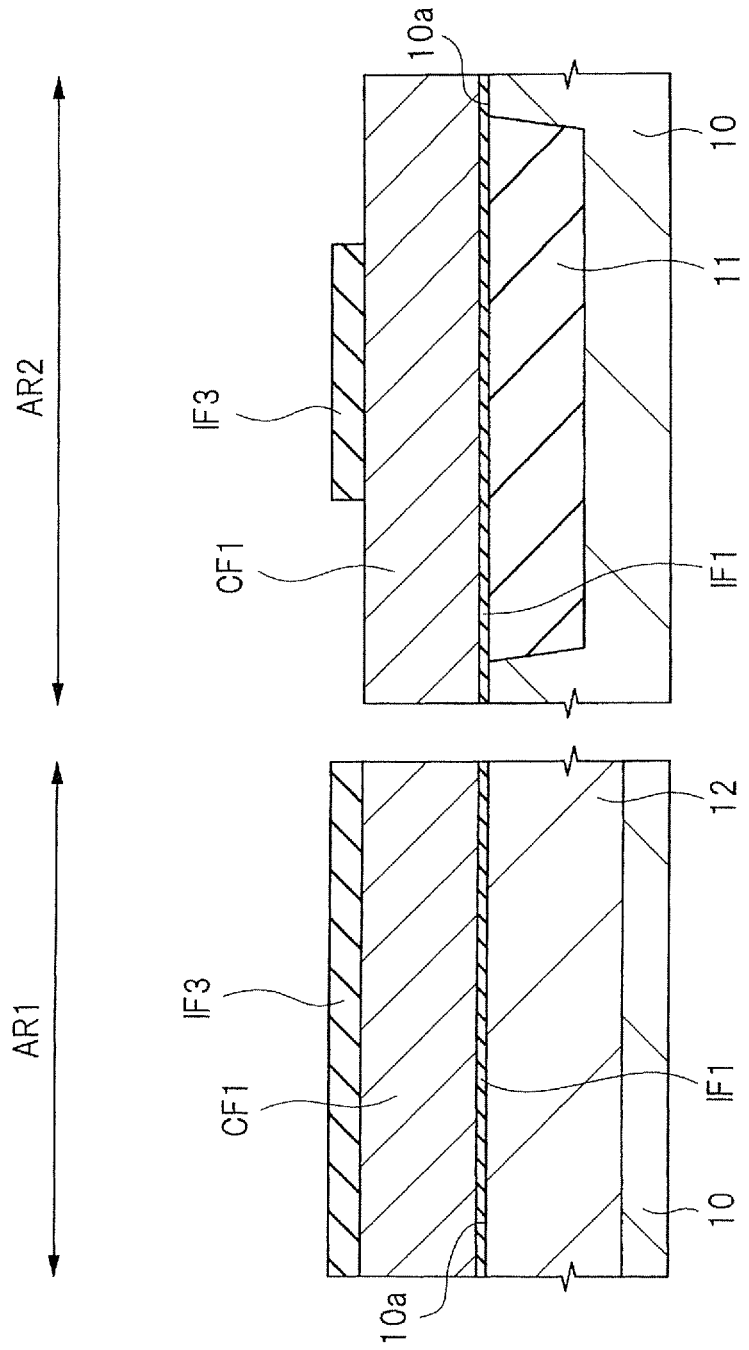
FIG. 18 is a cross sectional view of the semiconductor device during a manufacturing step in First Embodiment.

Then, as shown in FIG. 18, by etching using a patterned resist film as a mask, the insulation film IF3 is processed. Thus, in the region of the capacitive element formation region AR2 in which a metal silicide film is formed, the insulation film IF3 is removed. In the region of the capacitive element formation region AR2 except for the region in which a metal silicide film is formed, the insulation film IF3 is left. Incidentally, as shown in FIG. 18, in the memory cell formation region AR1, the insulation film IF3 can be left.

Figure 19:
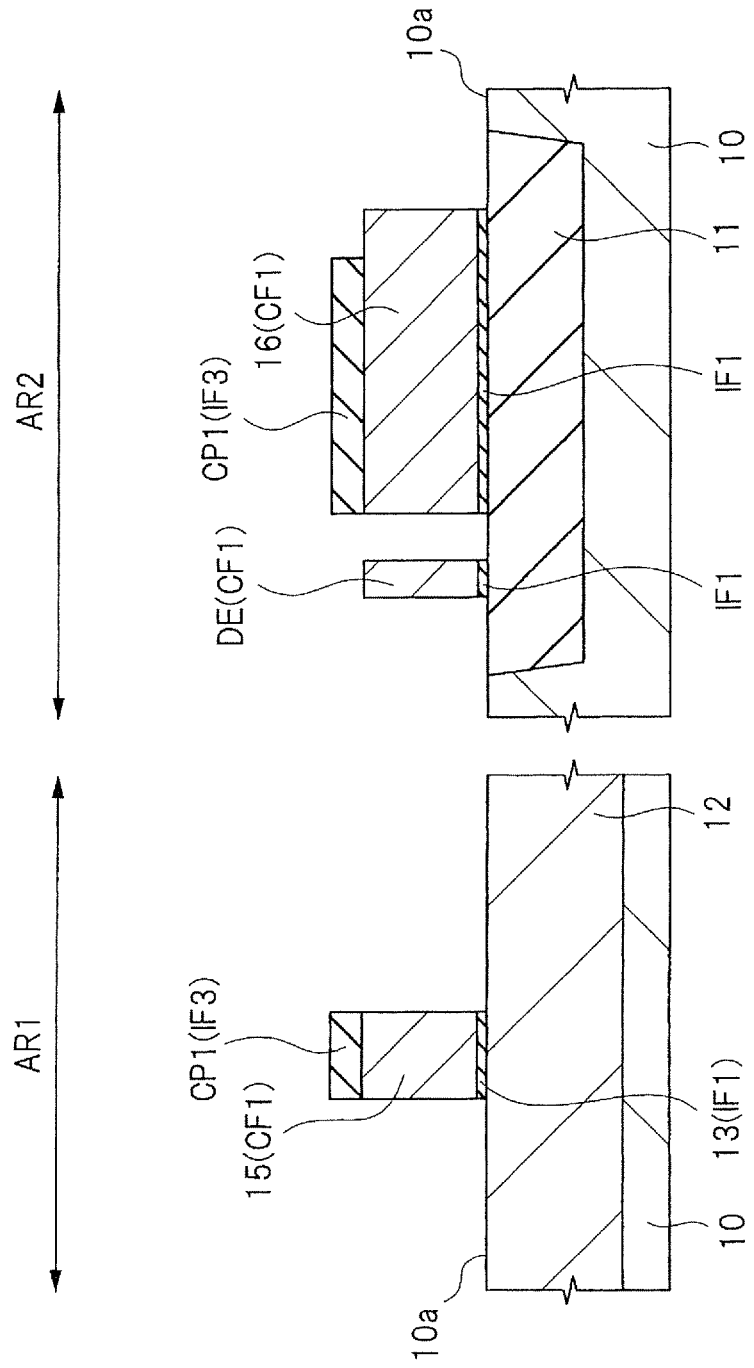
FIG. 19 is a cross sectional view of the semiconductor device during a manufacturing step in First Embodiment.

Then, as shown in FIG. 19, by etching using a patterned resist film as a mask, the insulation film IF3, the conductive film CF1, and the insulation film IF1 are processed. As a result, in the memory cell formation region AR1, there are formed the gate insulation film 13, the control gate electrode 15, and the cap insulation film CP1 formed of the insulation film IF3 over the control gate electrode 15. Whereas, in the capacitive element formation region AR2, the electrode 16 is formed. Over a part of the top surface of the electrode 16, there is formed the cap insulation film CP1 formed of the insulation film IF3. Incidentally, after performing the step shown in FIG. 19, the same steps as the step shown in FIG. 20 and later steps can be performed in the same manner as after performing the step shown in FIG. 16.

Figure 20:
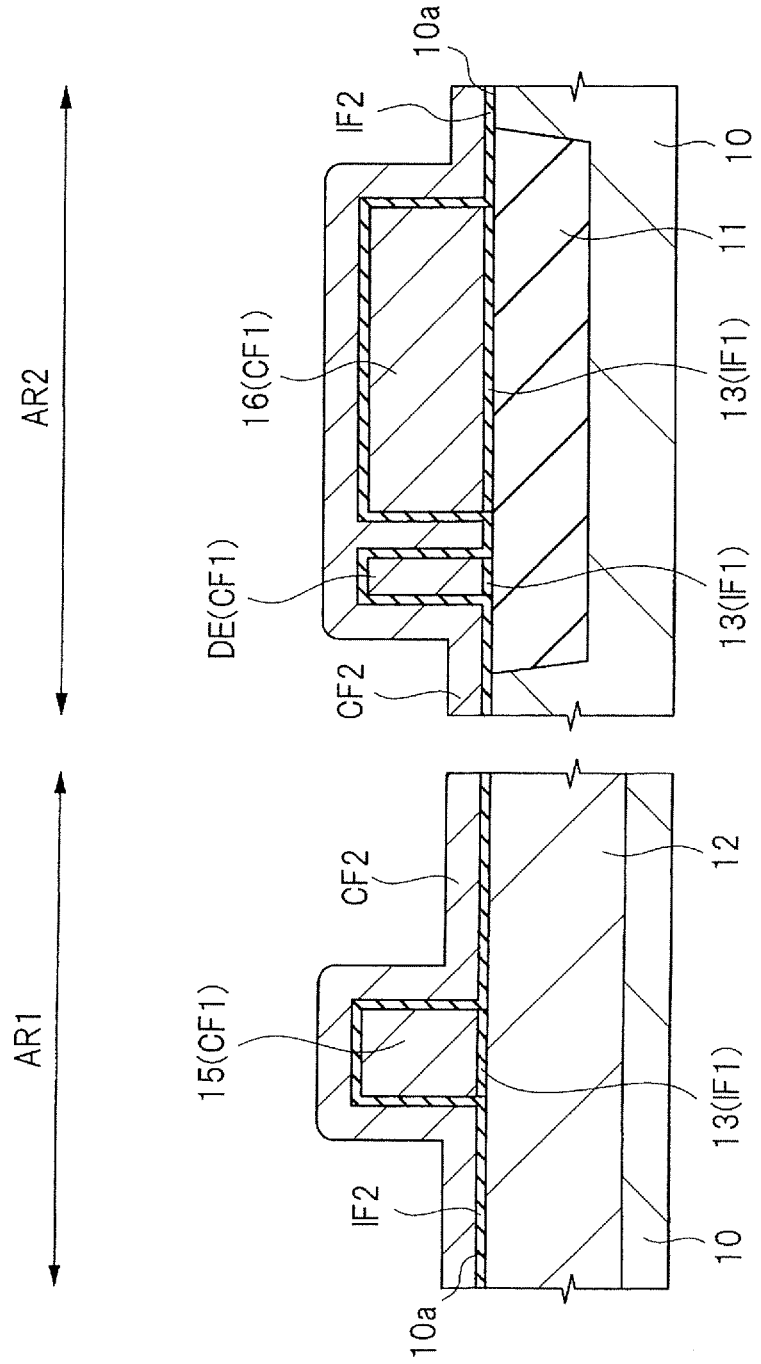
FIG. 20 is a cross sectional view of the semiconductor device during a manufacturing step in First Embodiment.
Figure 21:
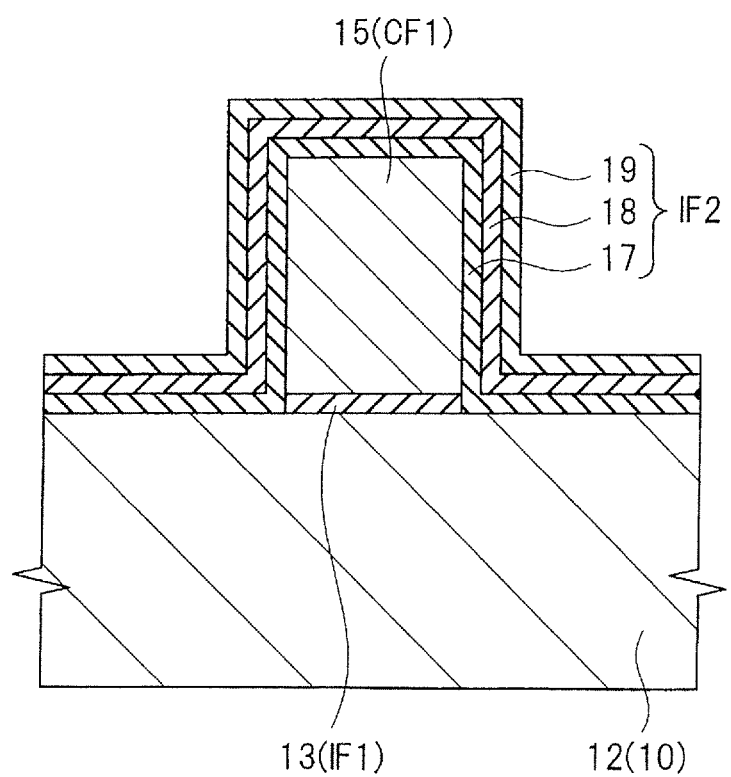
FIG. 21 is a cross sectional view of the semiconductor device during a manufacturing step in First Embodiment.

Then, as shown in FIG. 20, in the memory cell formation region AR1 and the capacitive element formation region AR2, an insulation film IF2 is formed over the semiconductor substrate 10 including the surface of the control gate electrode 15, the surface of the electrode 16, and the surface of the dummy electrode DE. In FIG. 20, the insulation film IF2 is shown as a one-layer film. However, as shown on an enlarged scale in FIG. 21, the insulation film IF2 is formed of, for example, a silicon oxide film 17, a silicon nitride film 18 over the silicon oxide film 17, and a silicon oxide film 19 formed over the silicon nitride film 18, and is a so-called ONO film. The insulation film IF2 can be formed using, for example, a CVD method. Then, for example, the film thickness of the silicon oxide film 17 is 5 nm. The film thickness of the silicon nitride film 18 is 10 nm. The film thickness of the silicon oxide film 19 is 5 nm.

The silicon nitride film 18 of the insulation film IF2 is a film to be the charge accumulation film 25 of the memory transistor (see FIG. 13) in the memory cell formation region AR1. In the present First Embodiment, as the charge accumulation film 25, there is used the silicon nitride film 18. However, as the charge accumulation films 25, there may be used other insulation films having a trap level. For example, an aluminum oxide film (alumina film) can also be used as the charge accumulation film 25.

Then, as shown in FIG. 20, in the memory cell formation region AR1 and the capacitive element formation region AR2, the conductive film CF2 formed of, for example, a polysilicon film is formed over the insulation film IF2. The conductive film CF2 formed of a polysilicon film can be formed using, for example, a CVD method.

Figure 22:
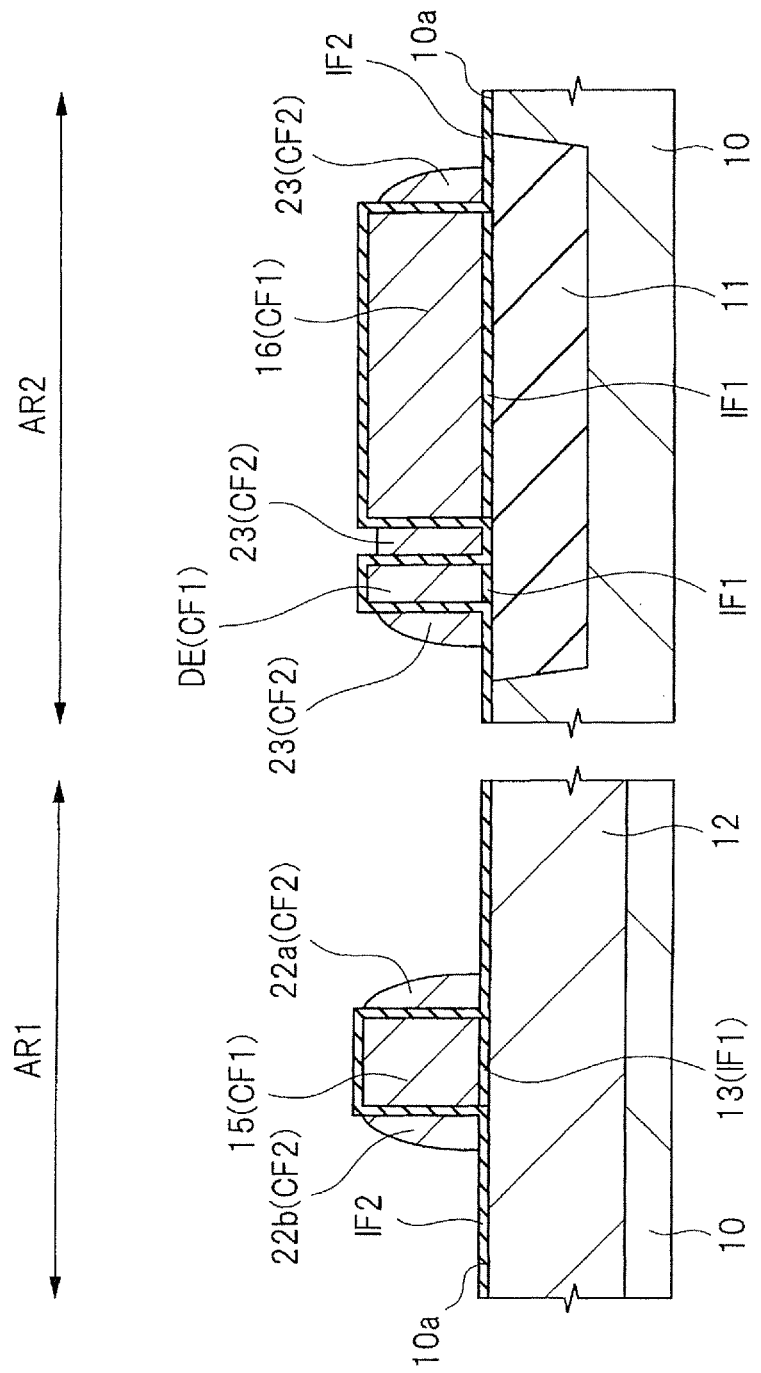
FIG. 22 is a cross sectional view of the semiconductor device during a manufacturing step in First Embodiment.

Then, as shown in FIG. 22, in the memory cell formation region AR1 and the capacitive element formation region AR2, the conductive film CF2 formed of, for example, a polysilicon film is etched back by anisotropic etching. As a result, in the memory cell formation region AR1, a sidewall 22a and a sidewall 22b each formed of the conductive film CF2 are left at the sidewalls, namely, the side surfaces on the opposite sides of the control gate electrode 15 via the insulation film IF2. On the other hand, in the capacitive element formation region AR2, the conductive film CF2 is integrally left between the electrode 16 and the dummy electrode DE, at the circumferential side surface of the electrode 16, and at the circumferential side surface of the dummy electrode DE via the insulation film IF2. Thus, the electrode 23 formed of the left conductive film CF2 is integrally formed. For this reason, the electrode 16 and the electrode 23 do not overlap with each other in plan view.

Herein, when the semiconductor device in the second modified example of First Embodiment is manufactured, after performing the step described by reference to FIG. 20, the following steps described by reference to FIGS. 23 and 24 can be performed in place of the step described by reference to FIG. 22.

Figure 23:
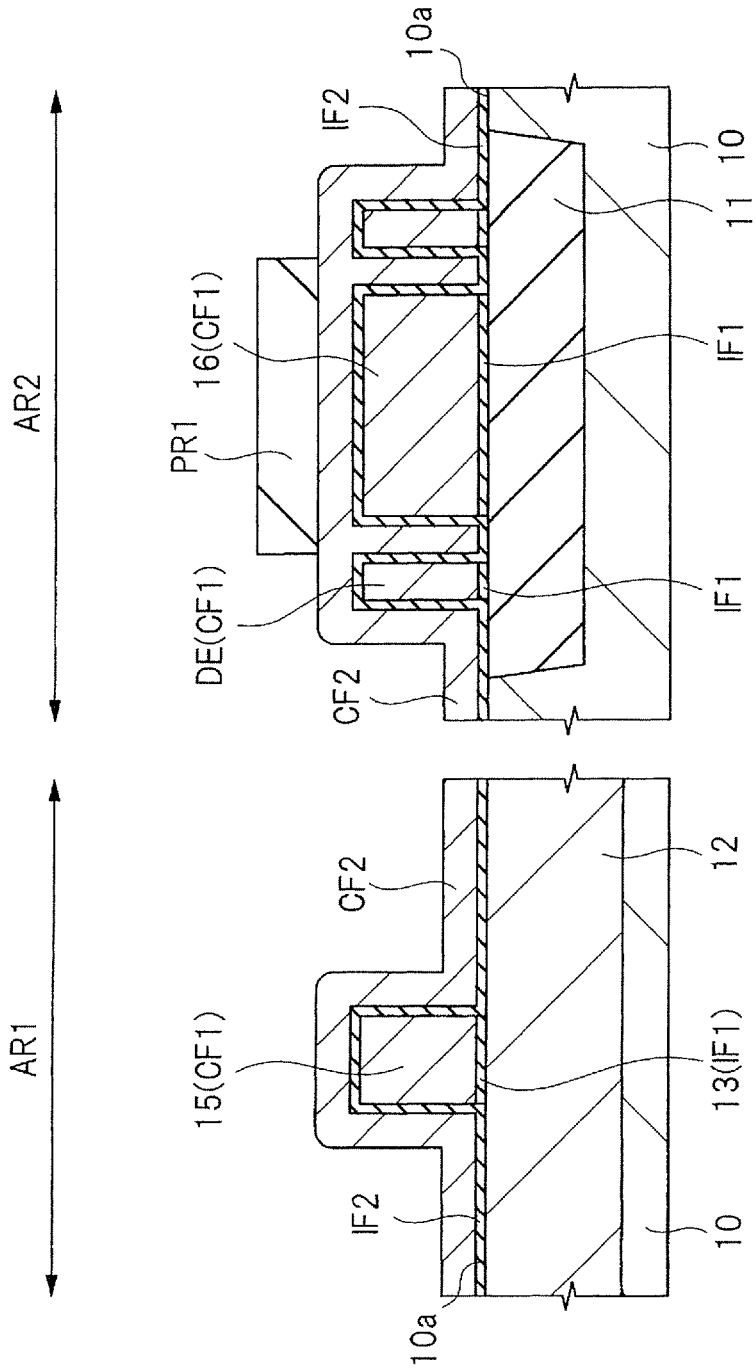
FIG. 23 is a cross sectional view of the semiconductor device during a manufacturing step in First Embodiment.

First, as shown in FIG. 23, after applying a resist film PR1 onto the semiconductor substrate 10, the resist film PR1 is subjected to an exposure/development treatment, thereby to be patterned. The patterning is performed so as to achieve the following: in the capacitive element formation region AR2, in the top surface of the electrode 16, in a region in which the electrode 23 is formed, the conductive film CF2 is covered with the resist film PR1; and in other regions, the conductive film CF2 is exposed.

Figure 24:
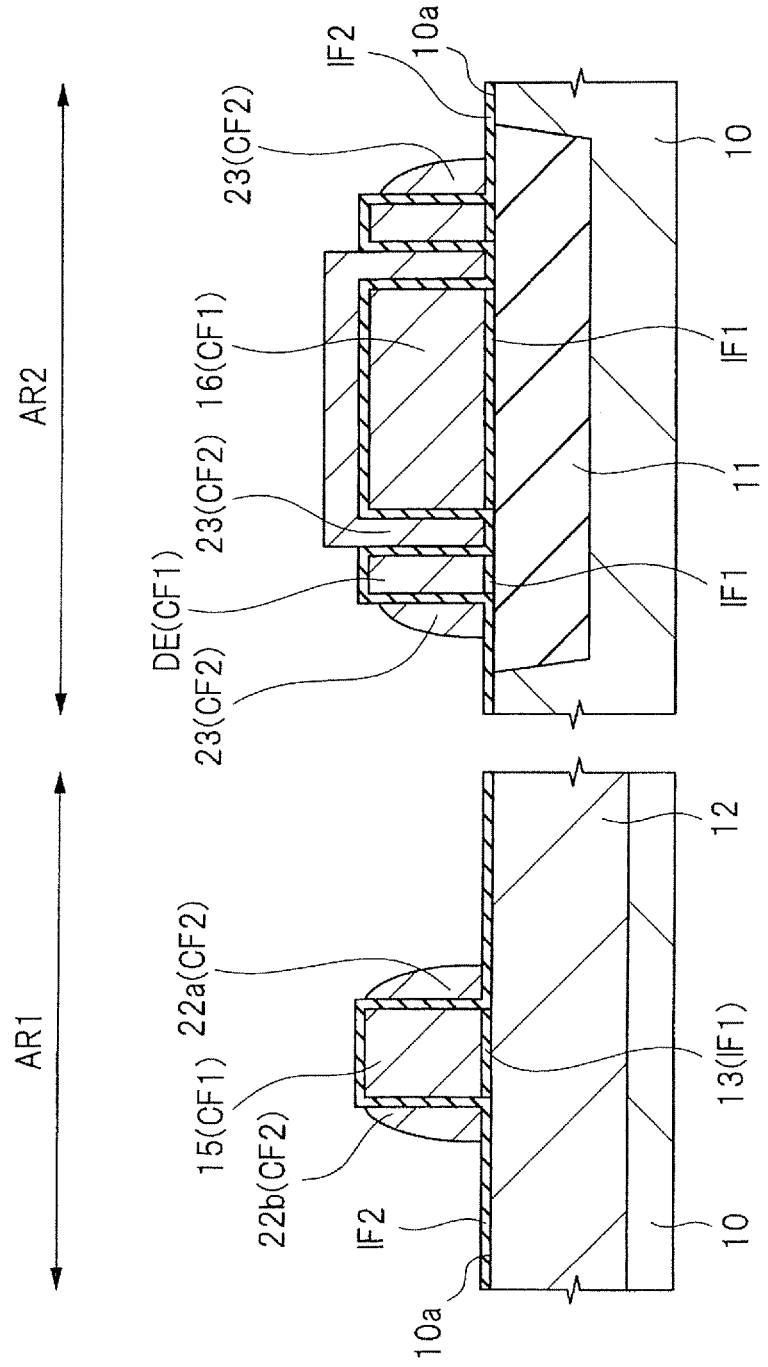
FIG. 24 is a cross sectional view of the semiconductor device during a manufacturing step in First Embodiment.

Then, as shown in FIG. 24, the conductive film CF2 formed of a polysilicon film is etched back by anisotropic etching. As a result, in the memory cell formation region AR1, at the sidewalls, namely, the side surfaces on the opposite sides of the control gate electrode 15, there are left a sidewall 22a and a sidewall 22b each formed of the conductive film CF2. On the other hand, in the capacitive element formation region AR2, the conductive film CF2 formed of, for example, a polysilicon film is anisotropically etched. As a result, between the electrode 16 and the dummy electrode DE, at the circumferential side surface of the electrode 16, and at the circumferential side surface of the dummy electrode DE, there is formed the electrode 23 formed of the integrally formed conductive film CF2. Whereas, in the capacitive element formation region AR2, using a resist film PR1 as a mask, the conductive film CF2 formed of a polysilicon film is etched. As a result, in a partial region of the top surface of the electrode 16, there is formed the electrode 23 via the insulation film IF2. At this step, in a partial region of the top surface of the electrode 16, the electrode 16 and the electrode 23 overlap each other in plan view. Then, the patterned resist film PR1 is removed. Incidentally, after performing the step shown in FIG. 24, the same steps as the step shown in FIG. 25 and later steps can be performed in the same manner as after performing the step shown in FIG. 22.

Figure 25:
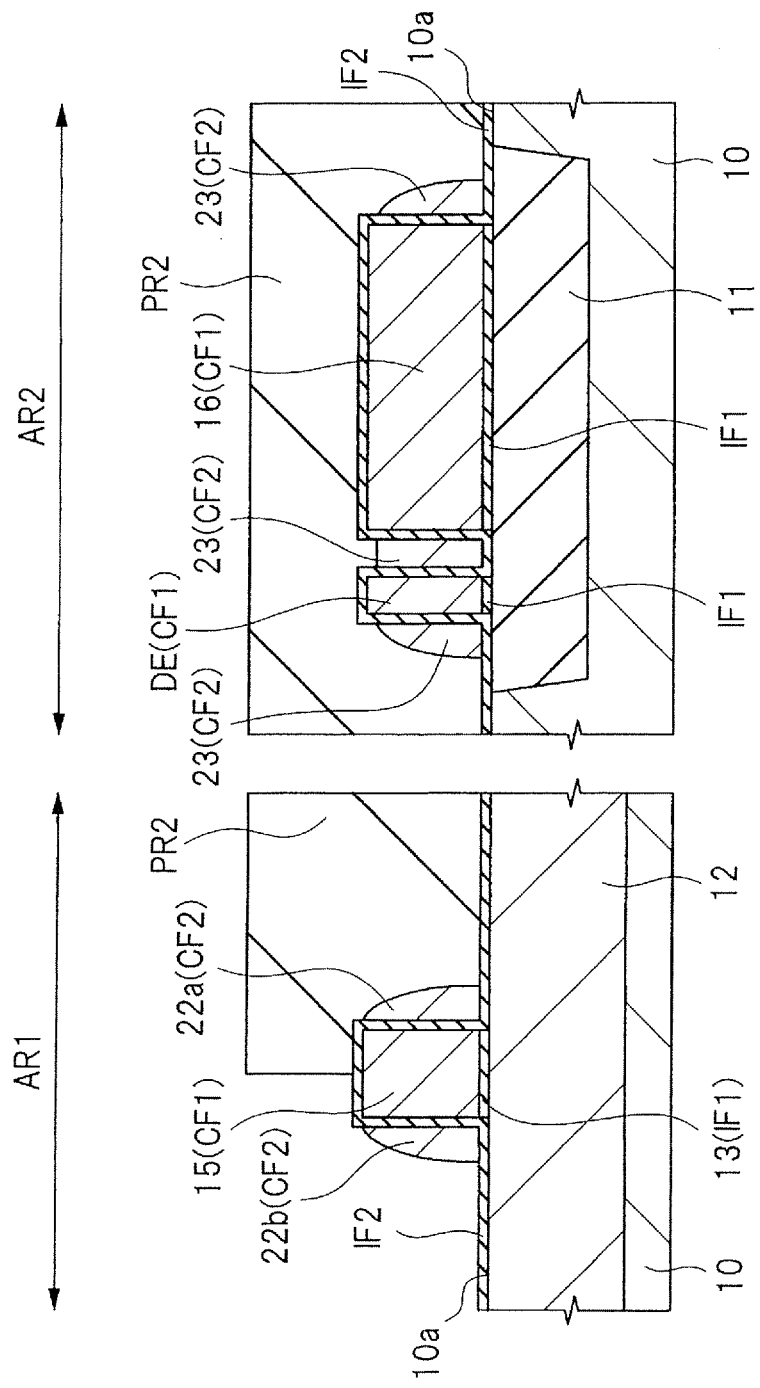
FIG. 25 is a cross sectional view of the semiconductor device during a manufacturing step in First Embodiment.

Then, as shown in FIG. 25, after applying a resist film PR2 onto the semiconductor substrate 10, the resist film PR2 is subjected to an exposure/development treatment. As a result, the resist film PR2 is patterned. The patterning is performed so as to achieve the following: while the capacitive element formation region AR2 is fully covered, the memory cell formation region AR1 is partially opened. Specifically, the patterning is performed so as to expose the sidewall 22b formed at the sidewall, namely, the side surface on one side of the control gate electrode 15 in the memory cell formation region AR1. For example, in FIG. 25, there is exposed the sidewall 22b formed at the sidewall on the left hand side of the control gate electrode 15.

Figure 26:
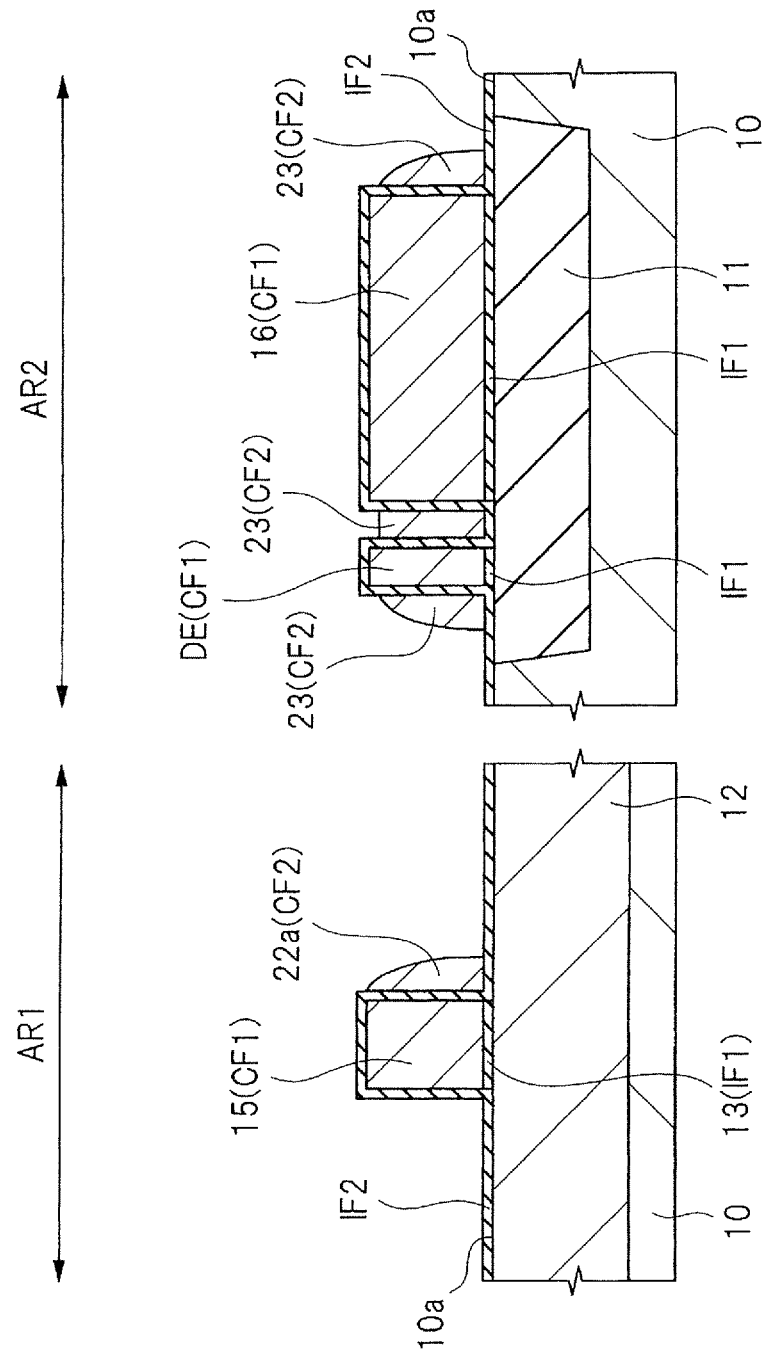
FIG. 26 is a cross sectional view of the semiconductor device during a manufacturing step in First Embodiment.

Then, as shown in FIG. 26, by etching using the patterned resist film PR2 as a mask, the sidewall 22b exposed at the sidewall on the left hand side of the control gate electrode 15 is removed. At this step, the sidewall 22a formed at the sidewall on the right hand side of the control gate electrode 15 is covered with the resist film PR2, and hence is left without being removed. The sidewall 22a is a portion to be a memory gate electrode 26 (see FIG. 27 described later). Further, also in the capacitive element formation region AR2, the electrode 23 is protected by the resist film PR2, and hence is left without being removed. Then, the patterned resist film PR2 is removed.

Figure 27:
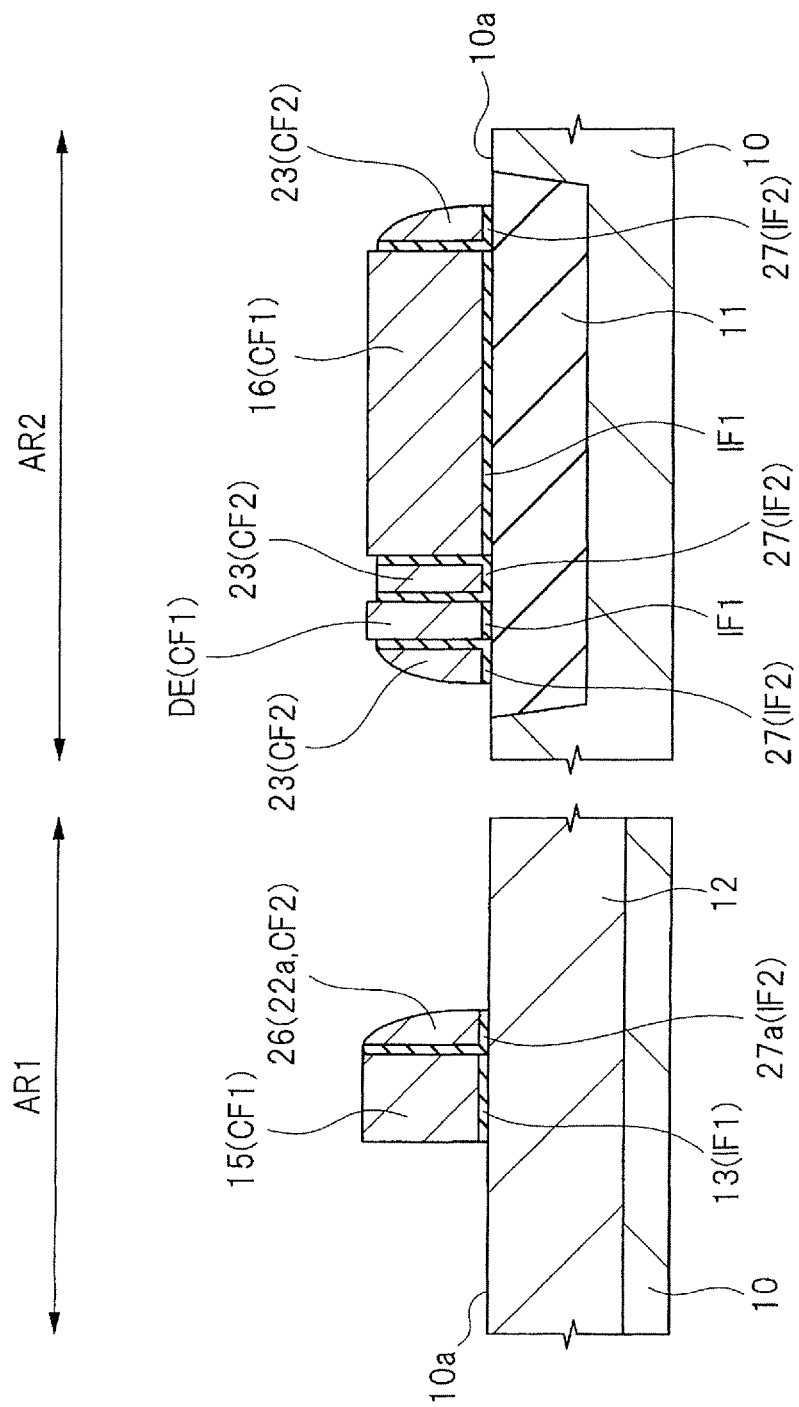
FIG. 27 is a cross sectional view of the semiconductor device during a manufacturing step in First Embodiment.

Subsequently, as shown in FIG. 27, in the memory cell formation region AR1 and the capacitive element formation region AR2, the exposed portions of the insulation film IF2, namely, the portions of the insulation film IF2 not covered with any of the electrode 23, and the sidewall 22a to be the memory gate electrode 26 are etched, and thereby removed. Namely, in the memory cell formation region AR1, the portions of the insulation film IF2 between the control gate electrode 15 and the memory gate electrode 26, and between the memory gate electrode 26 and the semiconductor substrate 10 are left, and other portions thereof are removed. Whereas, in the capacitive element formation region AR2, the portions of the insulation film IF2 between the electrode 16 and the electrode 23, between the dummy electrode DE and the electrode 23, and between the electrode 23 and the semiconductor substrate 10 are left, and other portions thereof are removed.

Thus, in the memory cell formation region AR1, only at the sidewall, namely, the side surface on the right hand side of the control gate electrode 15, there is left the sidewall 22a formed of the conductive film CF2 via the insulation film IF2, resulting in the formation of the sidewall-shaped memory gate electrode 26. Whereas, the portion between the control gate electrode 15 and the memory gate electrode 26, and the portion between the memory gate electrode 26 and the semiconductor substrate 10 of the insulation film IF2 are left. The left insulation film IF2 becomes an insulation film 27a. At this step, in the insulation film 27a, the silicon nitride film 18 forming the insulation film 27a (see FIG. 21) becomes the charge accumulation film 25 (see FIG. 13).

On the other hand, in the capacitive element formation region AR2, the portion between the electrode 16 and the electrode 23, the portion between the dummy electrode DE and the electrode 23, and the portion between the electrode 23 and the semiconductor substrate 10 of the insulation film IF2 are left. The left insulation film IF2 becomes a capacitive insulation film 27. The capacitive insulation film 27 is formed of the silicon oxide film 17, the silicon nitride film 18, and the silicon oxide film 19 (see FIG. 21). Then, the electrode 16, the electrode 23, and the capacitive insulation film 27 form a capacitive element.

Incidentally, at this point in time, the conductive film CF1 is formed of a polysilicon film. Accordingly, the memory gate electrode 26 of the memory cell and the electrode 23 of the capacitive element are each formed of a polysilicon film.

Figure 28:
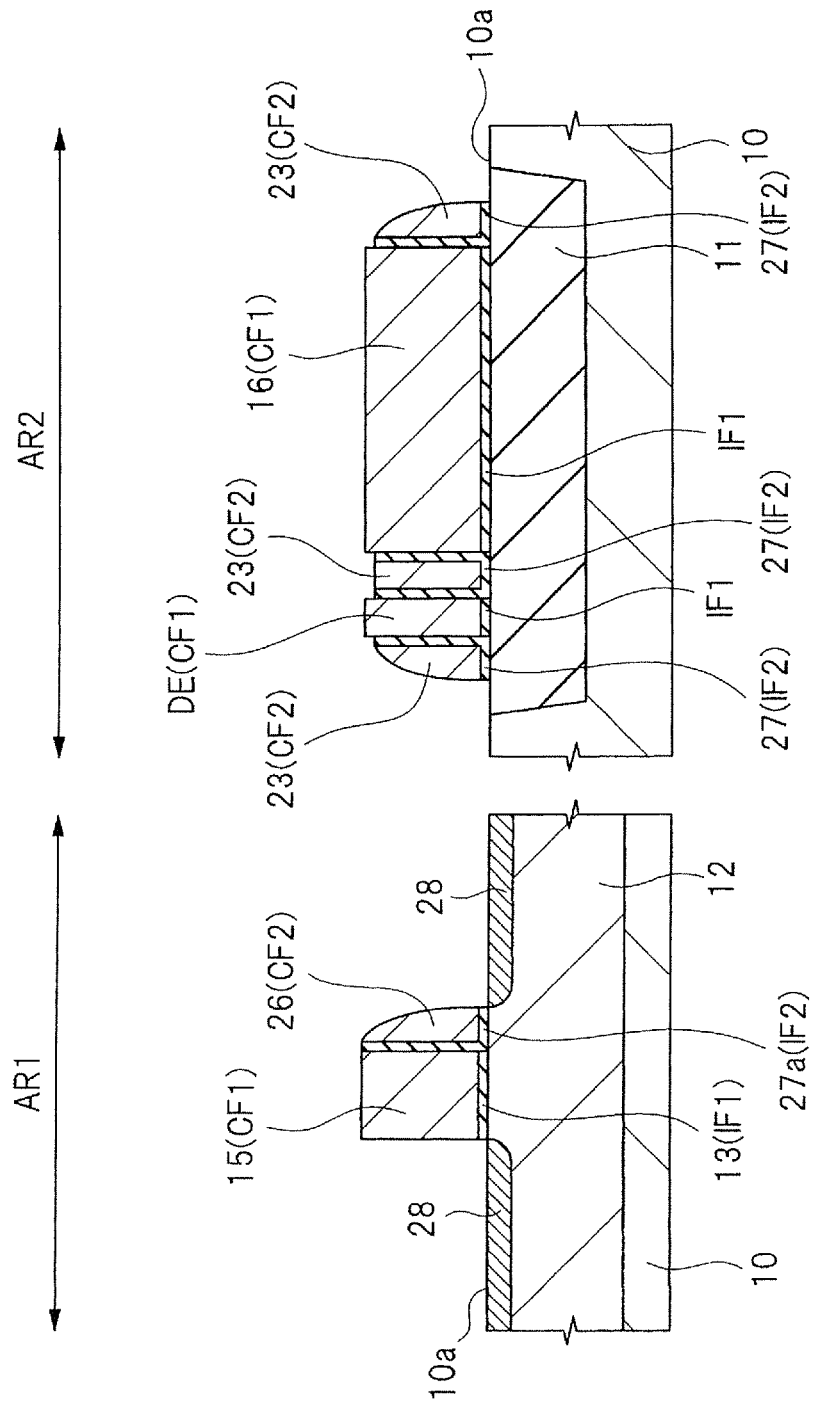
FIG. 28 is a cross sectional view of the semiconductor device during a manufacturing step in First Embodiment.

Then, as shown in FIG. 28, by using a photolithography technology and an ion implantation method, in the memory cell formation region AR1, there is formed a shallow low density impurity diffusion region 28 in alignment with the control gate electrode 15 and the memory gate electrode 26. The shallow low density impurity diffusion region 28 is an n type semiconductor region doped with n type impurities such as phosphorus or arsenic.

Figure 29:
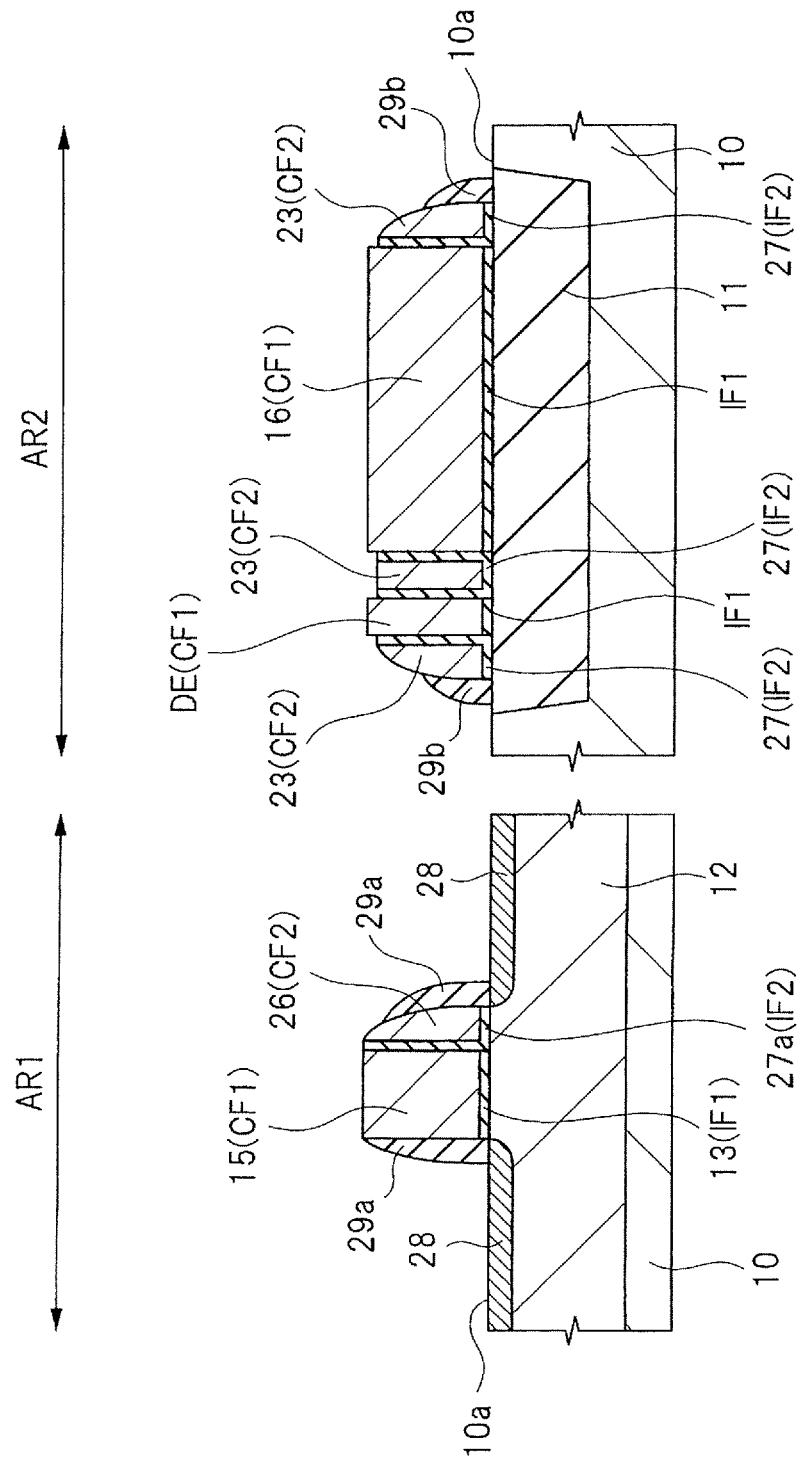
FIG. 29 is a cross sectional view of the semiconductor device during a manufacturing step in First Embodiment.

Subsequently, as shown in FIG. 29, over the semiconductor substrate 10, there is formed an insulation film formed of a silicon oxide film. The insulation film formed of a silicon oxide film can be formed using, for example, a CVD method. Then, the insulation film is anisotropically etched, thereby to form sidewalls 29a and 29b. In the memory cell formation region AR1, at the sidewall, namely, the side surface on the left hand side of the control gate electrode 15, and at the sidewall, namely, the side surface on the right hand side of the memory gate electrode 26, there are formed sidewalls 29a formed of an insulation film. On the other hand, in the capacitive element formation region AR2, at the sidewall, namely, the side surface of the electrode 23, there is formed a sidewall 29b formed of an insulation film. Each insulation film forming the sidewalls 29a and 29b was formed of a monolayer film of a silicon oxide film. However, the insulation film is not limited thereto, and may be formed of a lamination film of, for example, a silicon nitride film and a silicon oxide film.

Herein, when the semiconductor device in the second modified example of First Embodiment is manufactured, in the step described by reference to FIG. 29, in the capacitive element formation region AR2, at the sidewall of the portion of the electrode 23 formed at the top surface of the electrode 16, there is formed a sidewall 29c (see FIG. 8).

Figure 30:
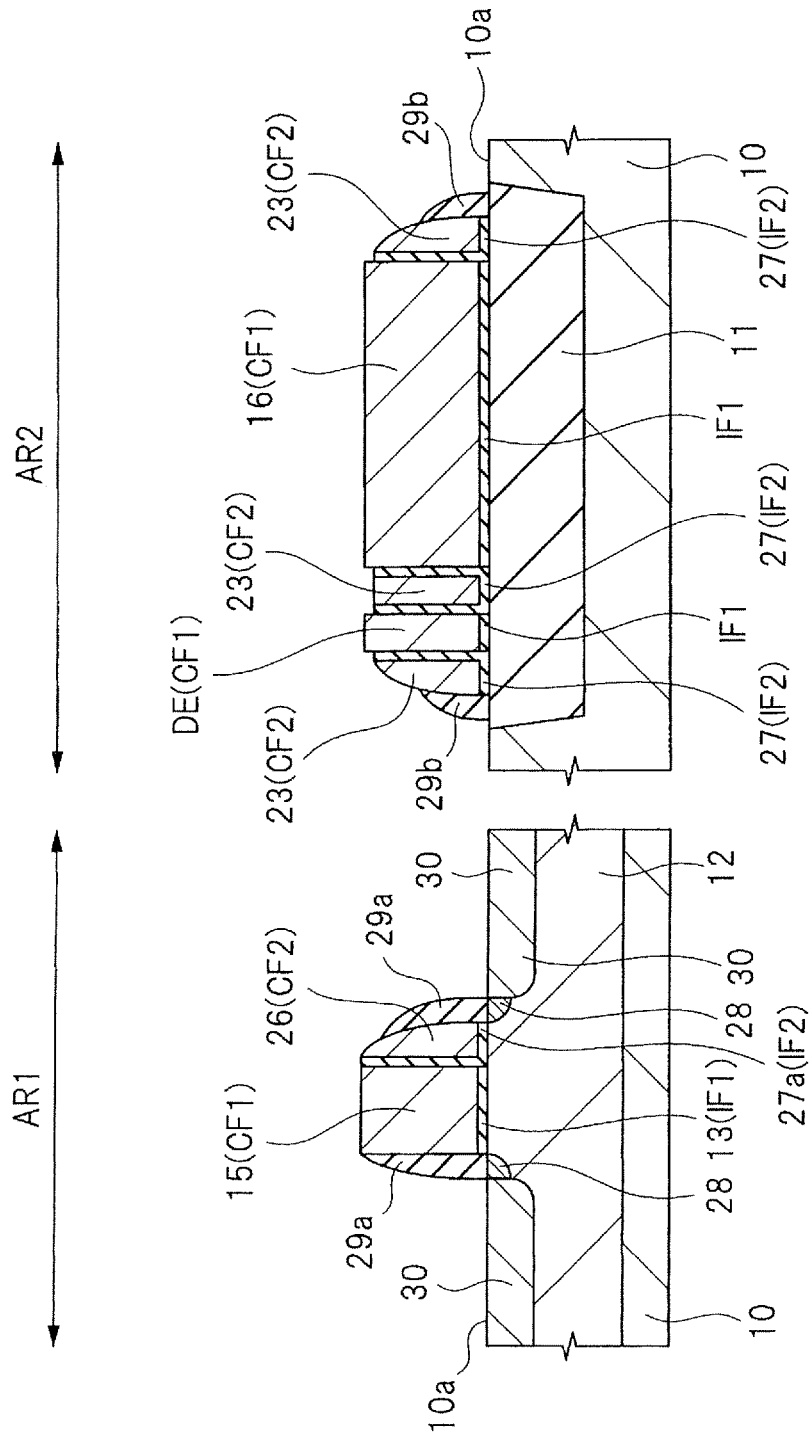
FIG. 30 is a cross sectional view of the semiconductor device during a manufacturing step in First Embodiment.

Then, as shown in FIG. 30, by using a photolithography technology and an ion implantation method, in the memory cell formation region AR1, there is formed a deep high density impurity diffusion region 30 in alignment with the sidewall 29a. The deep high density impurity diffusion region 30 is an n type semiconductor region doped with n type impurities such as phosphorus or arsenic. The deep high density impurity diffusion region 30 and the shallow low density impurity diffusion region 28 form the source region and the drain region of the memory cell. Thus, the source region and the drain region are each formed of the shallow low density impurity diffusion region 28 and the deep high density impurity diffusion region 30. As a result, the source region and the drain region can be formed in a LDD structure. After thus forming the high density impurity diffusion region 30, a heat treatment at about 1000° C. is performed. As a result, the doped impurities are activated.

Figure 31:
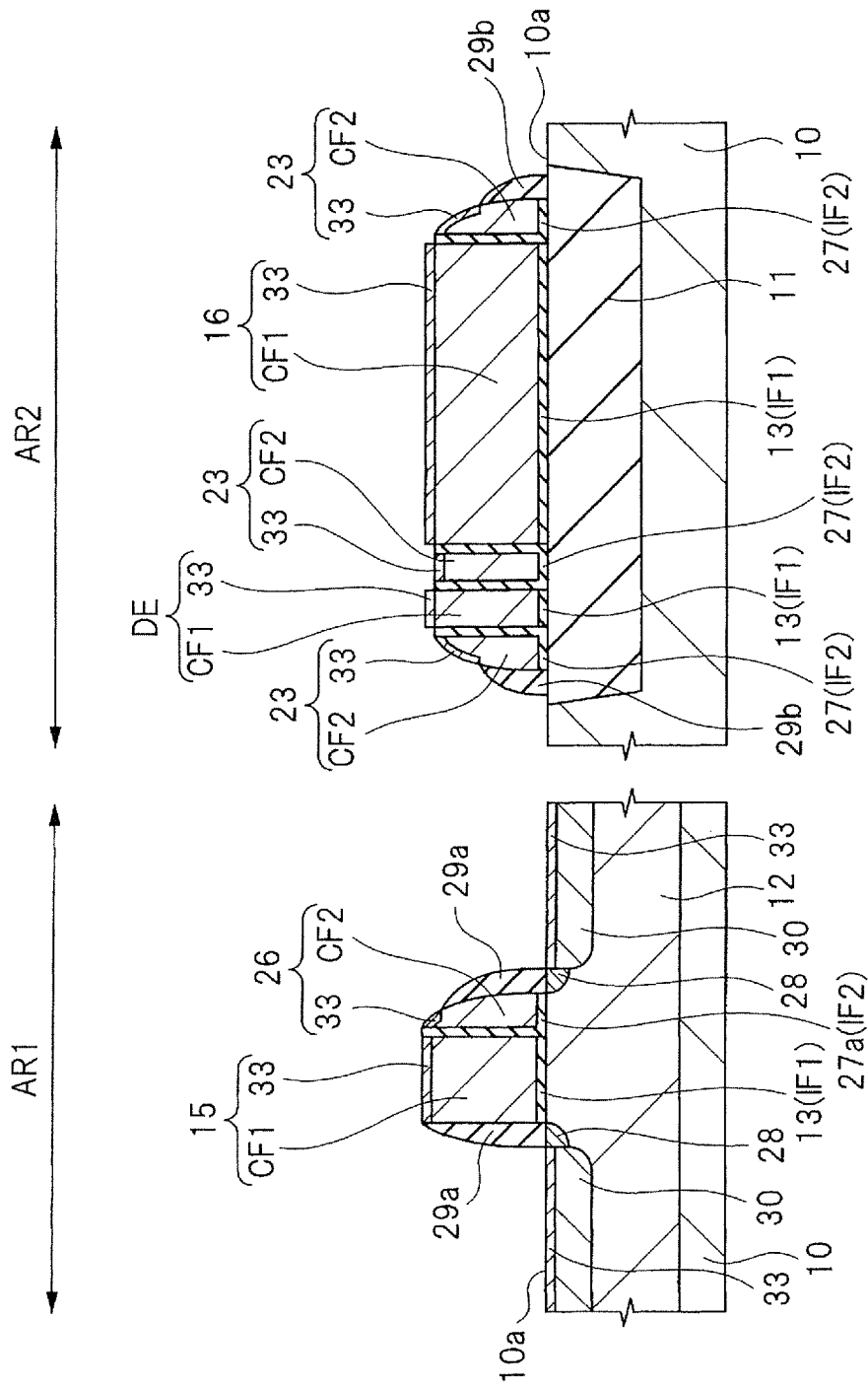
FIG. 31 is a cross sectional view of the semiconductor device during a manufacturing step in First Embodiment.

Then, as shown in FIG. 31, at the surfaces of the control gate electrode 15, the memory gate electrode 26, the electrode 16, the electrode 23, the dummy electrode DE, and the high density impurity diffusion regions 30 as the source region and the drain region, there are formed metal silicide films 33.

First, in the memory cell formation region AR1 and the capacitive element formation region AR2, a metal film formed of, for example, a cobalt film is formed over the semiconductor substrate 10. At this step, in the memory cell formation region AR1, the metal films are formed in such a manner as to be in direct contact with the exposed control gate electrode 15 and memory gate electrode 26. Similarly, the metal film is also in direct contact with the deep high density impurity diffusion region 30. On the other hand, in the capacitive element formation region AR2, the metal films are in direct contact with a part of the electrode 16 and a part of the electrode 23. The metal film formed of, for example, a cobalt film can be formed using, for example, a sputtering method. The film thickness of the metal film is, for example, 10 nm.

Then, a first heat treatment is performed on the semiconductor substrate 10. Then, the surface of the semiconductor substrate 10 is cleaned. The cleaning is performed by APM (Ammonium hydroxide hydrogen Peroxide Mixture cleaning) cleaning and HPM cleaning. The APM cleaning is cleaning with a mixed chemical including ammonium hydroxide ($NH_4OH$)/hydrogen peroxide ($H_2O_2$)/pure water ($H_2O$), and having a large effect of removing particles or organic substances. On the other hand, the HPM cleaning is cleaning with a mixed chemical including hydrochloric acid (HCl)/hydrogen peroxide ($H_2O_2$)/pure water ($H_2O$), and having a large effect of removing metals. Subsequently, after cleaning, a second heat treatment is performed.

As a result, as shown in FIG. 31, in the memory cell formation region AR1, at the surface of the control gate electrode 15, and the surface of the memory gate electrode 26, the conductive films CF1 and CF2 formed of a polysilicon film, and the metal films formed of a cobalt film react with each other, resulting in the formation of the metal silicide films 33 formed of a cobalt silicide film. As a result, the control gate electrode 15 is formed in a lamination structure of the conductive film CF1 formed of a polysilicon film and the metal silicide film 33 formed of a cobalt silicide film. Whereas, the memory gate electrode 26 is formed in a lamination structure of the conductive film CF2 formed of a polysilicon film, and the metal silicide film 33 formed of a cobalt silicide film. The metal silicide film 33 formed of a cobalt silicide film is formed for reducing the resistances of the control gate electrode 15 and the memory gate electrode 26. Further, the gate insulation film 13, the control gate electrode 15, the memory gate electrode 26, and the insulation film 27a form the memory cell.

Similarly, by the heat treatment, also at the surface of the high density impurity diffusion region 30, the high density impurity diffusion region 30 formed of silicon and the metal film formed of a cobalt film react with each other, resulting in the formation of the metal silicide film 33 formed of a cobalt silicide film. For this reason, also in the high density impurity diffusion region 30, a lower resistance can be achieved.

On the other hand, in the capacitive element formation region AR2, at the surface of the electrode 16, the surface of the dummy electrode DE, and the surface of the electrode 23, the conductive films CF1 and CF2 formed of a polysilicon film, and the metal films formed of a cobalt film react with each other, resulting in the formation of the metal silicide films 33 formed of a cobalt silicide film. As a result, the electrode 16 and the dummy electrode DE are each formed in a lamination structure of the conductive film CF1 formed of a polysilicon film, and the metal silicide film 33 formed of a cobalt silicide film. Whereas, the electrode 23 is formed in a lamination structure of the conductive film CF2 formed of polysilicon film, and the metal silicide film 33 formed of a cobalt silicide film. The metal silicide film 33 formed of a cobalt silicide film is formed for reducing the resistances of the electrode 16, the dummy electrode DE, and the electrode 23.

Then, the unreacted metal film is removed from over the semiconductor substrate 10. Incidentally, in the present First Embodiment, a description has been given to the example in which a cobalt silicide film is formed as the metal silicide film 33. However, it is also acceptable that, as the metal silicide film 33, for example, a nickel silicide film or a titanium silicide film is formed in place of the cobalt silicide film.

In the manner described up to this point, in the memory cell formation region AR1, the memory cell can be formed, and in the capacitive element formation region AR2, the capacitive element in the present First Embodiment can be formed.

Incidentally, when the semiconductor device in the third modified example of First Embodiment is manufactured, in the step described by reference to FIG. 31, as described previously by reference to FIG. 11, the metal silicide film 33 is not formed in the region of the top surface of the electrode 16 in which the cap insulation film CP1 is formed.

Then, the wiring step will be described by reference to FIG. 12. As shown in FIG. 12, over the front surface 10a of the semiconductor substrate 10, there is formed an interlayer insulation film 34. The interlayer insulation film 34 is formed of, for example, a silicon oxide film, and can be formed using a CVD method using, for example, TEOS (Tetra Ethyl Ortho Silicate) as a raw material. Then, the surface of the interlayer insulation film 34 is planarized using, for example, a CMP method.

Subsequently, using a photolithography technology and an etching technology, contact holes CH1, CH2, and CH4 are formed in the interlayer insulation film 34. At this step, in the memory cell formation region AR1, there is formed the contact hole CH4 penetrating through the interlayer insulation film 34, and reaching the source region or the drain region. Whereas, in the capacitive element formation region AR2, there are formed contact holes CH1 and CH2. The contact hole CH1 penetrates through the interlayer insulation film 34, and reaches the electrode 16. Further, the contact hole CH2 penetrates through the interlayer insulation film 34, and reaches the portion of the electrode 23 formed at the side surface of the dummy electrode DE opposite to the electrode 16 side.

Then, over the interlayer insulation film 34 including the bottom surfaces and the inner walls of the contact holes CH1, CH2, and CH4, there is formed a titanium/titanium nitride film. The titanium/titanium nitride film is formed of a lamination film of a titanium film and a titanium nitride film, and can be formed using, for example, a sputtering method. The titanium/titanium nitride film has a so-called barrier property of preventing the diffusion of, for example, tungsten which is a material for the film to be embedded in a later step into silicon.

Subsequently, a tungsten film as a conductive film is formed entirely over the front surface 10a of the semiconductor substrate 10 in such a manner as to fill the contact holes CH1, CH2, and CH4. The tungsten film can be formed using, for example, a CVD method. Then, the unnecessary portions of the titanium/titanium nitride film and the tungsten film formed over the interlayer insulation film 34 are removed by using, for example, a CMP method. As a result, plugs PG1, PG2, and PG4 can be formed.

Of these, in the capacitive element formation region AR2, the plugs PG1 and PG2 are formed. As the plug PG1, there is formed the plug PG1 formed of a conductive film embedded in the contact hole CH1, and electrically coupled with the electrode 16. As the plug PG2, there is formed the plug PG2 formed of a conductive film embedded in the contact hole CH2, and electrically coupled with the electrode 23. Incidentally, as the plug PG1, there is formed the plug PG1 in contact with the metal silicide film 33 formed over the surface of the electrode 16, and as the plug PG2, there is formed the plug PG2 in contact with the metal silicide film 33 formed over the electrode 23.

Then, over the interlayer insulation film 34, and the plugs PG1, PG2, and PG4, there are successively formed, for example, a titanium/titanium nitride film, an aluminum film containing copper, and a titanium/titanium nitride film. The films can be formed using, for example, a sputtering method. Subsequently, by using a photolithography technology and an etching technology, the films are patterned, thereby to form wires HL1, HL2, and HL4. The wire HL1 is electrically coupled with the plug PG1; the wire HL2 is electrically coupled with the plug PG2; and the wire HL4 is electrically coupled with the plug PG4. Further, at the overlying layer of the wire, a wire is formed. However, description herein is omitted. Thus, finally, the semiconductor device in the present First Embodiment can be formed.

<Regarding Coupling Between Electrode and Plug>

Figure 32:
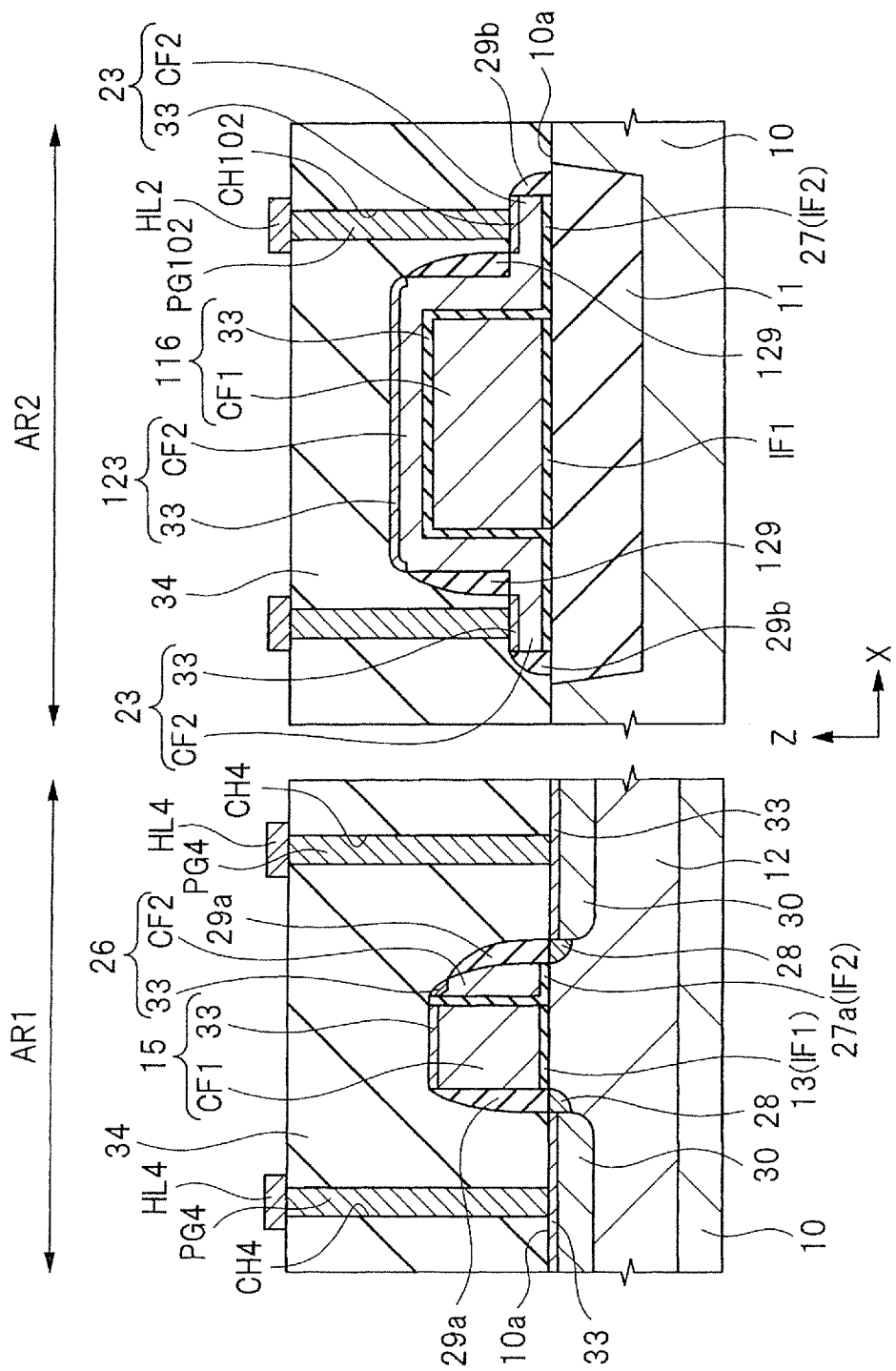
FIG. 32 is a cross sectional view showing a semiconductor device of Comparative Example 1.
Figure 33:
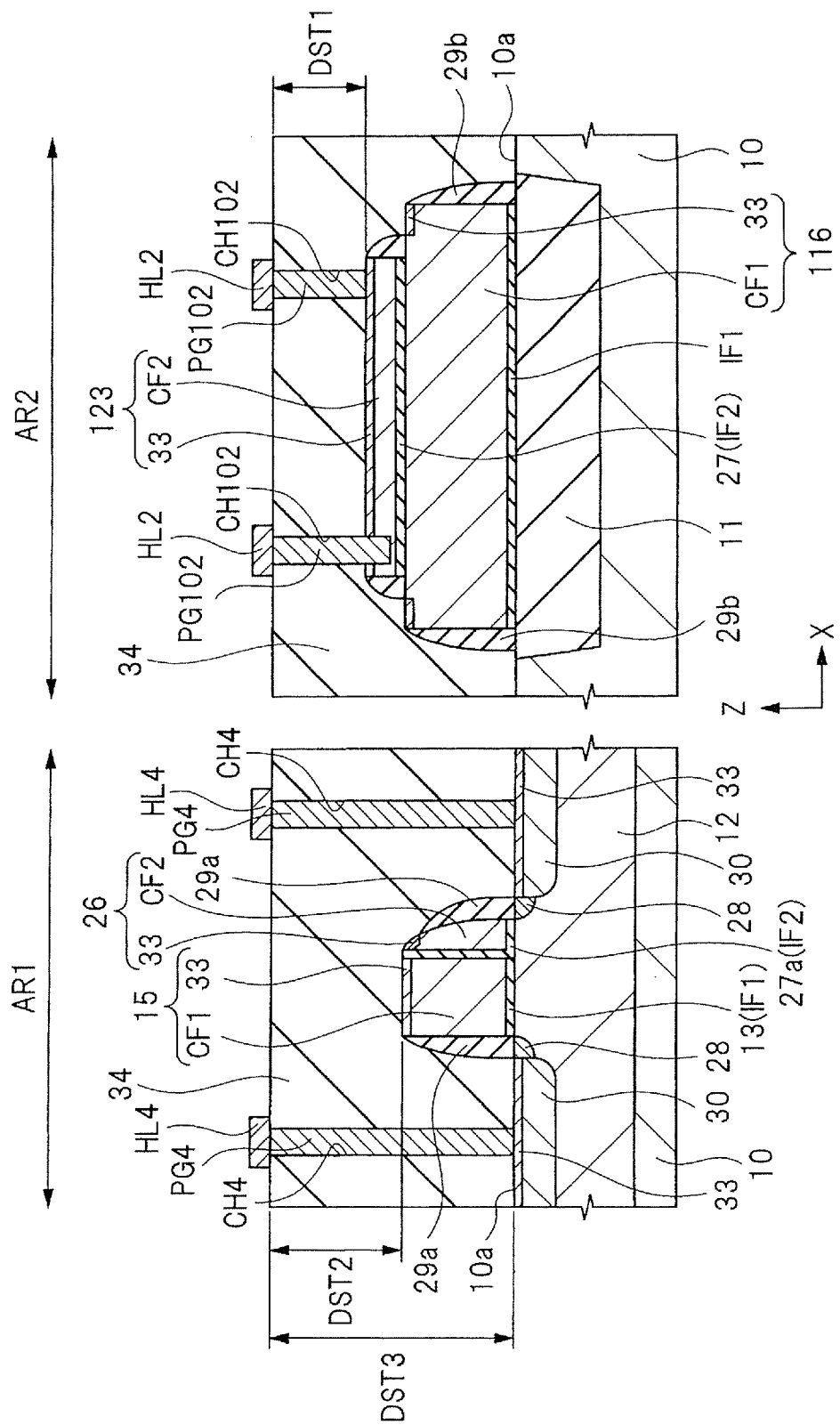
FIG. 33 is a cross sectional view showing a semiconductor device of Comparative Example 2.

Semiconductor devices of Comparative Example 1 and Comparative Example 2 will be described by reference to the accompanying drawings. FIG. 32 is a cross sectional view showing the semiconductor device of Comparative Example 1. FIG. 33 is a cross sectional view showing the semiconductor device of Comparative Example 2. FIGS. 32 and 33 are each a cross sectional view showing the structure of the memory cell of the flash memory, and the structure of the capacitive element formed in an analog circuit or the like.

In the semiconductor device of Comparative Example 1, respective portions in the memory cell formation region AR1, and respective portions other than a lower electrode 116, an upper electrode 123, a contact hole CH102 and a plug PG102 in the capacitive element formation region AR2 are the same as respective portions of the semiconductor device of First Embodiment. Whereas, in the semiconductor device of Comparative Example 2, respective portions in the memory cell formation region AR1, and respective portions other than the lower electrode 116, the upper electrode 123, the contact hole CH102, and the plug PG102 in the capacitive element formation region AR2 are the same as respective portions of the semiconductor device of First Embodiment.

In the semiconductor device of Comparative Example 1, although not shown, in plan view, the lower electrode 116 and the upper electrode 123 have different rectangular shapes, and have an overlapping region in which the lower electrode 116 and the upper electrode 123 overlap each other in plan view, and a non-overlapping region in which the lower electrode 116 and the upper electrode 123 do not overlap each other in plan view. Namely, in the X axis direction of FIG. 32, the length of the lower electrode 116 is shorter than the length of the upper electrode 123. In the Y axis direction crossing with the X axis direction (the direction perpendicular to the paper plane of FIG. 32), the length of the lower electrode 116 is longer than the length of the upper electrode 123. In the thus configured overlapping region in which the lower electrode 116 and the upper electrode 123 overlap each other in plan view, a capacitive element is formed. Then, in the non-overlapping region of the lower electrode 116, there is formed a plug (not shown) electrically coupled with the lower electrode 116. Whereas, in the non-overlapping region of the upper electrode 123, there is formed a contact hole CH102 penetrating through the interlayer insulation film 34, and reaching the upper electrode 123, and there is formed a plug PG102 formed of a conductive film embedded in the contact hole CH102, and electrically coupled with the upper electrode 123.

As shown in FIG. 32, the lower electrode 116 is formed of a conductive film CF1 formed of a polysilicon film and a metal silicide film 33 formed over the surface of the conductive film CF1. On the other hand, at the sidewall of the step region of the upper electrode 123, there is formed a sidewall 129 formed of an insulation film. Over the surface of the step region of the upper electrode 123, the metal silicide film 33 is not formed. For this reason, the upper electrode 123 in the step region has a high resistance. Thus, the plug PG102 formed in the non-overlapping region of the upper electrode 123 cannot be electrically coupled with the overlapping region of the upper electrode 123 at a low resistance. Accordingly, the plug PG102 and the upper electrode 123 cannot be electrically coupled with each other at a low resistance.

On the other hand, in the semiconductor device of Comparative Example 2, in plan view, the lower electrode 116 and the upper electrode 123 have different rectangular shapes. However, in plan view, the upper electrode 123 is formed in such a manner as to be included in the region in which the lower electrode 116 is formed. The upper electrode 123 overlaps the lower electrode 116 throughout the entire surface in plan view. For this reason, in the semiconductor device of Comparative Example 2, the lower electrode 116 has an overlapping region in which the lower electrode 116 and the upper electrode 123 overlap each other in plan view, and a non-overlapping region in which the lower electrode 116 and the upper electrode 123 do not overlap each other in plan view. Then, the plug (not shown) electrically coupled with the lower electrode 116 is formed in the non-overlapping region of the lower electrode 116. Whereas, the plug PG102 to be electrically coupled with the upper electrode 123 is formed in the overlapping region of the lower electrode 116. Further, a metal silicide film 33 is formed entirely over the surface of the upper electrode 123. Accordingly, the plug PG102 and the upper electrode 123 can be electrically coupled with each other at a low resistance.

However, in the semiconductor device of Comparative Example 2, the thickness of the capacitive element becomes the total of the thickness of the lower electrode 116, the thickness of the capacitive insulation film 27, and the thickness of the upper electrode 123. Whereas, the thickness of the conductive film CF1 forming the lower electrode 116 is equal to the thickness of the conductive film CF1 forming the control gate electrode 15. For this reason, the height position of the top surface of the upper electrode 123 of the capacitive element is higher than, for example, the height position of the top surface of the control gate electrode 15 in the memory cell, and is higher than the height position of the top surface of the source region or the drain region in the memory cell. Namely, the distance DST1 in the thickness direction between the bottom surface of the wire HL2 over the capacitive element and the top surface of the upper electrode 123 of the capacitive element is shorter than the distance DST2 in the thickness direction between the bottom surface of the wire HL4 over the memory cell and the top surface of the control gate electrode 15, and is shorter than the distance DST3 in the thickness direction between the bottom surface of the wire HL4 and the top surface of the source region or the drain region.

Therefore, when the contact hole CH4 penetrating through the interlayer insulation film 34, and reaching the source region or the drain region, and the contact hole CH102 penetrating through the interlayer insulation film 34, and reaching the top surface of the upper electrode 123 are formed in the same step, the contact hole CH102 may penetrate through the upper electrode 123 and the capacitive insulation film 27 to reach the lower electrode 116. In such a case, the plug PG102 formed of a conductive film embedded in the contact hole CH102 may cause a short circuit between the upper electrode 123 and the lower electrode 116, resulting in the reduction of the performance of the semiconductor device.

Further, when the height between the top surface of the semiconductor substrate 10 and the bottom surface of the wire HL2 or HL4 is reduced with miniaturization of a semiconductor device, the ratio of reduction of the distance in the thickness direction between the bottom surface of the wire HL2 and the top surface of the upper electrode 123 is larger than the ratio of reduction of the distance in the thickness direction between the bottom surface of the wire HL4 and the top surface of the source region or the drain region. This results in a still larger possibility that the plug PG102 formed of a conductive film embedded in the contact hole CH102 causes a short circuit between the upper electrode 123 and the lower electrode 116. Accordingly, the performance of the semiconductor device is further reduced.

<Main Feature and Effect of the Present Embodiment>

On the other hand, in the present First Embodiment, the contact hole CH2 penetrates through the interlayer insulation film. 34, and reaches the portion of the electrode 23 formed at the side surface of the dummy electrode DE opposite to the electrode 16 side. Further, in the present First Embodiment, the plug PG2 formed of a conductive film embedded in the contact hole CH2 penetrates through the interlayer insulation film 34, and is electrically directly coupled with the portion of the electrode 23 formed at the side surface of the dummy electrode DE opposite to the electrode 16 side. At the portion of the electrode 23 on the side of the dummy electrode DE opposite to the electrode 16 side, there is formed the electrode 23 as the sidewall with the dummy electrode DE as the core part. With such a configuration, the plug PG2 can be electrically coupled with any portion of the electrode 23 via the metal silicide film 33 formed at the surface of the electrode 23, and having a relatively smaller electric resistance. For this reason, the plug PG2 can be electrically coupled with any portion of the electrode 23 at a low resistance.

Whereas, in the present First Embodiment, the portion of the electrode 23 formed at the side surface of the dummy electrode DE opposite to the electrode 16 side does not overlap the electrode 16 in plan view. Therefore, the contact hole CH2 does not penetrate through the interlayer insulation film 34, the electrode 23, and the capacitive insulation film 27 to reach the electrode 16. Thus, the plug PG2 formed of a conductive film embedded in the contact hole CH2 does not cause a short circuit between the electrode 23 and the electrode 16. Accordingly, the performance of the semiconductor device can be improved.

Incidentally, as shown in FIG. 8, in the second modified example of First Embodiment, at the side surface of the portion of the electrode 23 formed over the top surface of the electrode 16, there is formed a sidewall 29c formed of an insulation film. However, as compared with the height of the side surface at which a sidewall 129 formed of an insulation film is formed in the step region of the upper electrode 123 in Comparative Example 1 as shown in FIG. 32, the height of the side surface at which the sidewall 29c is formed in the second modified example of First Embodiment is smaller. For this reason, as compared with the case where the plug PG102 and the upper electrode 123 cannot be electrically coupled with each other at a low resistance, in the second modified example of First Embodiment, the plug PG2 and the electrode 23 can be electrically coupled with each other at a lower resistance.

Second Embodiment

In First Embodiment, there has been shown the example where the dummy electrode DE is formed, and the plug PG2 is electrically coupled with the portion of the electrode 23 formed at the side surface of the dummy electrode DE (see FIG. 3). On the other hand, in Second Embodiment, a description will be given to an example where the dummy electrode DE is not formed, and an opening OP2 is formed in the electrode 16, so that the plug PG2 is electrically coupled with the electrode 23 formed in the inside of the opening OP2 formed in the electrode 16 (see FIG. 35 described later).

Figure 34:
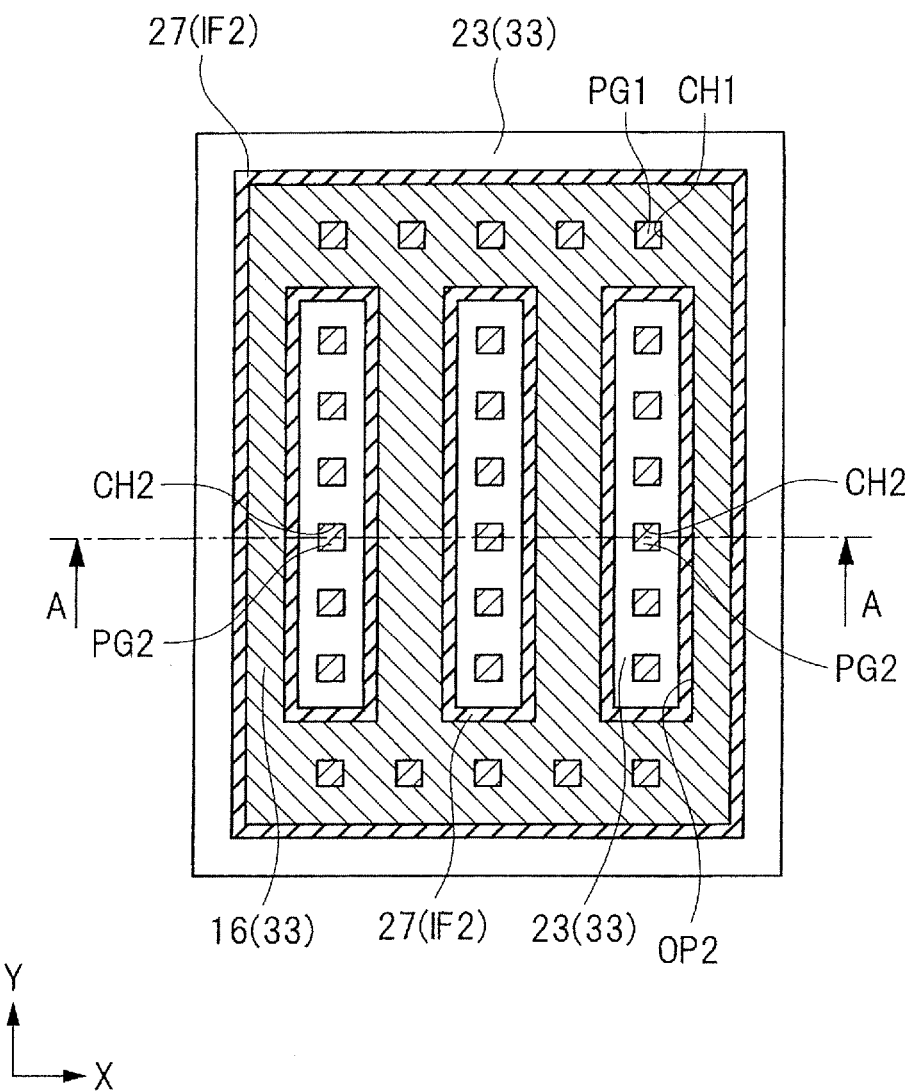
FIG. 34 is a plan view showing a capacitive element in Second Embodiment.
Figure 35:
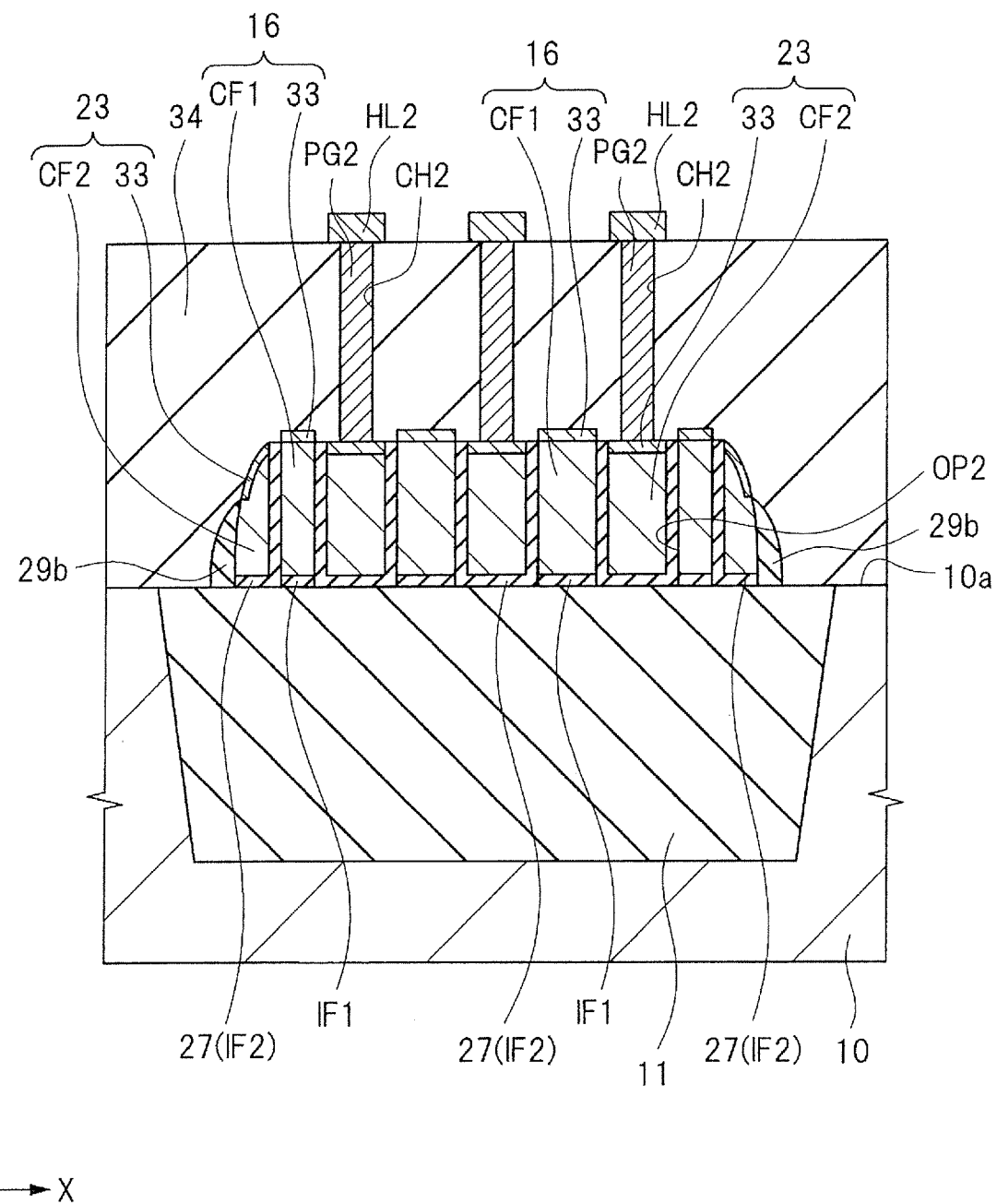
FIG. 35 is a cross sectional view showing the capacitive element in Second Embodiment.

FIG. 34 is a plan view showing the capacitive element in Second Embodiment. FIG. 35 is a cross sectional view showing the capacitive element in Second Embodiment. FIG. 35 is a cross sectional view along line A-A of FIG. 34. As shown in FIGS. 34 and 35, the semiconductor device of the present Second Embodiment can be set equal to the semiconductor device of First Embodiment except for the arrangement of the electrode 16, the electrode 23, the plug PG1, and the plug PG2.

As shown in FIGS. 34 and 35, the semiconductor device has the electrode 16 formed of a conductive film CF1 formed over the element isolation region 11, but, as distinct from First Embodiment, does not have the dummy electrode DE (see FIG. 3). On the other hand, the semiconductor device has an opening OP2 penetrating through the electrode 16 as distinct from First Embodiment. Then, the semiconductor device has the conductive film CF2 formed in the inside of the opening OP2, and the electrode 23 formed of the conductive film CF2 integrally formed at the circumferential side surface of the electrode 16. The electrode 23 is formed of the conductive film CF2 formed of, for example, a polysilicon film, and the metal silicide film 33 formed of, for example, a cobalt silicide film formed at the surface of the conductive film CF2.

Incidentally, as with First Embodiment, between the electrode 16 and the electrode 23, there is formed a capacitive insulation film 27 formed of a insulation film IF2. Then, the electrode 16, the electrode 23, and the capacitive insulation film 27 form the capacitive element. An interlayer insulation film 34 is formed in such a manner as to cover the capacitive element formed of the electrode 16, the electrode 23, and the capacitive insulation film 27. In the interlayer insulation film 34, there are formed contact holes CH1 and CH2 as coupling holes.

The contact hole CH1 penetrates through the interlayer insulation film 34, and reaches the electrode 16. The plug PG1 is formed of a conductive film embedded in the contact hole CH1, and is electrically directly coupled with the electrode 16.

The contact hole CH2 penetrates through the interlayer insulation film 34, and reaches the electrode 23. The plug PG2 is formed of a conductive film embedded in the contact hole CH2, and is electrically directly coupled with the electrode 23. With such a configuration, the plug PG2 formed of a conductive film embedded in the contact hole CH2 can be electrically coupled with any portion of the electrode 23 via the metal silicide film 33 formed at the surface of the electrode 23, and having a relatively smaller electric resistance. For this reason, the plug PG2 can be electrically coupled with any portion of the electrode 23 at a low resistance.

Also in the present Second Embodiment, the electrode 16 and the electrode 23 are formed in different regions in plan view. Such a configuration eliminates a fear that the contact hole CH2 penetrates through the electrode 23 and reaches the electrode 16. This can prevent an electric short circuit between the electrode 23 and the electrode 16 via the plug PG2.

Preferably, the semiconductor device has a plurality of openings OP2 penetrating through the electrode 16, and the electrode 23 formed in each inside of the plurality of openings OP2. The plurality of openings OP2 respectively extend in the Y axis direction, and are arrayed in the X axis direction. Thus, the semiconductor device has the plurality of openings OP2 penetrating through the electrode 16, and the electrode 23 formed in each inside of the plurality of openings OP2. This results in a larger area of the side surface of the electrode 23 opposite to the side surface of the electrode 16. For this reason, it is possible to increase the capacity of the capacitive element with ease.

Incidentally, as with First Embodiment, when the conductive film CF1 is patterned, the opening OP2 is prevented from penetrating through the conductive film CF1. This is also applicable to Second Embodiment and respective modified examples of Second Embodiment. At this step, the semiconductor device has the opening OP2 formed in the electrode 16.

<First Modified Example of Capacitive Element>

Figure 36:
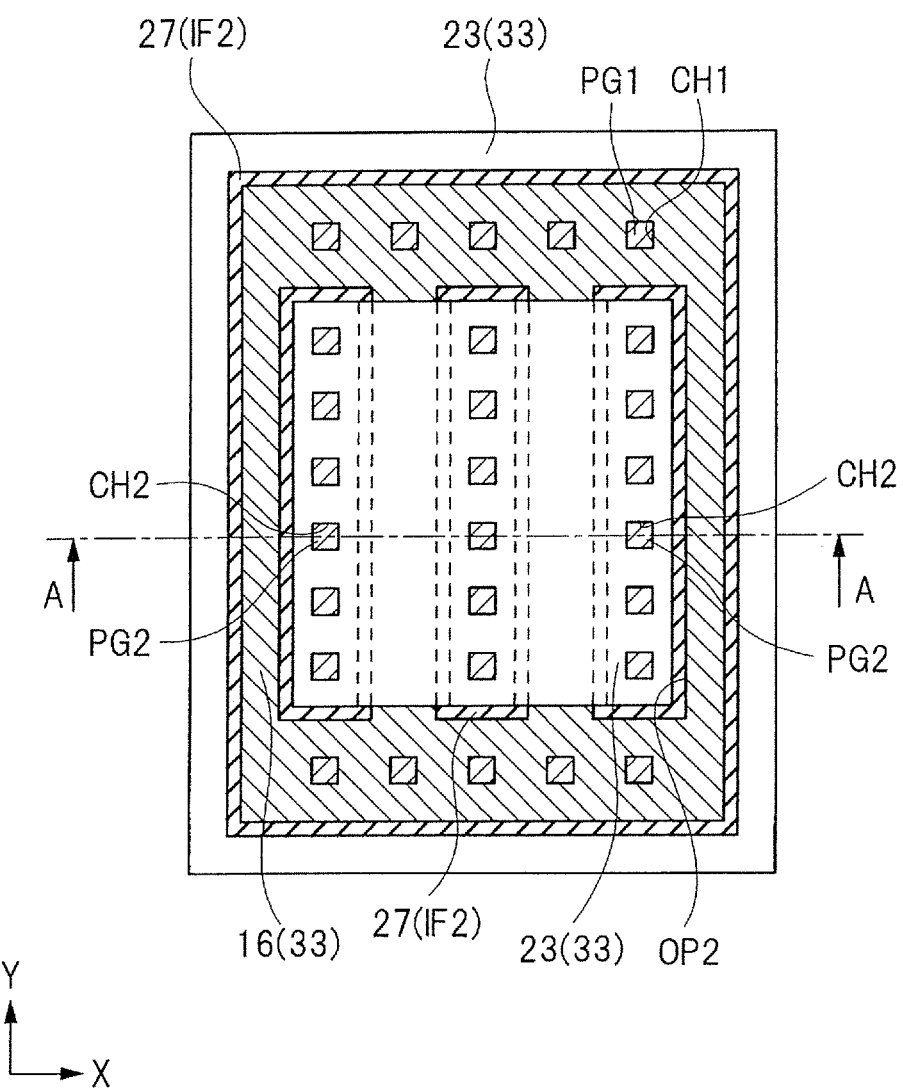
FIG. 36 is a plan view showing a capacitive element in a first modified example of Second Embodiment.
Figure 37:
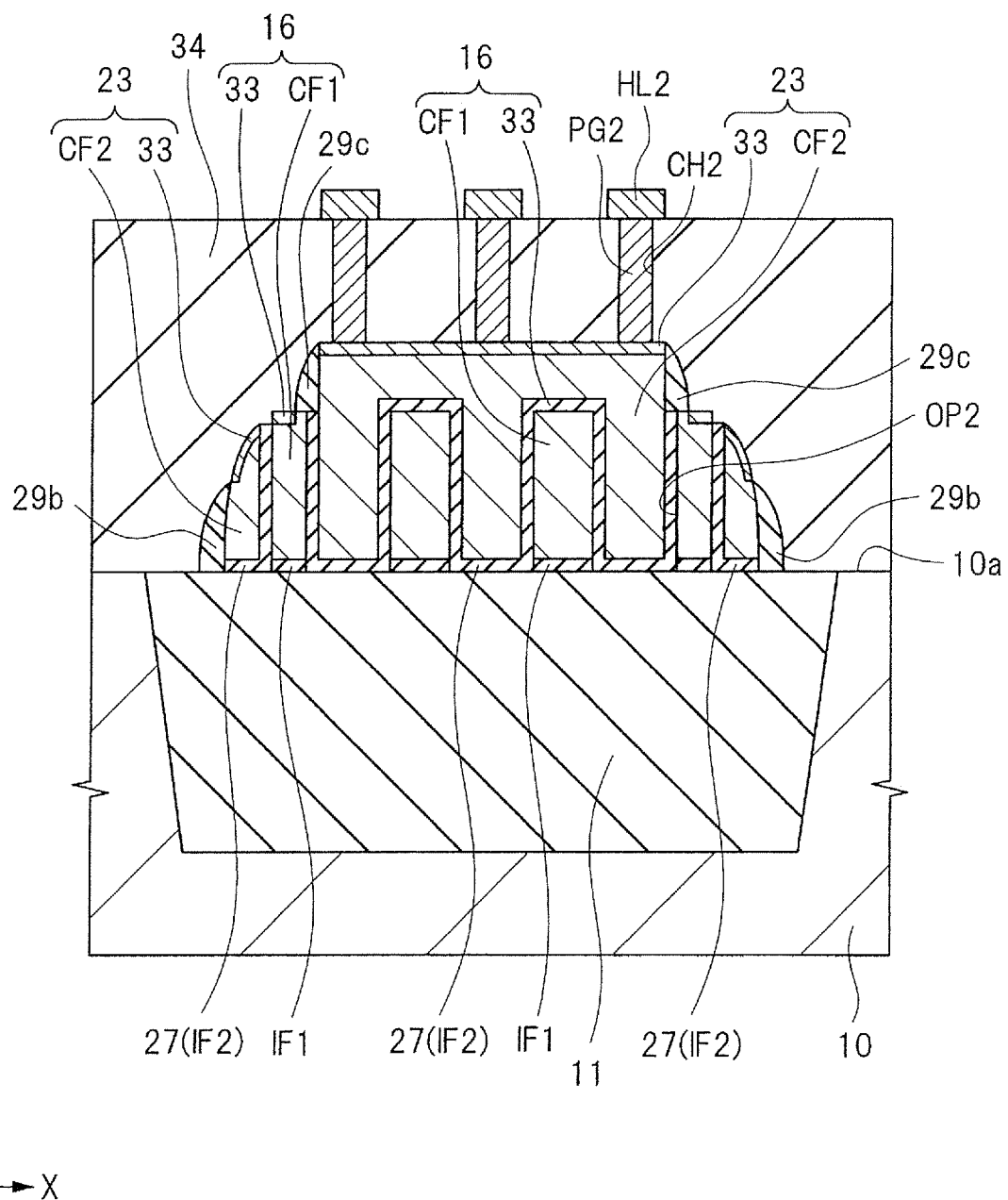
FIG. 37 is a cross sectional view showing the capacitive element in the first modified example of Second Embodiment.

FIG. 36 is a plan view showing the capacitive element in the first modified example of Second Embodiment. FIG. 37 is a cross sectional view showing the capacitive element of the first modified example of Second Embodiment. FIG. 37 is a cross sectional view along line A-A of FIG. 36.

The capacitive element in the present first modified example is different from the capacitive element in Second Embodiment described by reference to FIGS. 34 and 35 in that the electrode 23 is formed not only in the inside of each opening OP2 penetrating through the electrode 16, and the circumferential side surface of the electrode 16 but also in a partial region of the top surface of the electrode 16. The capacitive element in the present first modified example is the same as the capacitive element in Second Embodiment in other respects.

As shown in FIG. 36, the electrode 16 has a rectangular shape in plan view, and is integrally formed. Incidentally, also in the present first modified example, as with Second Embodiment, the dummy electrode DE (see FIG. 3) is not formed.

The electrodes 23 are also formed in a partial region of the top surface of the electrode 16 in addition to the insides of the openings OP2, and the circumferential side surface of the electrode 16. Further, at the side surface of the portion of the electrode 23 formed over the top surface of the electrode 16, there is formed a sidewall 29c formed of an insulation film.

In the present first modified example, each contact hole CH2 penetrates through the interlayer insulation film 34, and reaches the electrode 23 in a region overlapping the opening OP2 in plan view. Further, the plug PG2 formed of a conductive film embedded in the contact hole CH2 is electrically coupled with the electrode 23 in the region overlapping the opening OP2 in plan view. As a result, even when the contact hole CH2 penetrates through the interlayer insulation film 34, so that the electrode 23 is overetched, the contact hole CH2 can be prevented from penetrating through the capacitive insulation film 27, and reaching the electrode 16. This can prevent the plug PG2 formed of a conductive film embedded in the contact hole CH2 from causing a short circuit between the electrode 16 and the electrode 23. For this reason, the performance of the semiconductor device can be improved.

Also in the present first modified example, as with Second Embodiment, the plug PG2 can be electrically coupled with any portion of the electrode 23. This can prevent an electric short circuit between the electrode 16 and the electrode 23. Accordingly, the contact hole CH2 can be aligned with ease.

On the other hand, in the first modified example, as compared with Second Embodiment, the top surface of the electrode 16 and the bottom surface of the electrode 23 are opposite to each other. For this reason, the capacity of the capacitive element can be increased with ease.

Then, a description will be given to the case where the ratio of the thickness of the conductive film CF2 forming the electrode 23 to the open width of the opening OP2 is changed.

Figure 38:
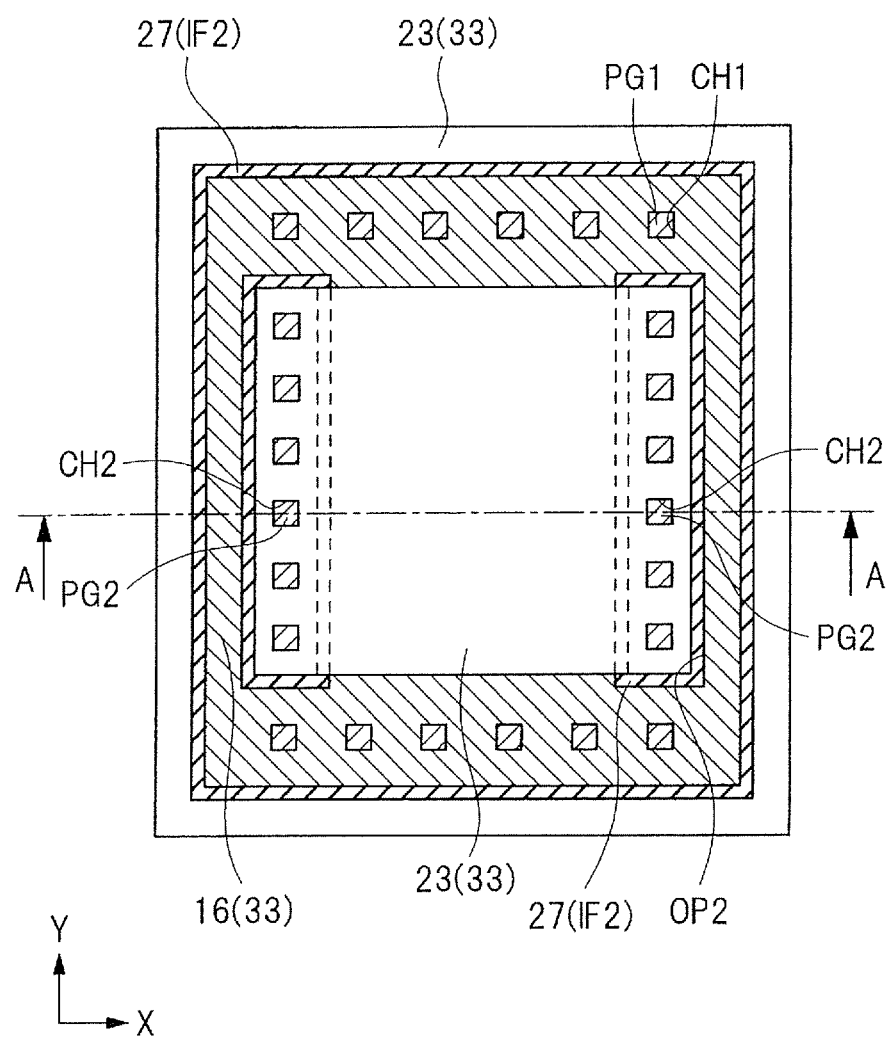
FIG. 38 is a plan view showing a capacitive element in a still other example.
Figure 39:
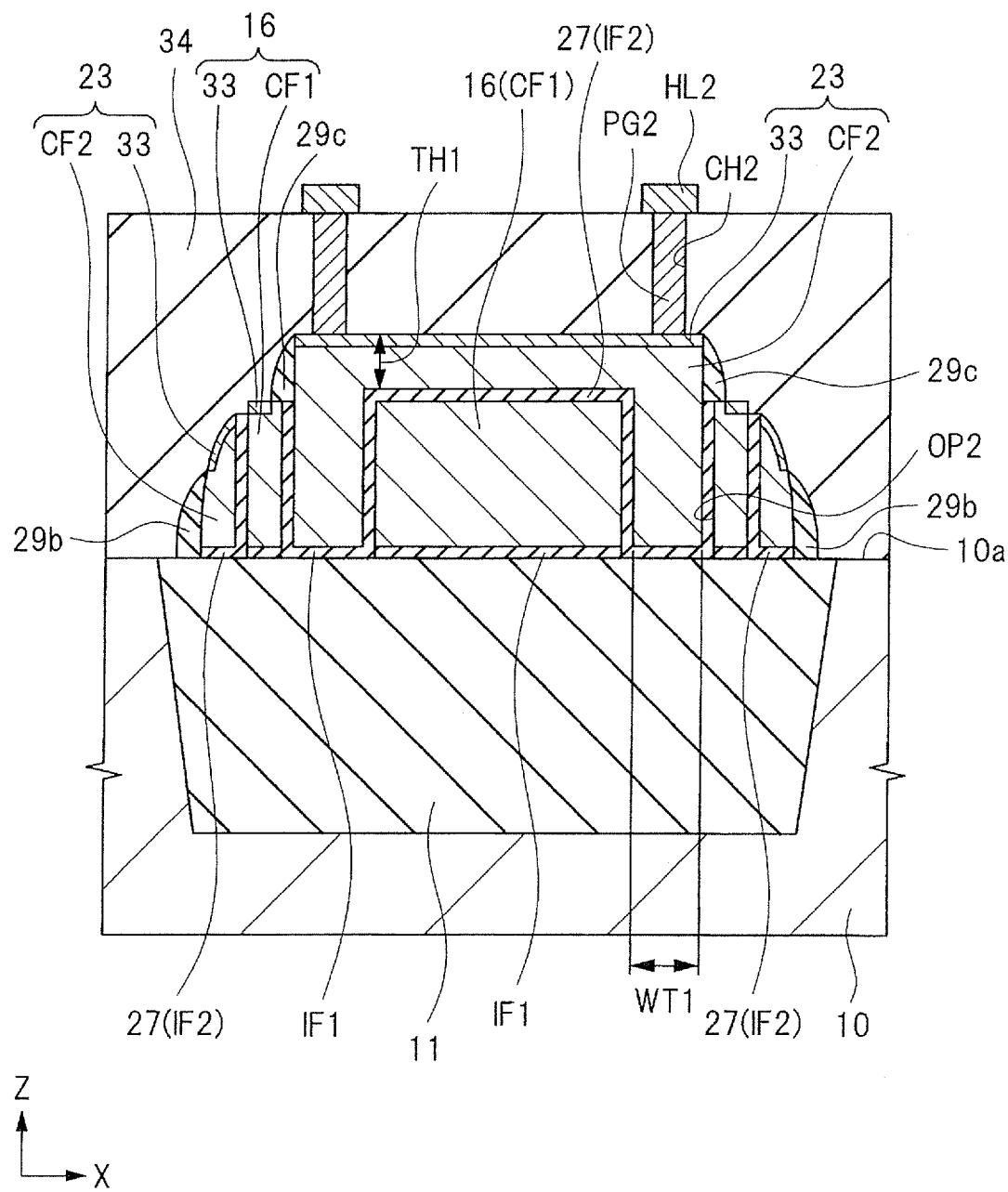
FIG. 39 is a cross sectional view showing a capacitive element in a still other example.
Figure 40:
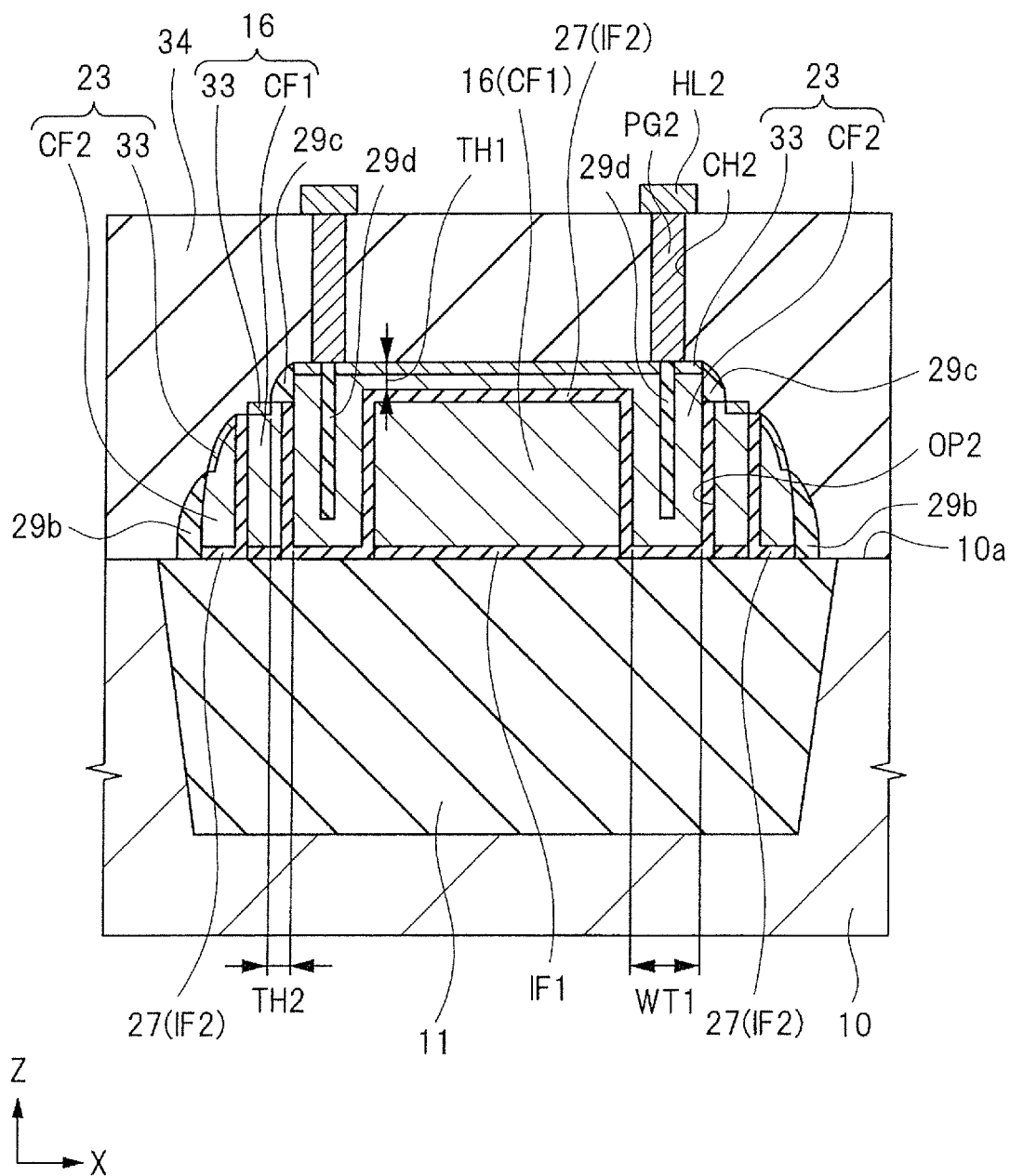
FIG. 40 is a cross sectional view showing a capacitive element in a still other example.

FIG. 38 is a plan view showing a capacitive element in a still other example. FIGS. 39 and 40 are each a cross sectional view showing a capacitive element in a still other example. FIGS. 39 and 40 are each a cross sectional view along line A-A of FIG. 38.

Incidentally, in the example shown in FIGS. 38 to 40, a description will be given to the case where tow openings OP2 penetrating through the electrode 16 are formed.

The open width of the opening OP2 is referred to as open width WT1, and the thickness of the conductive film CF2 forming the electrode 23 is referred to as thickness TH1. Then, in the example shown in FIG. 39, the following expression (1) is assumed to hold:

$$WT1 \leq 2 \times TH1 \qquad \text{Expression (1).}$$

In this case, as shown in FIG. 39, the inside of the opening OP2 can be filled with the conductive film CF2. When the inside of the opening OP2 is thus filled with the conductive film CF2, the plug PG2 formed of a conductive film embedded in the contact hole CH2 penetrating through the interlayer insulation film 34, and reaching the electrode 23 in the region overlapping the opening OP2 in plan view is electrically coupled with the electrode 23 in the region overlapping the opening OP2 in plan view. As a result, even when the contact hole CH2 penetrates through the interlayer insulation film 34, so that the electrode 23 is overetched, it is possible to prevent a short circuit between the electrode 16 and the electrode 23 through the plug PG2 formed of a conductive film embedded in the contact hole CH2. For this reason, the performance of the semiconductor device can be improved.

Incidentally, in FIG. 39, the open width WT1 of the opening OP2 is shown as the open width with the capacitive insulation film 27 formed at the side surface of the opening OP2 (the same also applies to FIG. 40).

On the other hand, even when the open width WT1 and the thickness TH1 of the conductive film do not satisfy the expression (1), as shown in FIG. 40, each gap of the conductive film CF2 can be further filled with a sidewall 29d formed of an insulation film. Herein, the thickness of the insulation film forming the sidewall 29d is set at thickness TH2 equal to the thickness of the insulation film forming the sidewall 29c. In this case, in the example shown in FIG. 40, the following expression (2) is assume to hold:

$$2 \times TH1 < WT1 \leq 2 \times (TH1 + TH2) \qquad \text{Expression (2)}$$

In this case, as shown in FIG. 40, the conductive film CF2 is formed at the side surface and the bottom surface of the opening OP2. The insulation film forming the sidewall 29d is formed in the inside of the opening OP2 and over the conductive film CF2. For this reason, the inside of the opening OP2 can be filled with the sidewall 29d via the conductive film CF2. Even when the inside of the opening OP2 is filled with the sidewall 29d via the conductive film CF2, the plug PG2 embedded in the contact hole CH2 penetrating through the interlayer insulation film 34, and reaching the electrode 23 in the region overlapping the opening OP2 in plan view is electrically coupled with the electrode 23 in the region overlapping the opening OP2 in plan view. As a result, even when the contact hole CH2 penetrates through the interlayer insulation film 34, so that the electrode 23 is overetched, it is possible to prevent a short circuit between the electrode 16 and the electrode 23 through the plug PG2 formed of a conductive film embedded in the contact hole CH2. For this reason, the performance of the semiconductor device can be improved.

<Second Modified Example of Capacitive Element>

Figure 41:
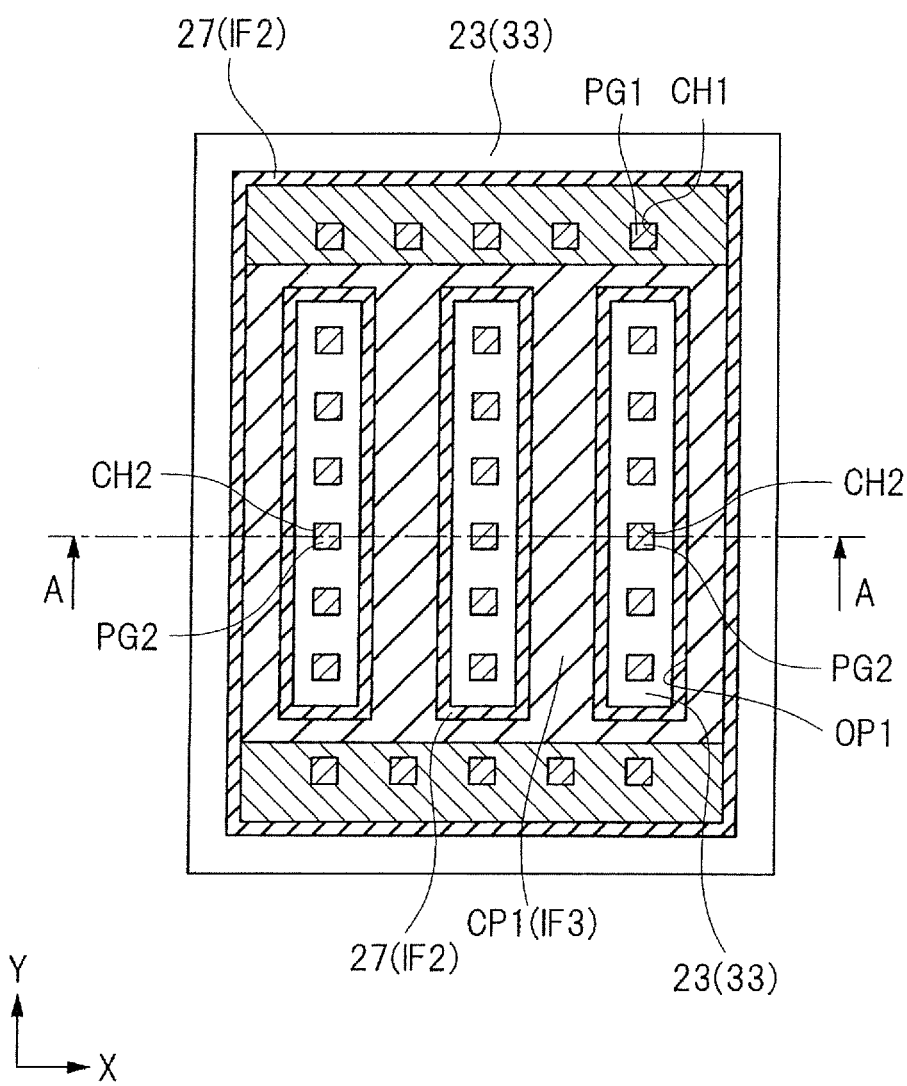
FIG. 41 is a plan view showing a capacitive element in a second modified example of Second Embodiment.
Figure 42:
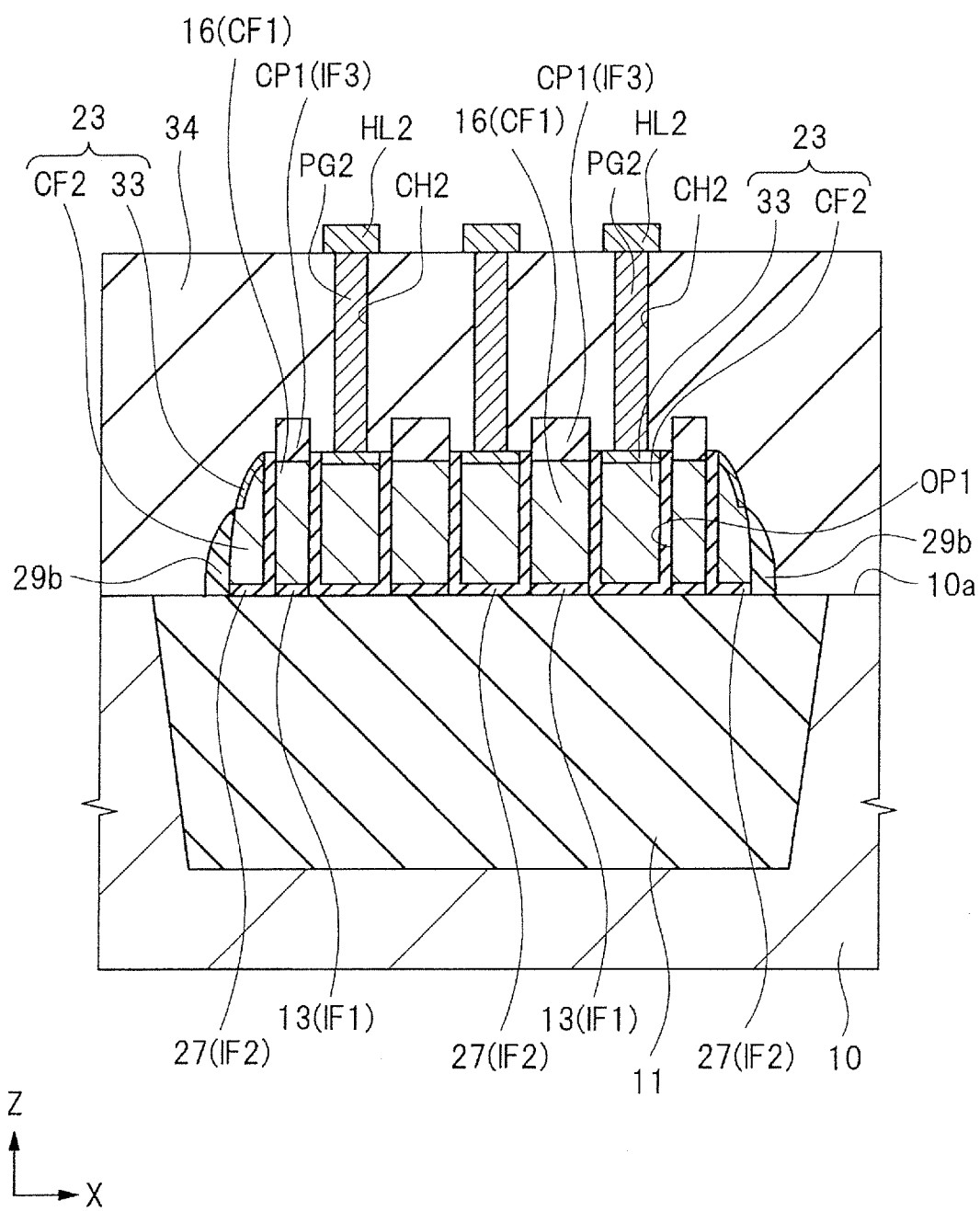
FIG. 42 is a cross sectional view showing the capacitive element in the second modified example of Second Embodiment.

FIG. 41 is a plan view showing a capacitive element in a second modified example of Second Embodiment. FIG. 42 is a cross sectional view showing the capacitive element in the second modified example of Second Embodiment. FIG. 42 is a cross sectional view along line A-A of FIG. 41.

The capacitive element of the present second modified example is different from the semiconductor device of Second Embodiment described by reference to FIGS. 34 and 35 in that a cap insulation film CP1 is formed in a partial region of the top surface of the electrode 16. In other respective, the capacitive element of the present second modified example is the same as the capacitive element in Second Embodiment.

As shown in FIGS. 41 and 42, over the portion of the electrode 16 arranged in the region surrounding the openings OP2, there is formed the cap insulation film CP1. The cap insulation film CP1 is formed of an insulation film IF3 such as a silicon nitride film.

Incidentally, in the region of the top surface of the electrode 16 in which the cap insulation film CP1 is formed, there is not formed the metal silicide film 33. On the other hand, in the region of the top surface of the electrode 16 in the vicinity of the plugs PG1, the metal silicide film 33 is formed, but the cap insulation film CP1 is not formed.

Also in the present second modified example, as with Second Embodiment, the plug PG2 can be coupled with any portion of the electrode 23 at a low resistance. Thus, it is possible to prevent an electric short circuit between the electrode 16 and the electrode 23 through the plug PG2. As a result, the capacity of the capacitive element can be increased with ease.

On the other hand, in the present second modified example, the region of the electrode 16 in contact with the electrode 23 via the capacitive insulation film 27 in plan view is covered with the cap insulation film CP1. Therefore, in the present second modified example, as compared with Second Embodiment, an electric short circuit between the electrode 16 and the electrode 23 can be prevented with more reliability.

<Method for Manufacturing a Semiconductor Device>

As for the method for manufacturing the semiconductor device of the present Second Embodiment, there can be performed the same steps as the steps described by reference to FIGS. 14 to 16, 20 to 22, 25 to 31, and 12 in First Embodiment.

However, in the present Second Embodiment, when the conductive film CF1 is patterned in the same step as the step described by reference to FIG. 16, the openings OP2 (see FIG. 35) are formed. Further, in the same step as the step described by reference to FIG. 20, the insulation film IF2 is formed over the semiconductor substrate 10 including the inside of each opening OP2, and the surface of the electrode 16. Whereas, in the same step as the step described by reference to FIG. 22, the conductive film CF2 is etched back. As a result, the conductive film CF1 is left at the inside of each opening OP2 and the circumferential side surface of the electrode 16 via the insulation film IF2. Further, in the same step as the step described by reference to FIG. 12, the contact hole CH2 is formed in such a manner as to penetrate through the interlayer insulation film 34, and to reach the electrode 23 formed in the inside of the opening OP2 in the region overlapping the opening OP2 in plan view, and the plug PG2 is electrically coupled with the electrode 23 formed in the inside of each opening OP2.

<Main Feature and Effect of the Present Embodiment>

In the present Second Embodiment, the electrode 23 is formed in each inside of the openings OP2 penetrating through the electrode 16. Then, in the present Second Embodiment, as with First Embodiment, the plug PG2 formed of a conductive film embedded in the contact hole CH2 penetrates through the interlayer insulation film 34, and is electrically coupled with the electrode 23 formed in the inside of the opening OP2. At the surface of the electrode 23 formed in the inside of each opening, there is formed the metal silicide film 33. With such a configuration, the plug PG2 can be electrically coupled with any portion of the electrode 23 formed in the inside of each opening OP2 via the metal silicide film 33 with a relatively smaller electric resistance formed at the surface of the electrode 23. For this reason, the plug PG2 can be coupled with any portion of the electrode 23 formed in the inside of each opening OP2 at a low resistance.

Further, in the present Second Embodiment, the electrode 23 formed in the inside of each opening OP2 does not overlap the electrode 16 in plan view. Therefore, the contact hole CH2 does not penetrate through the interlayer insulation film 34, the electrode 23, and the capacitive insulation film 27 to reach the electrode 16, and the plug PG2 formed of a conductive film embedded in the contact hole CH2 does not cause a short circuit between the electrode 23 and the electrode 16. Accordingly, the performance of the semiconductor device can be improved.

Third Embodiment

In First Embodiment, there has been shown the example where the dummy electrode DE is formed, and the plug PG2 is electrically coupled with the portion of the electrode 23 formed at the side surface of the dummy electrode DE (see FIG. 3). On the other hand, in Third Embodiment, a description will be given to an example where the dummy electrode DE is not formed, and each plug PG3 is electrically coupled with the portion of the electrode 23 arranged between adjacent line parts LP1 (see FIG. 43 described later).

Figure 43:
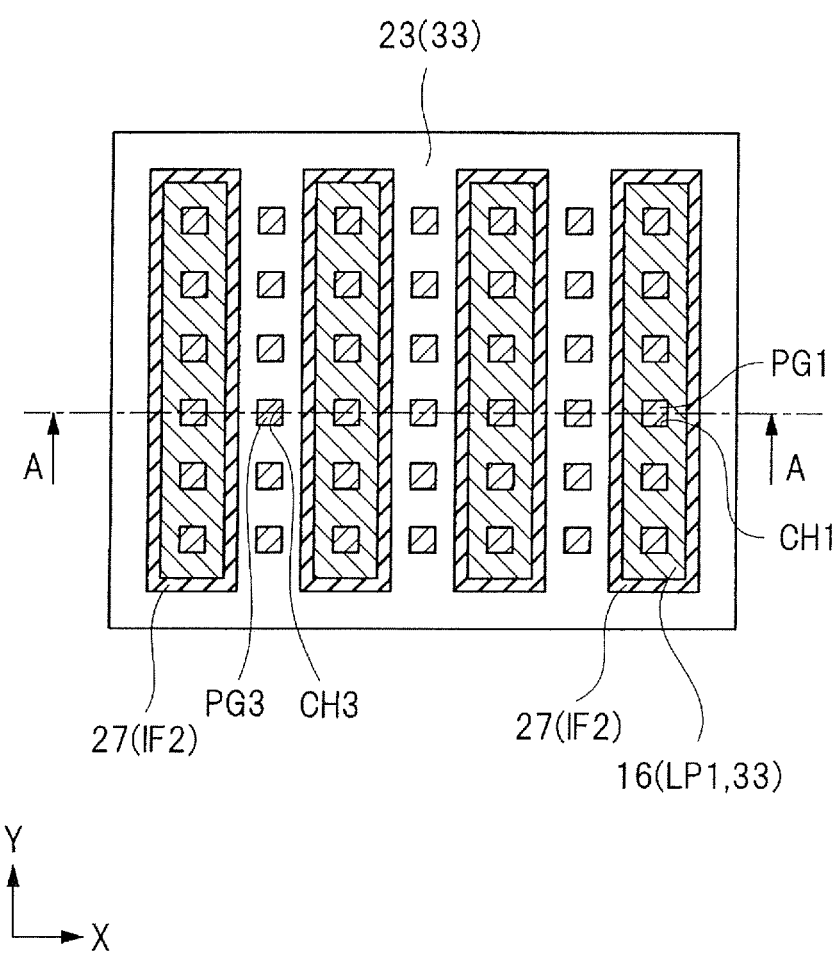
FIG. 43 is a plan view showing a capacitive element in Third Embodiment.

FIG. 43 is a plan view showing a capacitive element in Third Embodiment. Incidentally, the cross sectional view along line A-A of FIG. 43 is the same as the cross sectional view of the capacitive element in the first modified example of First Embodiment described by reference to FIG. 5. As shown in FIGS. 43 and 5, the capacitive element of the present Third Embodiment can be set equal to the capacitive element in the first modified example of First Embodiment except that the dummy electrode DE (see FIG. 3) is not formed.

Therefore, in the present Third Embodiment, the plug PG2 in the first modified example of First Embodiment (see FIG. 4) is not formed, and only the plugs PG1 and the plugs PG3 are formed.

Also in the present Third Embodiment, as with First Embodiment, each plug PG3 can be electrically coupled with the portion of the electrode 23 arranged between the adjacent line parts LP1 at a low resistance. This can prevent an electric short circuit between the electrode 16 and the electrode 23. Accordingly, the capacity of the capacitive element can be increased with ease.

On the other hand, in the present Third Embodiment, as with the first modified example of First Embodiment, as compared with First Embodiment, the width of the line part LP1 becomes larger, but the plug PG1 can be electrically directly coupled with the line part. For this reason, the plug PG1 can be electrically coupled with the electrode 16 at a still lower resistance.

Incidentally, as with First Embodiment, when the conductive film CF1 is patterned, the opening OP1 formed between the adjacent line parts LP1 (see FIG. 6) is prevented from penetrating through the conductive film CF1. This is also applicable to Third Embodiment and respective modified examples of Third Embodiment. In this case, the electrode 16 includes the coupling, part CN1 coupling the bottoms of the adjacent line parts LP1 as shown in FIG. 6.

<First Modified Example of Capacitive Element>

Figure 44:
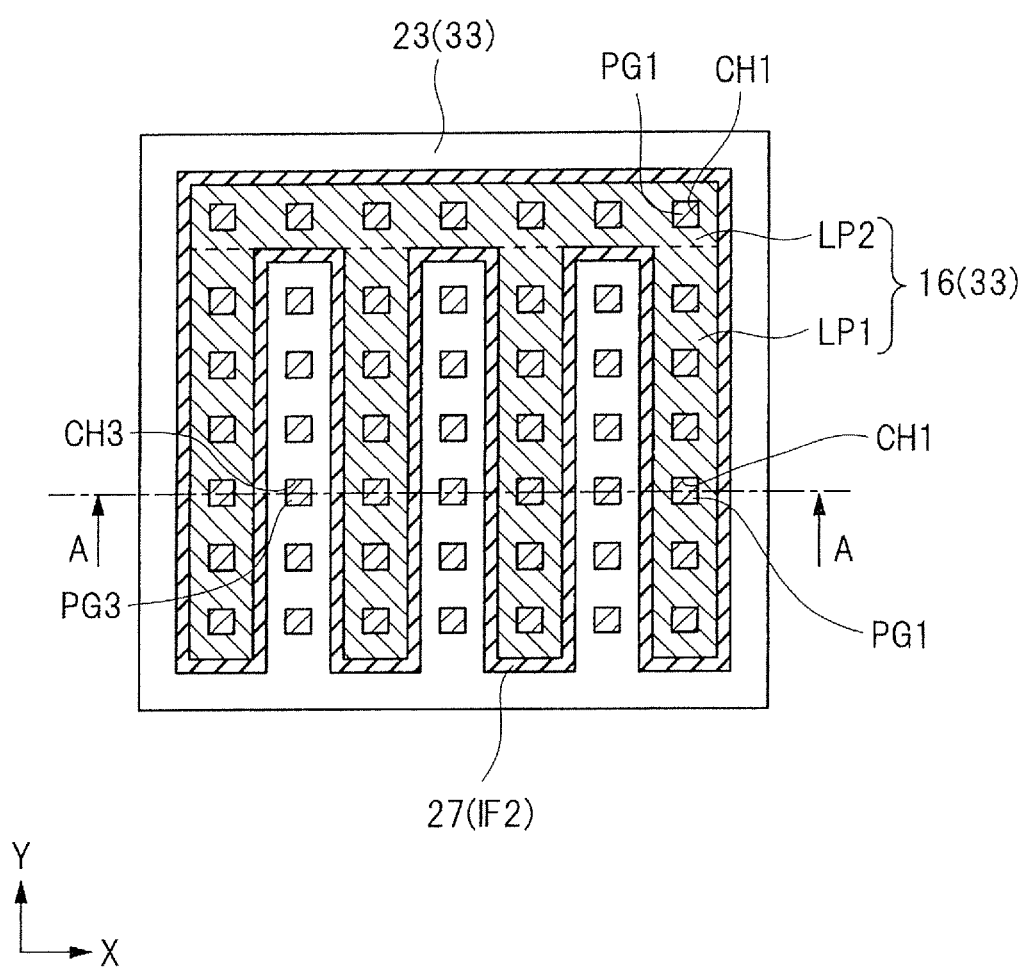
FIG. 44 is a plan view showing a capacitive element in a first modified example of Third Embodiment.

FIG. 44 is a plan view showing a capacitive element in a first modified example of Third Embodiment. Incidentally, the cross sectional view along line A-A of FIG. 44 is the same as the cross sectional view of the capacitive element of the first modified example of First Embodiment described by reference to FIG. 5.

The capacitive element in the present first modified example is different from the capacitive element in Third Embodiment described by reference to FIG. 43 in that the line part LP2 is disposed, and in that the plurality of plugs PG1 are electrically directly coupled with not only respective ones of the plurality of line parts LP1 but also the line part LP2. In other respects, the capacitive element in the present first modified example is the same as the capacitive element in Third Embodiment.

As shown in FIG. 44, the electrode 16 includes the plurality of line parts LP1 and the line part LP2. The plurality of line parts LP1 respectively extend in the Y axis direction, and are arrayed in the X axis direction, in plan view. The line part LP2 extends in the X axis direction, and is coupled with the ends on one side of the plurality of line parts LP1 in the Y axis direction in plan view. With such a configuration, the plurality of line parts LP1 are electrically coupled to one another via the line part LP2. The electrode 16 including the plurality of line parts LP1 and the line part LP2 has a comb-like shape in plan view.

The contact holes CH1 penetrate through the interlayer insulation film 34 (see FIG. 5), and reach not only the plurality of line parts LP1 but also the line part LP2. The plugs PG1 are each formed of a conductive film embedded in each contact hole CH1, and are electrically coupled with not only the plurality of line parts LP1 but also the line part LP2.

Also in the present first modified example, as with Third Embodiment, the plugs PG3 can be electrically coupled with any portion of the electrode 23 at a low resistance. This can prevent an electric short circuit between the electrode 16 and the electrode 23. Accordingly, the capacity of the capacitive element can be increased with ease.

On the other hand, in the present first modified example, as compared with Third Embodiment, the area of the side surface of the electrode 23 opposite to the side surface of the electrode 16 increases. For this reason, the capacity of the capacitive element can be increased with ease. Further, in the present first modified example, as compared with Third Embodiment, the number of the plugs PG1 electrically directly coupled with the electrode 16 increases. For this reason, the plugs PG1 can be electrically coupled with the electrode 16 at a still lower resistance.

<Second Modified Example of Capacitive Element>

Figure 45:
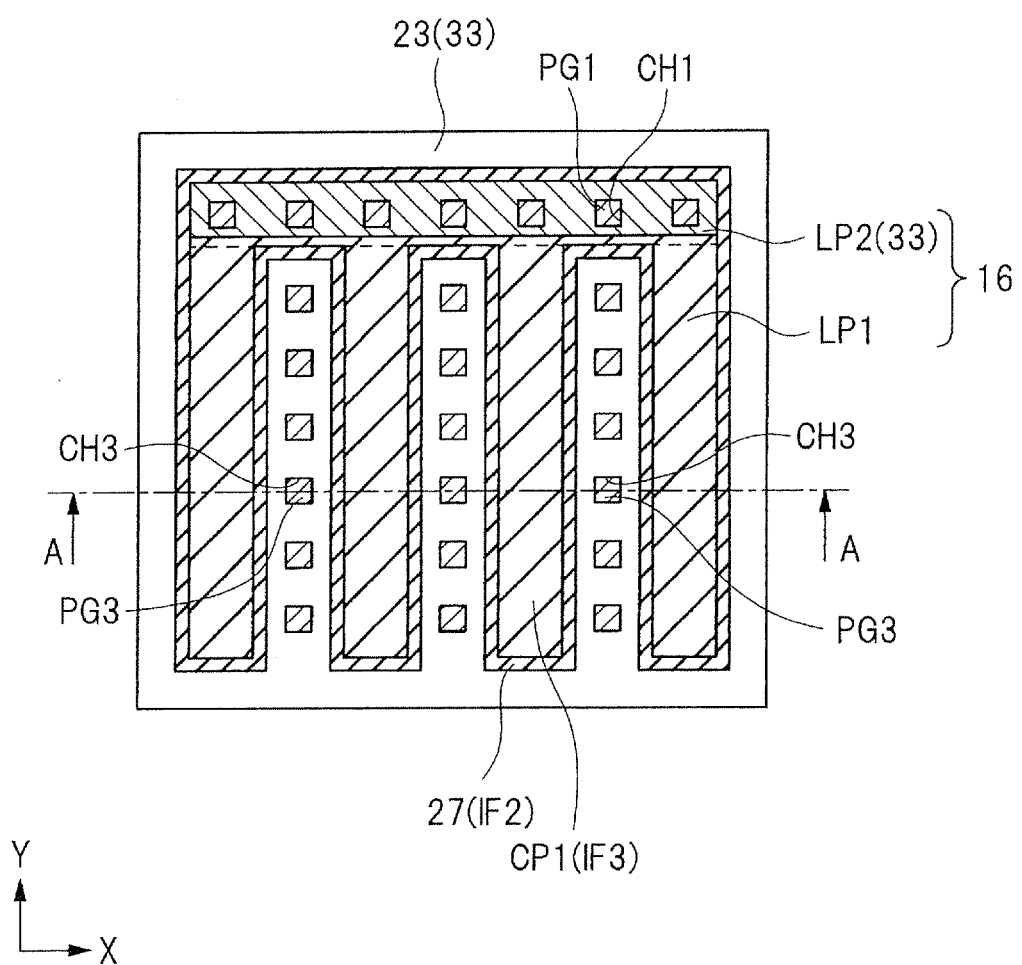
FIG. 45 is a plan view showing a capacitive element in a second modified example of Third Embodiment.
Figure 46:
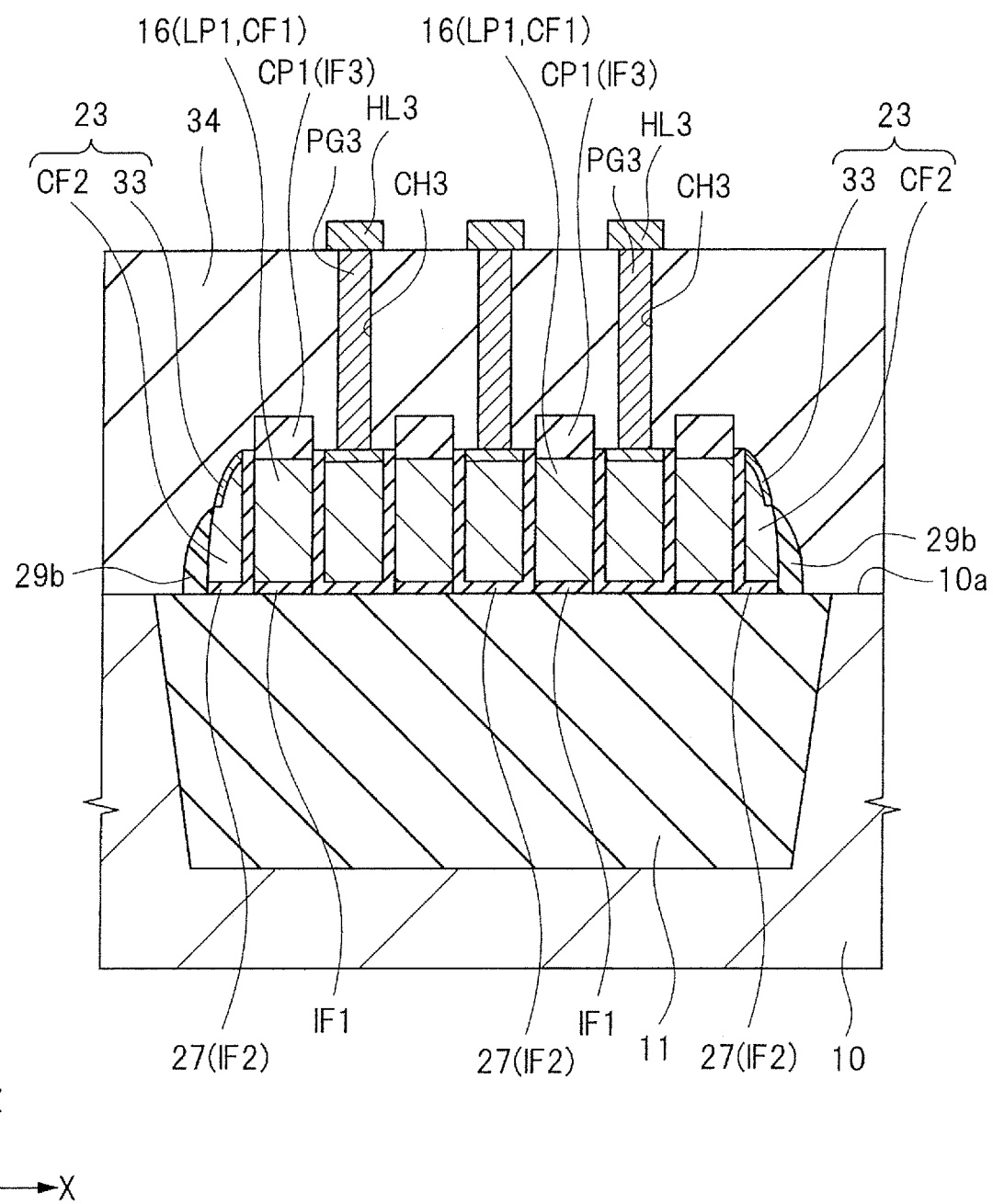
FIG. 46 is a cross sectional view showing the capacitive element in the second modified example of Third Embodiment.

FIG. 45 is a plan view showing a capacitive element in a second modified example of Third Embodiment. FIG. 46 is a cross sectional view showing the capacitive element in the second modified example of Third Embodiment. FIG. 46 is a cross sectional view along line A-A of FIG. 45.

The capacitive element of the present second modified example is different from the capacitive element in the first modified example of Third Embodiment described by reference to FIGS. 44 and 45 in that a cap insulation film CP1 is formed in a partial region of the top surface of the electrode 16. In other respects, the capacitive element of the present second modified example is the same as the capacitive element in the first modified example of Third Embodiment.

As shown in FIGS. 45 and 46, the cap insulation film CP1 is formed at least in a region in contact with the electrode 23 via the capacitive insulation film 27 in plan view over the line parts LP1, and over a part of the line part LP2, namely, over a part of the electrode 16. The cap insulation film CP1 is formed of an insulation film IF3 such as a silicon nitride film.

Incidentally, in the region of the top surface of each line part LP1 in which the cap insulation film CP1 is formed, there is not formed the metal silicide film 33. On the other hand, in the region of the top surface of the line part LP2 in the vicinity of the plug PG1, there is formed the metal silicide film 33, but there is not formed the cap insulation film CP1.

Further, in the present second modified example, the metal silicide film 33 is not formed over the line parts LP1. For this reason, the plugs PG1 are not electrically directly coupled with the line parts LP1, and are electrically directly coupled with the line part LP2.

Also in the present second modified example, as with the first modified example of Third Embodiment, the plugs PG3 can be electrically coupled with any portion of the electrode 23 at a low resistance. Thus, it is possible to prevent an electric short circuit between the electrode 16 and the electrode 23 through the plugs PG3. Accordingly, the capacity of the capacitive element can be increased with ease.

On the other hand, in the present second modified example, the region of the electrode 16 in contact with the electrode 23 via the capacitive insulation film 27 in plan view is covered with the cap insulation film CP1. Therefore, in the present second modified example, as compared with the first modified example of Third Embodiment, it is possible to prevent an electric short circuit between the electrode 16 and the electrode 23 adjacent to each other with more reliability.

<Method for Manufacturing a Semiconductor Device>

As for the method for manufacturing the semiconductor device of the present Third Embodiment, there can be performed the same steps as the steps described by reference to FIGS. 14 to 16, 20 to 22, 25 to 31, and 12 in First Embodiment.

However, in the present Third Embodiment, when the conductive film CF1 is patterned in the same step as the step described by reference to FIG. 16, the dummy electrode DE (see FIG. 16) is not formed, and the electrode 16 including a plurality of line parts LP1 respectively extending in the Y axis direction, and arrayed in the X axis direction (see FIG. 43) is formed of the conductive film CF1. Further, in the same step as the step described by reference to FIG. 20, the dummy electrode DE (see FIG. 16) is not formed. For this reason, over the semiconductor substrate 10 including the surface of the electrode 16, there is formed an insulation film IF2. Further, in the same step as the step described by reference to FIG. 22, the dummy electrode DE (see FIG. 22) is not formed. For this reason, the conductive film CF2 is etched back, thereby to leave the conductive film CF1 at the circumferential side surface of the electrode 16 via the insulation film IF2. Furthermore, in the same step as the step described by reference to FIG. 12, the contact holes CH3 are formed in such a manner as to penetrate through the interlayer insulation film 34, and to reach the portion of the electrode 23 arranged between the adjacent line parts LP1. Thus, the plugs PG3 are electrically coupled with the portion of the electrode 23 arranged between the adjacent line parts LP1.

<Main Feature and Effect of the Present Embodiment>

In the present Third Embodiment, as with First Embodiment, the contact plug PG3 formed of a conductive film embedded in each contact hole CH3 penetrates through the interlayer insulation film 34, and is electrically directly coupled with the portion of the electrode 23 arranged between the adjacent line parts LP1. At the portion of the electrode 23 arranged between the adjacent line parts LP1, there is formed the metal silicide film 33. With such a configuration, the plugs PG3 can be electrically coupled with any portion of the electrode 23 via the metal silicide film 33 with a relatively smaller electric resistance formed at the surface of the electrode 23. For this reason, the plugs PG3 can be electrically coupled with any portion of the electrode 23 at a low resistance.

Further, in the present Third Embodiment, the electrode 23 does not overlap the electrode 16 in plan view. Therefore, the contact holes CH3 do not penetrate through the interlayer insulation film 34, the electrode 23, and the capacitive insulation film 27 to reach the electrode 16. Further, the electrode 23 and the electrode 16 are not short-circuited through the plugs PG3 formed of a conductive film embedded in the contact holes CH3. Accordingly, the performance of the semiconductor device can be improved.

Fourth Embodiment

In First Embodiment, there has been shown the example in which one capacitive element is formed over the element isolation region. In Fourth Embodiment, a description will be given to the configuration in which a plurality of capacitive elements are formed over a conductive semiconductor substrate.

The plan layout of the capacitive elements in the present Fourth Embodiment is the same as the plan layout of the capacitive elements in First Embodiment described by reference to FIG. 2. The differences between the present Fourth Embodiment and First Embodiment appear in the cross sectional view.

Figure 47:
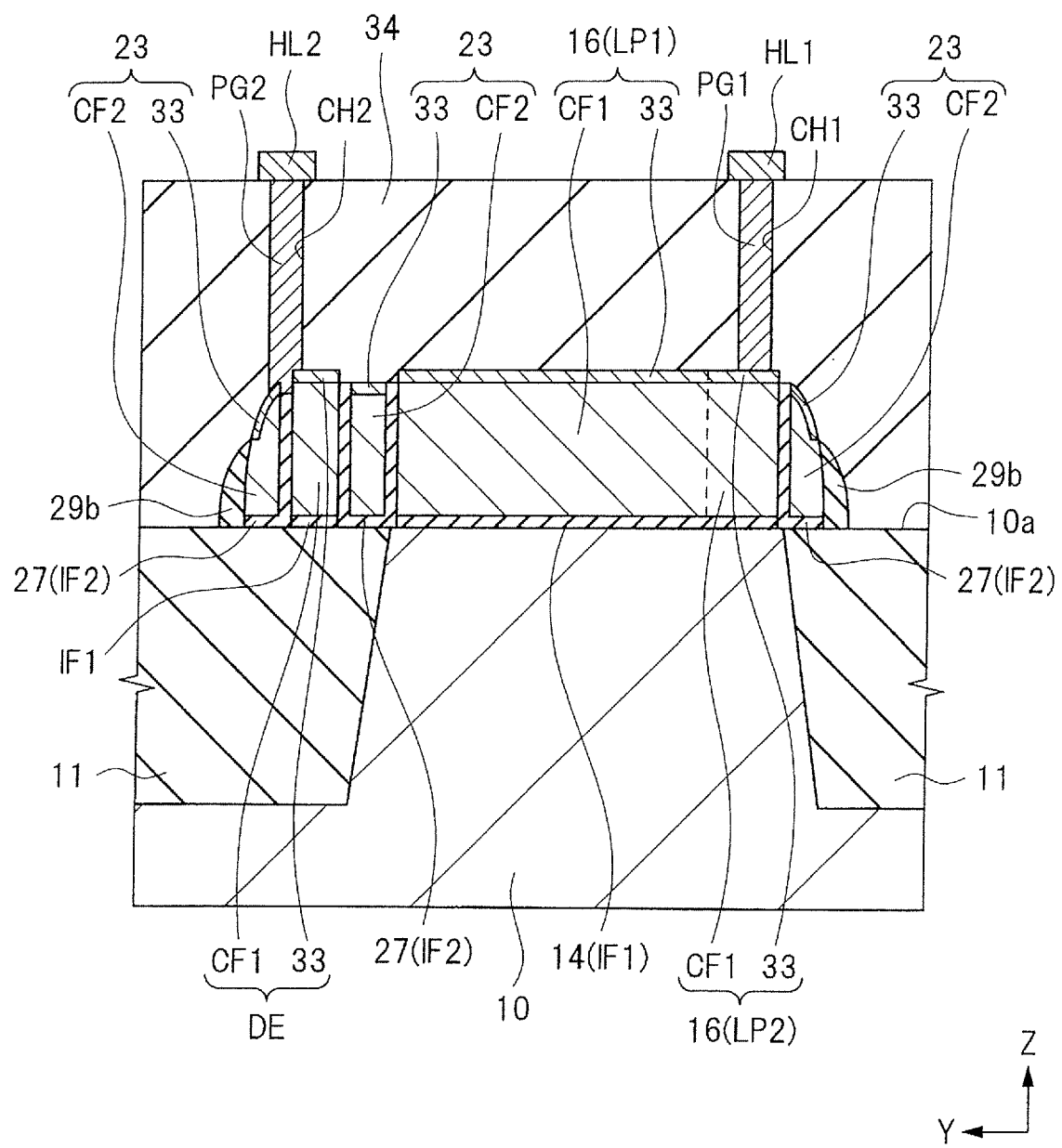
FIG. 47 is a cross sectional view showing a capacitive element in Fourth Embodiment.

FIG. 47 is a cross sectional view of the capacitive element in Fourth Embodiment. FIG. 47 corresponds to the cross sectional view along line A-A of FIG. 2.

As shown in FIG. 47, in the semiconductor substrate 10, there are formed element isolation regions 11. In an active region interposed between the element isolation regions 11, there is formed a capacitive element. Namely, the semiconductor device of the present Fourth Embodiment has a lower electrode including the semiconductor substrate 10 as an electrode, a capacitive insulation film 14 including an insulation film IF1 formed over the semiconductor substrate 10, and an upper electrode including an electrode 16 formed over the capacitive insulation film 14. Then, the lower electrode including the semiconductor substrate 10 as an electrode, the capacitive insulation film 14, and the upper electrode including the electrode 16 form a first capacitive element.

Further, as with First Embodiment, the electrode 16, the capacitive insulation film 27, and the electrode 23 form a second capacitive element.

Incidentally, although not shown, the lower electrode including the semiconductor substrate 10 as an electrode, the capacitive insulation film 27, and the upper electrode including the electrode 23 also can form a third capacitive element.

The method for manufacturing a semiconductor device in the present Fourth Embodiment is the same as the method for manufacturing a capacitive element in First Embodiment except that the capacitive element is formed over the semiconductor substrate 10 as an active region interposed between the element isolation regions 11.

In the present Fourth Embodiment, the first capacitive element and the second capacitive element are formed. Therefore, the first capacitive element and the second capacitive element are coupled in parallel with each other. As a result, it is possible to form a capacitive element equal in occupying area to and larger in capacity value than in First Embodiment. The parallel coupling of the first capacitive element and the second capacitive element can be achieved by setting the semiconductor substrate 10 and the electrode 23 at the same electric potential.

Incidentally, in the present Fourth Embodiment, the capacitive element of First Embodiment is formed not over the element isolation region 11, but over the semiconductor substrate 10 interposed between the element isolation regions 11. However, the present Fourth Embodiment is also applicable to the cases where each capacitive element in respective embodiments and respective modified examples of the embodiments including First Embodiment is formed not over the element isolation region 11 but over the semiconductor substrate 10 interposed between the element isolation regions 11.

Up to this point, the invention made by the present inventors was specifically described by way of embodiments. However, it is naturally understood that the present invention is not limited to the embodiments, and may be variously changed within the scope not departing from the gist thereof.

The present invention includes at least the following embodiments.

[Additional Statement 1]

A method for manufacturing a semiconductor device, including the steps of:

(a) forming a first conductive film over a semiconductor substrate, (b) patterning the first conductive film, and forming a first electrode formed of the first conductive film, and forming a first dummy electrode formed of the first conductive film apart from the first electrode, (c) forming a first insulation film over the semiconductor substrate including the surface of the first electrode and the surface of the first dummy electrode, (d) forming a second conductive film over the first insulation film, (e) etching back the second conductive film, and leaving the second conductive film between the first electrode and the first dummy electrode, at the circumferential side surface of the first electrode, and at the circumferential side surface of the first dummy electrode via the first insulation film, thereby to form a second electrode, (f) removing a portion of the first insulation film not covered with the second electrode, and forming a first capacitive insulation film formed of the first insulation film between the first electrode and the second electrode, (g) forming an interlayer insulation film in such a manner as to cover the first electrode, the second electrode, and the first capacitive insulation film, (h) forming a first coupling hole penetrating through the interlayer insulation film, and reaching the first electrode, and a second coupling hole penetrating through the interlayer insulation film, and reaching a first portion of the second electrode formed at a side surface of the first dummy electrode opposite to the first electrode side, and (i) forming a first coupling electrode formed of a third conductive film embedded in the first coupling hole, and electrically coupled with the first electrode, and forming a second coupling electrode formed of the third conductive film embedded in the second coupling hole, and electrically coupled with the first portion of the second electrode, wherein in the step (f), the first electrode, the second electrode, and the first capacitive insulation film form a first capacitive element.

[Additional Statement 2]

The method for manufacturing a semiconductor device according to Additional Statement 1, wherein in the step (e), the second conductive film is patterned and etched back, and thereby the second conductive film is left between the first electrode and the first dummy electrode, at the circumferential side surface of the first electrode, at the circumferential side surface of the first dummy electrode, and in a partial region of the top surface of the first electrode via the first insulation film, thereby to form the second electrode.

[Additional Statement 3]

The method for manufacturing a semiconductor device according to Additional Statement 1, including:

a step (j) of, after the step (f) and before the step (g), forming a first metal silicide film at the surface of the first conductive film, and forming a second metal silicide film at the surface of the second conductive film, wherein, in the step (i), the first coupling electrode in contact with the first metal silicide film is formed, and the second coupling electrode in contact with the second metal silicide film is formed.

[Additional Statement 4]

The method for manufacturing a semiconductor device according to Additional Statement 1, including:

a step (k) of, before the step (a), forming a second insulation film at the first main surface of the semiconductor substrate in a first region on the first main surface side of the semiconductor substrate, and in a second region on the first main surface side of the semiconductor substrate, wherein, in the step (a), the first conductive film is formed over the second insulation film in the first region and the second region, wherein, in the step (b), the first conductive film and the second insulation film are patterned in the first region and the second region, and the first electrode and the first dummy electrode are formed in the first region, and a first gate electrode formed of the first conductive film, and a first gate insulation film formed of the second insulation film between the first gate electrode and the semiconductor substrate are formed in the second region, wherein, in the step (c), the first insulation film is formed over the semiconductor substrate including the surface of the first electrode, the surface of the first dummy electrode, and the surface of the first gate electrode in the first region and the second region, wherein, in the step (d), the second conductive film is formed over the first insulation film in the first region and the second region, wherein, in the step (e), the second conductive film is etched back in the first region and the second region, thereby to form the second electrode in the first region, and the second conductive film is left at the side surface of the first gate electrode via the first insulation film, thereby to form a second gate electrode in the second region, and wherein, in the step (f), a portion of the first insulation film not covered with any of the second electrode and the second gate electrode is removed in the first region and the second region, the first capacitive insulation film is formed in the first region, and a second gate insulation film formed of the first insulation film between the first gate electrode and the second gate electrode, and the first insulation film between the second gate electrode and the semiconductor substrate is formed in the second region, the method including:

a step (l) of, after the step (f) and before the step (g), forming a source region and a drain region in alignment with the first gate electrode and the second gate electrode in the semiconductor substrate in the second region, wherein, in the step (g), the interlayer insulation film is formed in such a manner as to cover the first electrode, the second electrode, the first capacitive insulation film, the first gate electrode, the second gate electrode, the second gate insulation film, the source region, and the drain region in the first region and the second region, wherein, in the step (h), the first coupling hole and the second coupling hole are formed in the first region, and a third coupling hole penetrating through the interlayer insulation film, and reaching the source region, and a fourth coupling hole penetrating through the interlayer insulation film, and reaching the drain region are formed in the second region, wherein, in the step (i), the first coupling electrode and the second coupling electrode are formed in the first region, and a third coupling electrode formed of the third conductive film embedded in the third coupling hole, and electrically coupled with the source region is formed, and a fourth coupling electrode formed of the third conductive film embedded in the fourth coupling hole, and electrically coupled with the drain region are formed in the second region, and wherein, in the step (l), the first gate insulation film, the first gate electrode, the second gate electrode, and the second gate insulation film form a memory cell.

[Additional Statement 5]

The method for manufacturing a semiconductor device according to Additional Statement 1, including:

a step (m) of, before the step (a), forming an element isolation region in the semiconductor substrate, wherein, in the step (a), the first conductive film is formed over the element isolation region.

[Additional Statement 6]

A method for manufacturing a semiconductor device, including the steps of:

(a) forming a first conductive film over a semiconductor substrate, (b) patterning the first conductive film, and forming a first electrode formed of the first conductive film, and a first opening penetrating through the first electrode, (c) forming a first insulation film over the semiconductor substrate including the inside of the first opening, and the surface of the first electrode, (d) forming a second conductive film over the first insulation film, (e) etching back the second conductive film, and leaving the second conductive film in the inside of the first opening, and at the circumferential side surface of the first electrode, via the first insulation film, thereby to form a second electrode, (f) removing a portion of the first insulation film not covered with the second electrode, and forming a first capacitive insulation film formed of the first insulation film between the first electrode and the second electrode, (g) forming an interlayer insulation film in such a manner as to cover the first electrode, the second electrode, and the first capacitive insulation film, (h) forming a first coupling hole penetrating through the interlayer insulation film, and reaching the first electrode, and a second coupling hole penetrating through the interlayer insulation film, and reaching the second electrode, and (i) forming a first coupling electrode formed of a third conductive film embedded in the first coupling hole, and electrically coupled with the first electrode, and forming a second coupling electrode formed of the third conductive film embedded in the second coupling hole, and electrically coupled with the second electrode, wherein, in the step (f), the first electrode, the second electrode, and the first capacitive insulation film form a first capacitive element.

[Additional Statement 7]

A method for manufacturing a semiconductor device, including the steps of:

(a) forming a first conductive film over a semiconductor substrate, (b) patterning the first conductive film, and forming a first electrode formed of the first conductive film, (c) forming a first insulation film over the first semiconductor substrate including the surface of the first electrode, (d) forming a second conductive film over the first insulation film, (e) etching back the second conductive film, an leaving the second conductive film at the circumferential side surface of the first electrode via the first insulation film, thereby to form a second electrode, (f) removing a portion of the first insulation film not covered with the second electrode, and forming a first capacitive insulation film formed of the first insulation film between the first electrode and the second electrode, (g) forming an interlayer insulation film in such a manner as to cover the first electrode, the second electrode, and the first capacitive insulation film, (h) forming a first coupling hole penetrating through the interlayer insulation film, and reaching the first electrode, and a second coupling hole penetrating through the interlayer insulation film, and reaching the second electrode, and (i) forming a first coupling electrode formed of a third conductive film embedded in the first coupling hole, and electrically coupled with the first electrode, and forming a second coupling electrode formed of the third conductive film embedded in the second coupling hole, and electrically coupled with the second electrode, wherein, in the step (f), the first electrode, the second electrode, and the first capacitive insulation film form a first capacitive element, and wherein, in the step (b), the first electrode including a plurality of first line parts respectively extending in a first direction, and arrayed in a second direction crossing with the first direction in plan view is formed of the first conductive film.

[Additional Statement 8]

A semiconductor device including:

a semiconductor substrate;

a first electrode formed of a first conductive film formed over the semiconductor substrate;

a first dummy electrode formed apart from the first electrode over the semiconductor substrate, and formed of a second conductive film at the same layer as the first conductive film;

a second electrode formed of a third conductive film formed between the first electrode and the first dummy electrode, at the circumferential side surface of the first electrode, and at the circumferential side surface of the first dummy electrode;

a first capacitive insulation film formed of a first insulation film formed between the first electrode and the second electrode;

an interlayer insulation film formed in such a manner as to cover the first electrode, the second electrode, and the first capacitive insulation film;

a first coupling hole penetrating through the interlayer insulation film, and reaching the first electrode;

a second coupling hole penetrating through the interlayer insulation film, and reaching a first portion of the second electrode formed at a side surface of the first dummy electrode opposite to the first electrode side;

a first coupling electrode formed of a fourth conductive film embedded in the first coupling hole, and electrically coupled with the first electrode; and a second coupling electrode formed of a fifth conductive film embedded in the second coupling hole, and electrically coupled with the first portion of the second electrode, wherein the first electrode, the second electrode, and the first capacitive insulation film form a first capacitive element, wherein the first electrode includes:

a plurality of first line parts respectively extending in a first direction, and arrayed in a second direction crossing with the first direction in plan view, and a coupling part coupling the bottoms of the first line parts adjacent to one another, and wherein the first dummy electrode extends in the second direction, and is arranged on one sides of the first line parts in the first direction.

[Additional Statement 9]

A semiconductor device, including:

a semiconductor substrate, a first electrode formed of a first conductive film formed over the semiconductor substrate, a first opening formed in the first electrode, a second electrode formed of a second conductive film formed in the inside of the first opening, and at the circumferential side surface of the first electrode, a first capacitive insulation film formed of a first insulation film formed between the first electrode and the second electrode, an interlayer insulation film formed in such a manner as to cover the first electrode, the second electrode, and the first capacitive insulation film, a first coupling hole penetrating through the interlayer insulation film, and reaching the first electrode, a second coupling hole penetrating through the interlayer insulation film, and reaching a first portion of the second electrode formed in the inside of the first opening, a first coupling electrode formed of a third conductive film embedded in the first coupling hole, and electrically coupled with the first electrode, and a second coupling electrode formed of a fourth conductive film embedded in the second coupling hole, and electrically coupled with the first portion of the second electrode, wherein the first electrode, the second electrode, and the first capacitive insulation film form a first capacitive element.

[Additional Statement 10]

A semiconductor device, including:

a semiconductor substrate, a first electrode formed of a first conductive film formed over the semiconductor substrate, a second electrode formed of a second conductive film formed at the circumferential side surface of the first electrode, a first capacitive insulation film formed between the first electrode and the second electrode, an interlayer insulation film formed in such a manner as to cover the first electrode, the second electrode, and the first capacitive insulation film, a first coupling hole penetrating through the interlayer insulation film, and reaching the first electrode, a second coupling hole penetrating through the interlayer insulation film, and reaching the second electrode, a first coupling electrode formed of a third conductive film embedded in the first coupling hole, and electrically coupled with the first electrode, and a second coupling electrode formed of a fourth conductive film embedded in the second coupling hole, and electrically coupled with the second electrode, wherein the first electrode, the second electrode, and the first capacitive insulation film form a first capacitive element, and wherein the first electrode includes:

a plurality of first line parts respectively extending in a first direction, and arrayed in a second direction crossing with the first direction in plan view, and a coupling part coupling the bottoms of the adjacent first line parts adjacent to one another.

What is claimed is:

1. A semiconductor device comprising:
a semiconductor substrate;
a first electrode formed of a first conductive film formed over the semiconductor substrate;
a first dummy electrode formed apart from the first electrode over the semiconductor substrate, and formed of a second conductive film at the same layer as the first conductive film;
a second electrode formed of a third conductive film formed between the first electrode and the first dummy electrode, at the circumferential side surface of the first electrode, and at the circumferential side surface of the first dummy electrode;
a first capacitive insulation film formed of a first insulation film formed between the first electrode and the second electrode;
an interlayer insulation film formed in such a manner as to cover the first electrode, the second electrode, and the first capacitive insulation film;
a first coupling hole penetrating through the interlayer insulation film, and reaching the first electrode;
a second coupling hole penetrating through the interlayer insulation film, and reaching a first portion of the second electrode formed at a side surface of the first dummy electrode opposite to the first electrode side;
a first coupling electrode formed of a fourth conductive film embedded in the first coupling hole, and electrically coupled with the first electrode; and
a second coupling electrode formed of a fifth conductive film embedded in the second coupling hole, and electrically coupled with the first portion of the second electrode,
wherein the first electrode, the second electrode, and the first capacitive insulation film form a first capacitive element.

2. The semiconductor device according to claim 1,
wherein the first electrode includes a plurality of first line parts respectively extending in a first direction, and arrayed in a second direction crossing with the first direction in plan view, and
wherein the first dummy electrode extends in the second direction, and is arranged on one sides of the first line parts in the first direction.

3. The semiconductor device according to claim 2,
wherein the first electrode includes a second line part extending in the second direction, and coupled to respective ends of the first line parts opposite to the one sides,
wherein the first coupling hole penetrates through the interlayer insulation film, and reaches the second line part, and
wherein the first coupling electrode is electrically coupled with the second line part.

4. The semiconductor device according to claim 3, comprising a cap insulation film formed at the top surfaces of the first line parts.

5. The semiconductor device according to claim 2,
wherein the second electrode is formed between the first line parts adjacent to one another,
wherein the first coupling hole penetrates through the interlayer insulation film, and reaches the first line part, and
wherein the first coupling electrode is electrically coupled with the first line part,
the device comprising:
a third coupling hole penetrating through the interlayer insulation film, and reaching a second portion of the second electrode arranged between the first line parts adjacent to one another, and
a third coupling electrode formed of a sixth conductive film embedded in the third coupling hole, and electrically coupled with the second portion of the second electrode.

6. The semiconductor device according to claim 1,
wherein the second electrode is formed of the third conductive film formed between the first electrode and the first dummy electrode, at the circumferential side surface of the first electrode, at the circumferential side surface of the first dummy electrode, and in a partial region of the first electrode, and
wherein the first coupling hole penetrates through the interlayer insulation film, and reaches a region of the top surface of the first electrode in which the second electrode is not formed.

7. The semiconductor device according to claim 1,
wherein the first electrode is formed of the first conductive film, and a first metal silicide film formed at the surface of the first conductive film,
wherein the second electrode is formed of the third conductive film, and a second metal silicide film formed at the surface of the third conductive film,
wherein the first coupling electrode is in contact with the first metal silicide film, and
wherein the second coupling electrode is in contact with the second metal silicide film.

8. The semiconductor device according to claim 1,
wherein the first electrode is formed in a first region on a first main surface side of the semiconductor substrate, and over the first main surface of the semiconductor substrate,
the device comprising:
a first gate insulation film formed in a second region on the first main surface side of the semiconductor substrate, and at the first main surface of the semiconductor substrate,
a first gate electrode formed over the first gate insulation film, and formed of a seventh conductive film at the same layer as the first conductive film,
a second gate electrode formed at one side surface of the first gate electrode, and formed of an eighth conductive film at the same layer as the third conductive film,
a second gate insulation film formed between the first gate electrode and the second gate electrode, and between the second gate electrode and the semiconductor substrate, and formed of a second insulation film at the same layer as the first insulation film, and
a source region and a drain region formed in the semiconductor substrate in alignment with the first gate electrode and the second gate electrode,
wherein the first gate insulation film, the first gate electrode, the second gate electrode, and the second gate insulation film form a memory cell.

9. The semiconductor device according to claim 1, comprising:
an element isolation region formed in the semiconductor substrate,
wherein the first electrode is formed of the first conductive film formed over the element isolation region.

10. The semiconductor device according to claim 1, comprising:
a third electrode including the semiconductor substrate as an electrode, and
a second capacitive insulation film formed over the third electrode,
wherein the first electrode is formed of the first conductive film formed over the second capacitive insulation film, and
wherein the third electrode, the first electrode, and the second capacitive insulation film form a second capacitive element.

11. A semiconductor device, comprising:
a semiconductor substrate,
a first electrode formed of a first conductive film formed over the semiconductor substrate,
a first opening penetrating through the first electrode,
a second electrode formed of a second conductive film formed in the inside of the first opening, and at the circumferential side surface of the first electrode,
a first capacitive insulation film formed of a first insulation film formed between the first electrode and the second electrode,
an interlayer insulation film formed in such a manner as to cover the first electrode, the second electrode, and the first capacitive insulation film,
a first coupling hole penetrating through the interlayer insulation film, and reaching the first electrode,
a second coupling hole penetrating through the interlayer insulation film, and reaching a first portion of the second electrode formed in the inside of the first opening,
a first coupling electrode formed of a third conductive film embedded in the first coupling hole, and electrically coupled with the first electrode, and
a second coupling electrode formed of a fourth conductive film embedded in the second coupling hole, and electrically coupled with the first portion of the second electrode,
wherein the first electrode, the second electrode, and the first capacitive insulation film form a first capacitive element.

12. The semiconductor device according to claim 11,
wherein the second electrode is formed of the second conductive film formed in the inside of the first opening, and in a partial region of the top surface of the first electrode, and
wherein the second coupling hole penetrates through the interlayer insulation film, and reaches the second electrode in a region overlapping the first opening in plan view.

13. The semiconductor device according to claim 12,
wherein the first opening extends in a first direction in plan view, and
wherein the inside of the first opening is filled with the second conductive film.

14. The semiconductor device according to claim 12,
wherein the first opening extends in a first direction in plan view, wherein the second conductive film is formed at the side surface and the bottom surface of the first opening, the device having:

a second insulation film formed over the second conductive film in the inside of the first opening, wherein the inside of the first opening is filled with the second insulation film via the second conductive film.

15. The semiconductor device according to claim 12, having a cap insulation film formed in a region of the top surface of the first electrode surrounding the first opening, wherein the first coupling hole penetrates through the interlayer insulation film, and reaches a region of the top surface of the first electrode in which the cap insulation film is not formed.

16. The semiconductor device according to claim 11, having:

an element isolation region formed in the semiconductor substrate, wherein the first electrode is formed of the first conductive film formed over the element isolation region.

* * * * *